United States Patent
Nakamura et al.

(10) Patent No.: US 6,801,100 B2
(45) Date of Patent: Oct. 5, 2004

(54) INTER-DIGITAL TRANSDUCER, SURFACE ACOUSTIC WAVE FILTER AND COMMUNICATION APPARATUS USING THE SAME

(75) Inventors: Hiroyuki Nakamura, Katano (JP); Toru Yamada, Katano (JP); Kazunori Nishimura, Yawata (JP); Toshio Ishizaki, Kobe (JP); Narihiro Mita, Izumisano (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 24 days.

(21) Appl. No.: 10/051,310

(22) Filed: Jan. 22, 2002

(65) Prior Publication Data

US 2002/0140526 A1 Oct. 3, 2002

Related U.S. Application Data

(60) Continuation-in-part of application No. 09/794,035, filed on Feb. 28, 2001, now Pat. No. 6,348,845, which is a division of application No. 09/390,653, filed on Sep. 7, 1999, now Pat. No. 6,351,196, which is a division of application No. 08/862,383, filed on May 23, 1997, now Pat. No. 5,990,762.

(30) Foreign Application Priority Data

| May 23, 1996 | (JP) | ............................................. 8-128760 |
| Aug. 30, 1996 | (JP) | ............................................. 8-230016 |
| Jan. 14, 1997 | (JP) | ............................................. 9-004894 |
| Jul. 11, 2001 | (JP) | ..................................... 2001-211345 |

(51) Int. Cl.[7] .............................. H03H 9/64; H03H 9/72

(52) U.S. Cl. ........................ 333/133; 333/193; 333/195; 310/313 B

(58) Field of Search .................................. 333/193–196, 333/133; 310/313 R, 313 B, 313 C, 313 D

(56) References Cited

U.S. PATENT DOCUMENTS

| 3,600,710 A | * | 8/1971 | Adler | .......................... 333/193 |
| 3,659,231 A | * | 4/1972 | De Vries | ..................... 333/194 |
| 3,801,935 A | * | 4/1974 | Mitchell | ...................... 333/193 |

(List continued on next page.)

FOREIGN PATENT DOCUMENTS

| DE | 44 39 489 C1 | 1/1996 |
| EP | 0 176 786 A2 | 4/1986 |
| EP | 0 648 015 A2 | 4/1995 |

(List continued on next page.)

OTHER PUBLICATIONS

B. Wall and A. du Hamél; "Balanced Driven Transversely Coupled Waveguide Resonator Filters"; *1996 IEEE Ultrasonics Symposium Proceedings*, vol. 1, pp 47–51; Nov. 3–6, 1996; San Antonio, TX.

Toru Yamada, et al., "Balanced IF SAW Filter for Digital Portable Telephone using Transversely Coupled Resonator," Proceedings of the 1994 IEICE Fall Conference held Sep. 26, 29, 1994, pp. 299–300.

Japanese Office Action dated Dec. 12, 1999 and translation thereof.

*Primary Examiner*—Barbara Summons
(74) *Attorney, Agent, or Firm*—Smith, Gambrell & Russell, LLP

(57) ABSTRACT

An inter-digital transducer has a piezoelectric substrate; and an IDT (inter-digital transducer) electrode having a pair of upper bus bar electrode and lower bus bar electrode placed facing each other on the piezoelectric substrate and a plurality of electrode fingers placed on the piezoelectric substrate each being led out from either the upper bus bar electrode or the lower bus bar electrode toward the other bus bar electrode, wherein the IDT electrode is constructed of a plurality of divisional IDT electrodes and connected to a balanced type terminal.

39 Claims, 41 Drawing Sheets

U.S. PATENT DOCUMENTS

| | | | | |
|---|---|---|---|---|
| 4,143,343 A | * | 3/1979 | Inoue et al. | 333/194 |
| 4,223,284 A | | 9/1980 | Inoue et al. | 333/150 |
| 4,384,264 A | * | 5/1983 | Kadota | 333/193 |
| 4,575,698 A | | 3/1986 | Schofield | 333/195 |
| 4,746,882 A | * | 5/1988 | Solie | 333/196 |
| RE33,957 E | | 6/1992 | Nakazawa et al. | 310/313 D |
| 5,363,073 A | | 11/1994 | Higgins, Jr. | 333/195 |
| 5,363,074 A | | 11/1994 | Higgins, Jr. | 333/195 |
| 5,365,138 A | | 11/1994 | Saw et al. | 310/313 B |
| 5,374,908 A | | 12/1994 | Wright | 333/195 |
| 5,581,141 A | | 12/1996 | Yamada et al. | 333/195 X |
| 5,790,000 A | * | 8/1998 | Dai et al. | 333/193 |
| 5,793,266 A | | 8/1998 | Allen et al. | 310/313 D |
| 5,835,990 A | * | 11/1998 | Saw et al. | 310/313 D |
| 5,844,453 A | | 12/1998 | Matsui et al. | 333/193 |
| 5,936,487 A | | 8/1999 | Solal et al. | 333/193 |
| 6,043,726 A | | 3/2000 | Solal et al. | 333/195 |
| 6,177,752 B1 | | 1/2001 | Yoshimoto | 333/195 X |
| 6,268,782 B1 | * | 7/2001 | Hartmann et al. | 333/193 |
| 6,346,864 B1 | * | 2/2002 | Kadota | 333/133 |
| 6,351,196 B1 | * | 2/2002 | Nakamura et al. | 333/195 |

FOREIGN PATENT DOCUMENTS

| | | | |
|---|---|---|---|
| EP | 0 740 411 A1 | 10/1996 | |
| FR | 2484150 | * 12/1981 | |
| JP | 53-30848 | 3/1978 | |
| JP | 55-107319 | 8/1980 | |
| JP | 56-22164 | 5/1981 | |
| JP | 59-131213 | 7/1984 | |
| JP | 62-142409 | 6/1987 | |
| JP | 64-54805 | 3/1989 | |
| JP | 3-119816 | 5/1991 | |
| JP | 3-295308 | 12/1991 | |
| JP | 4-21367 | 4/1992 | |
| JP | 4-373304 | 12/1992 | 333/193 |
| JP | 6-177703 | 6/1994 | |
| JP | 7-321599 | 12/1995 | |
| JP | 8-51334 | 2/1996 | |
| JP | 8-307201 | 11/1996 | |
| JP | 63-285018 | 11/1998 | 333/193 |
| WO | WO 97-12441 | 4/1997 | |

* cited by examiner

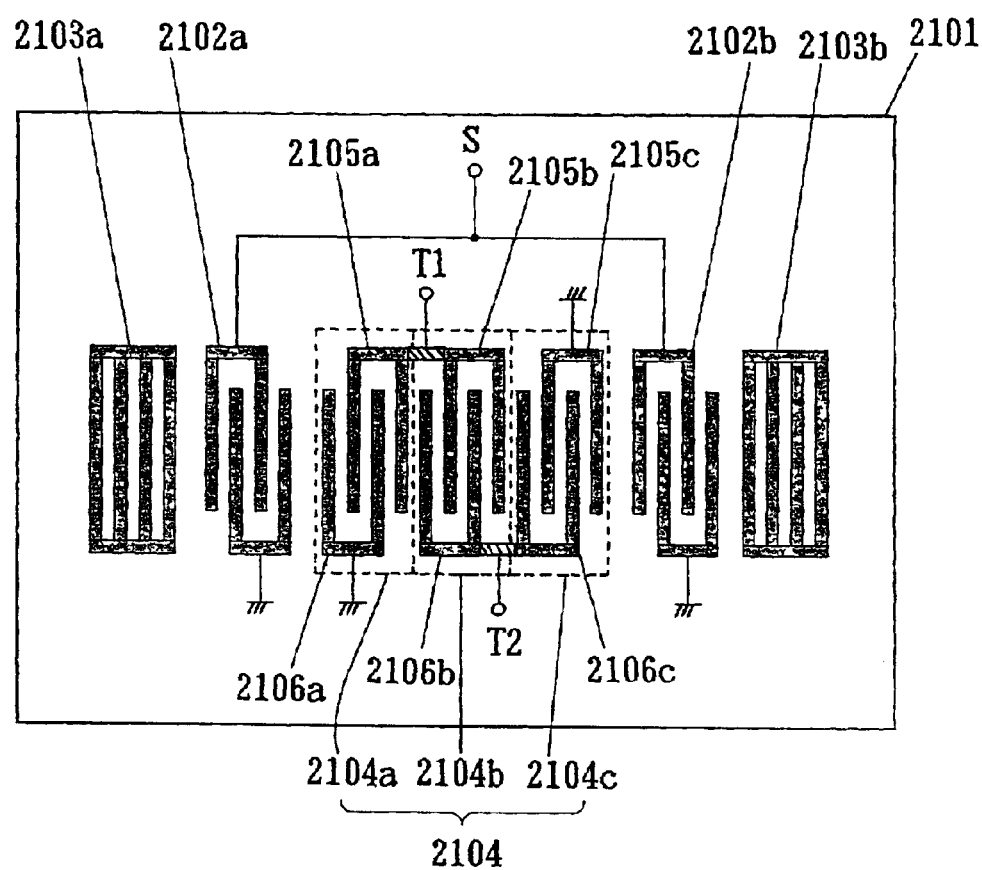
Fig. A1

Fig. A2
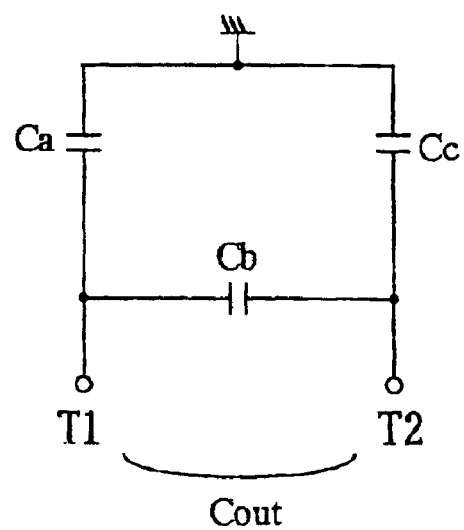

Fig. A3
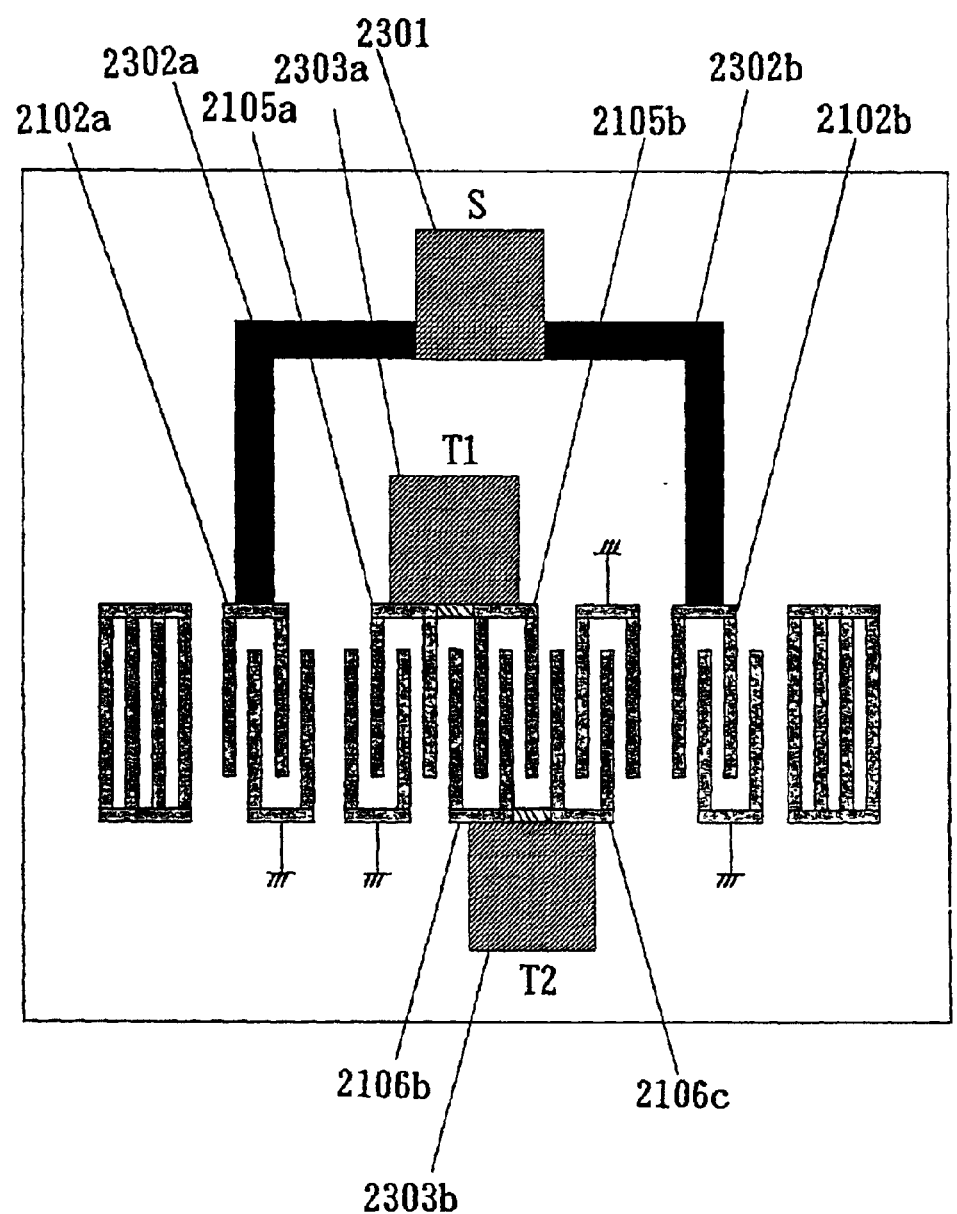

Fig. A4
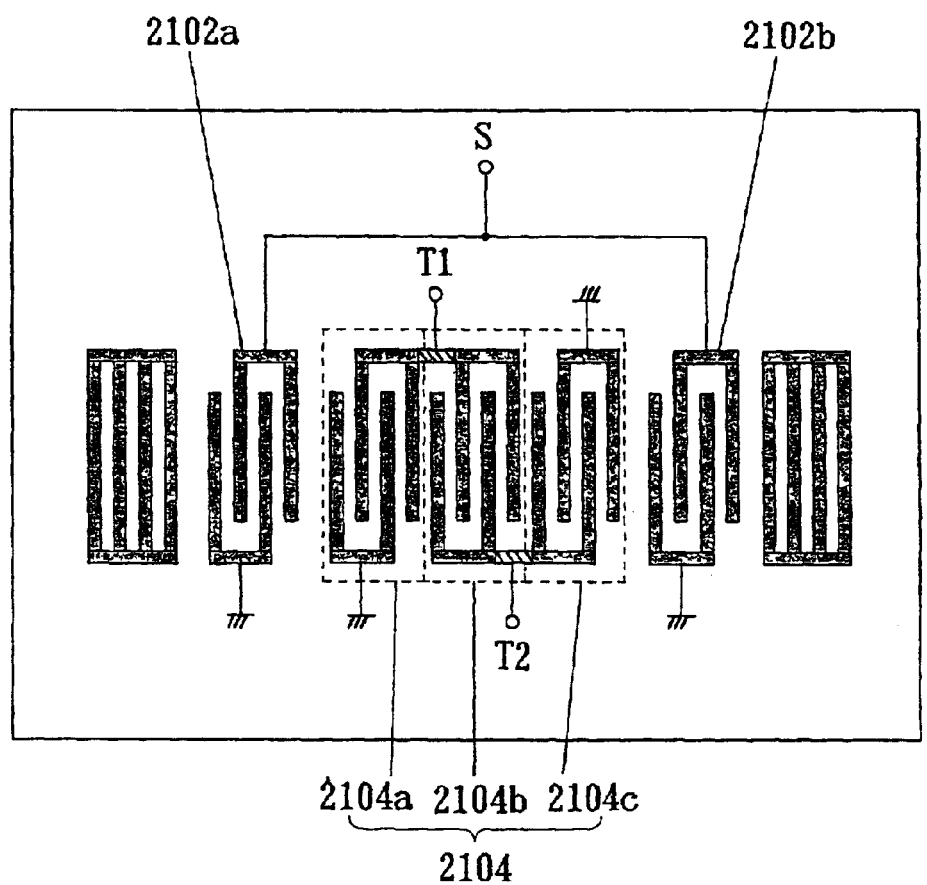

Fig. A5
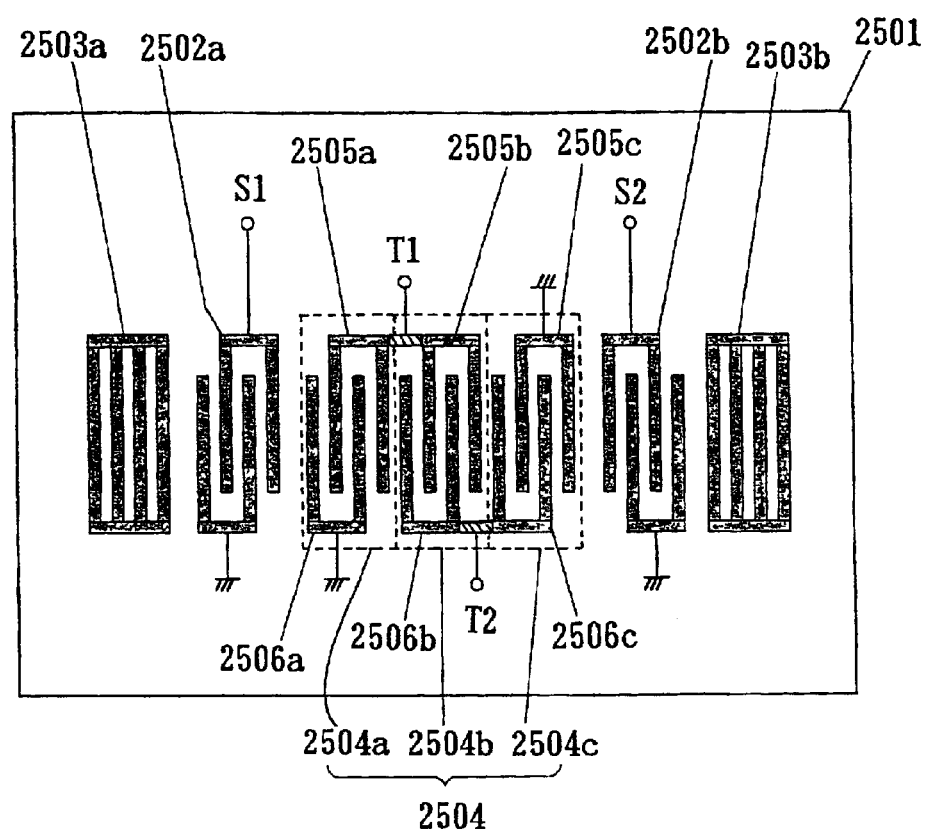

Fig. A6
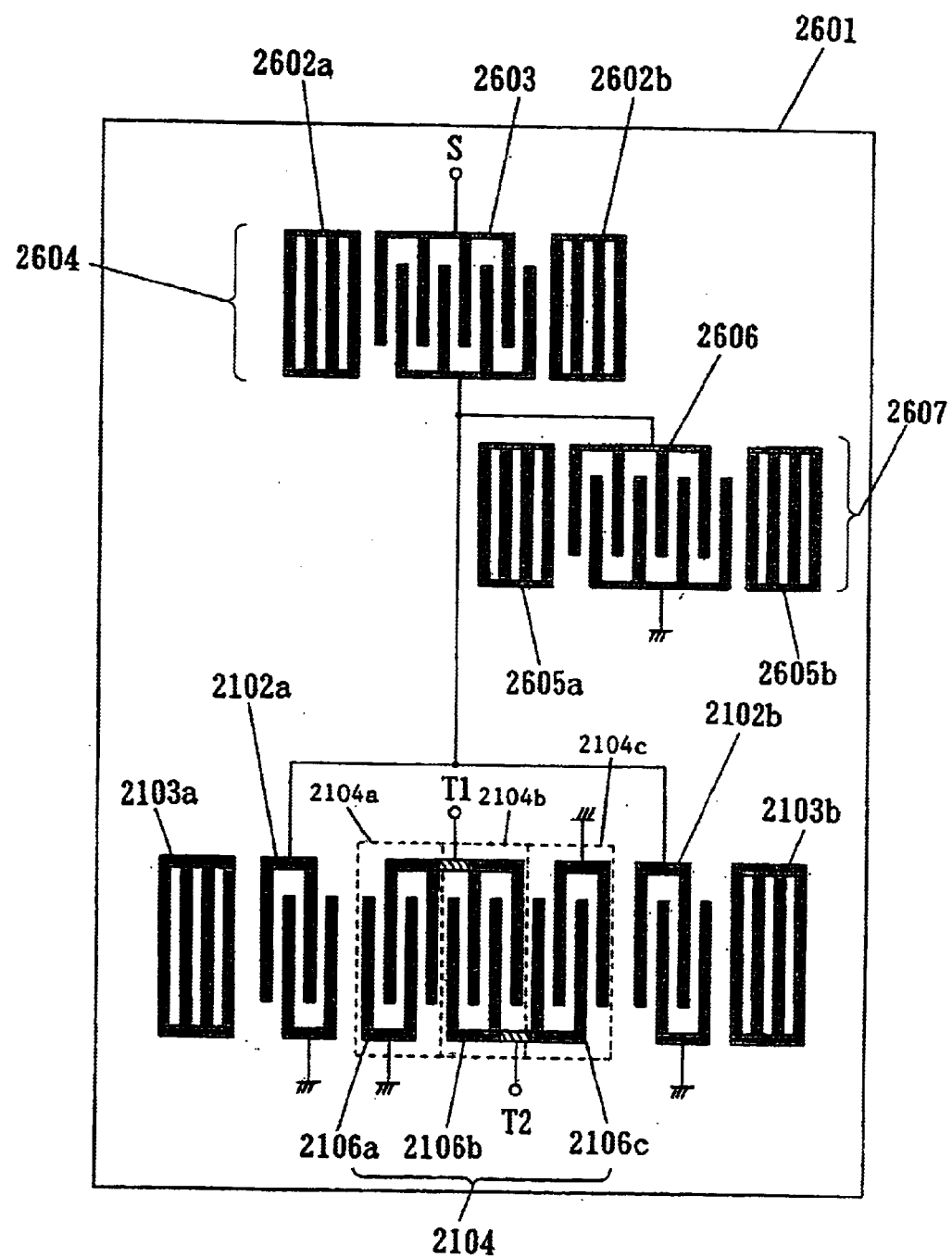

Fig. A7 (a)
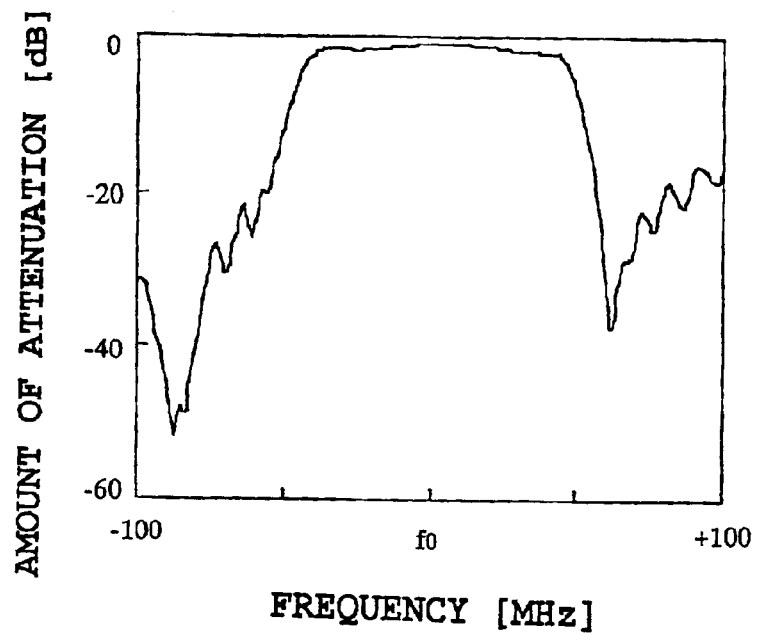
Fig. A7 (b)
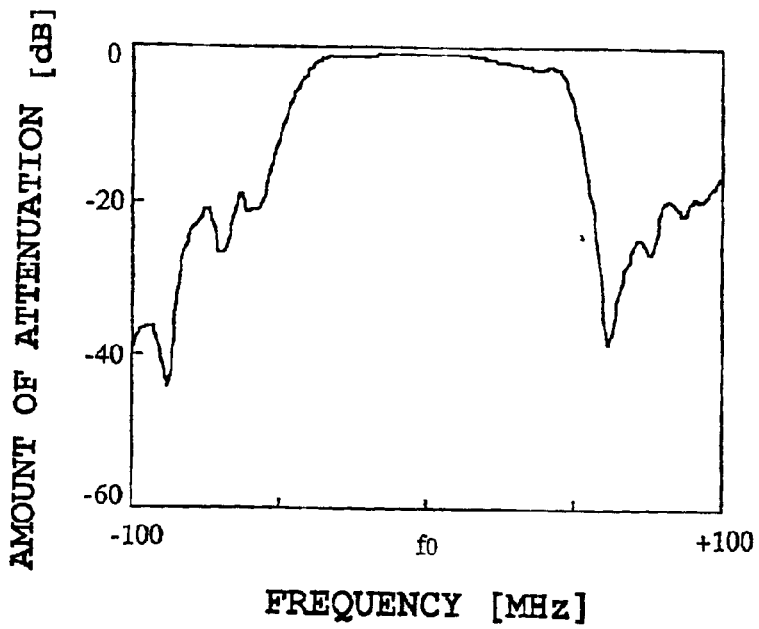

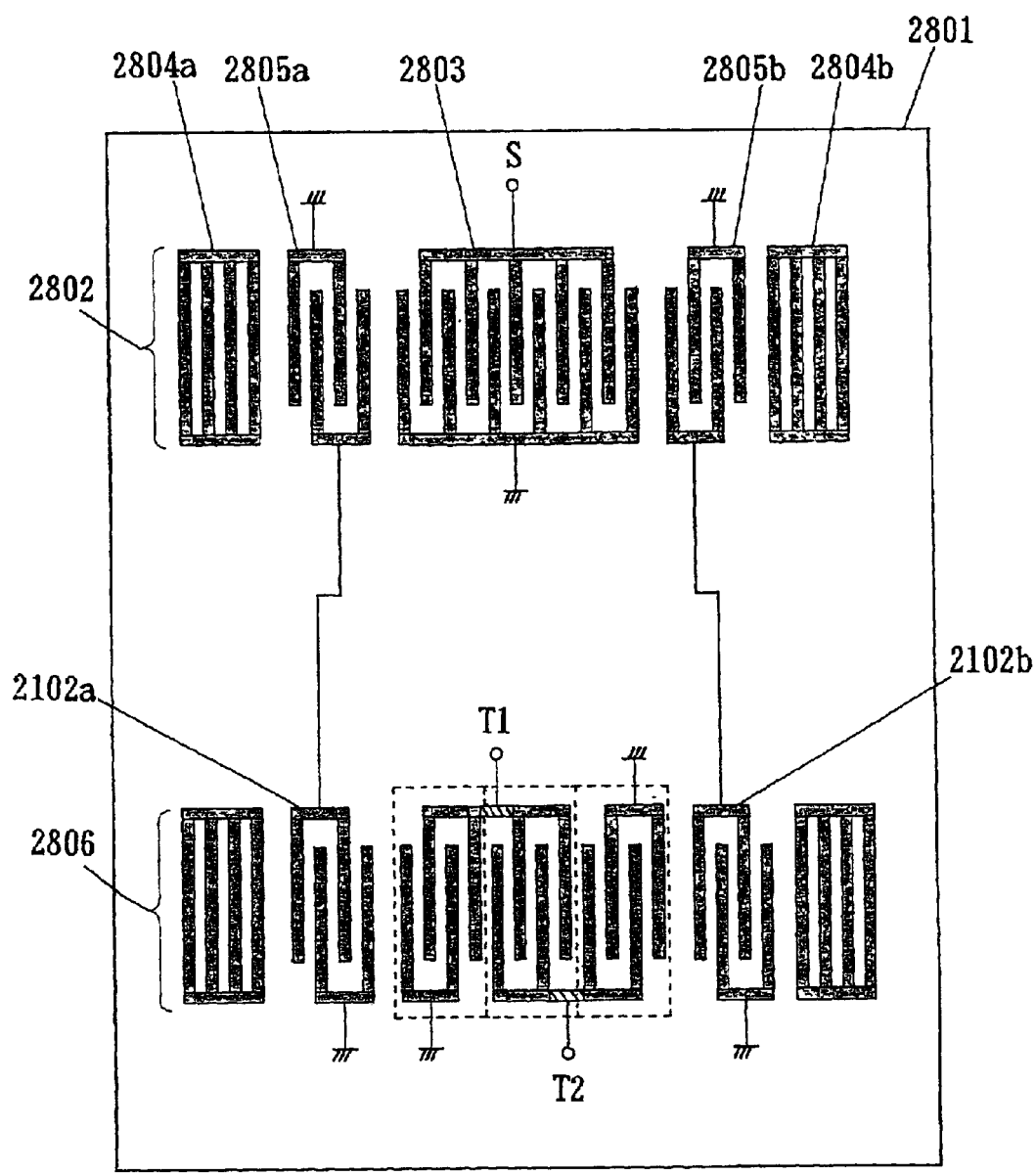
Fig. A8

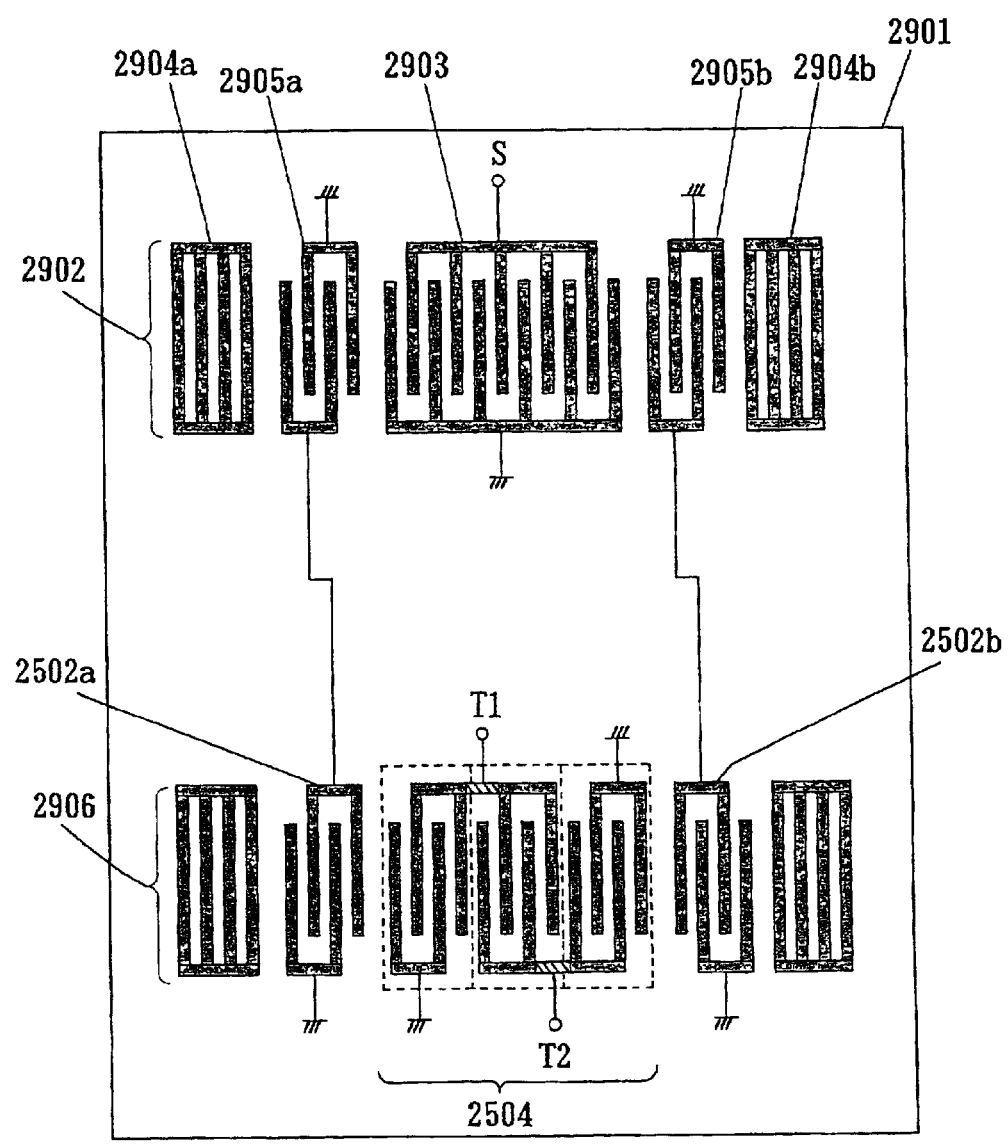
Fig. A9

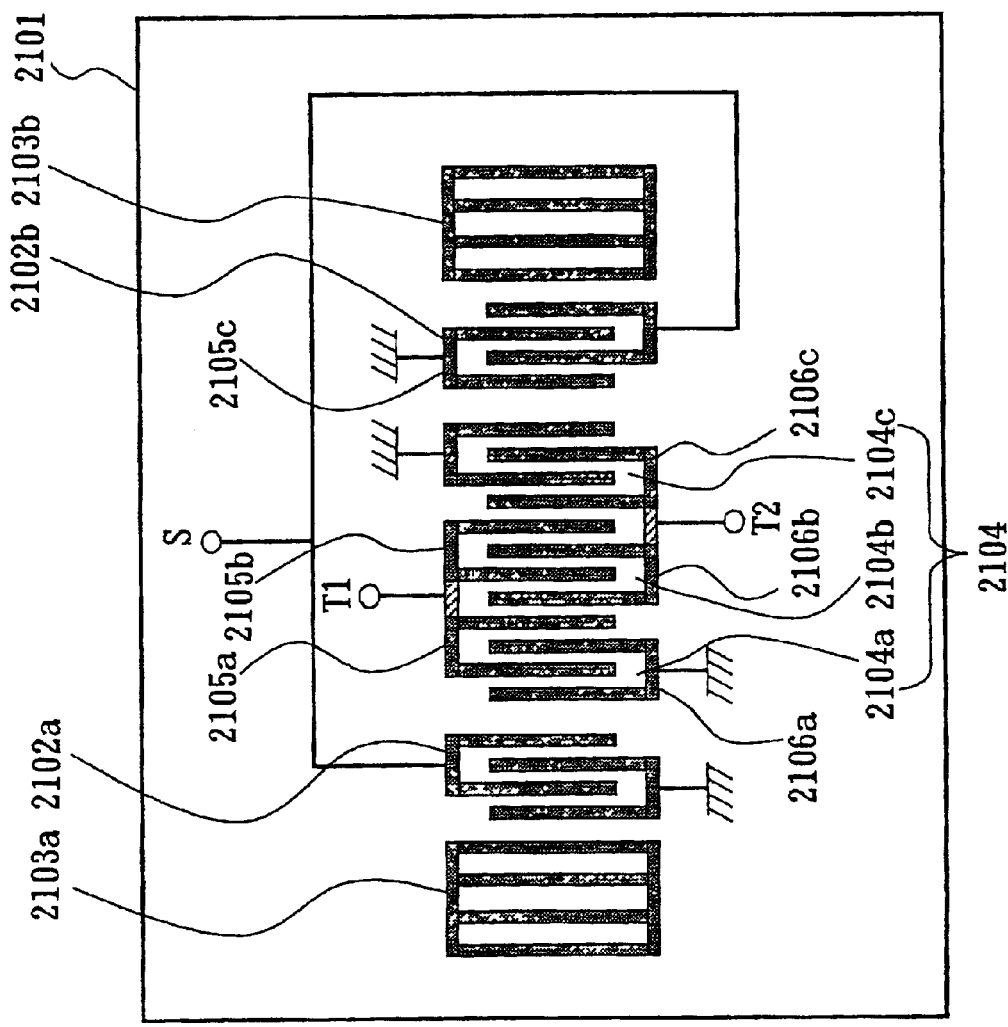
Fig. A10

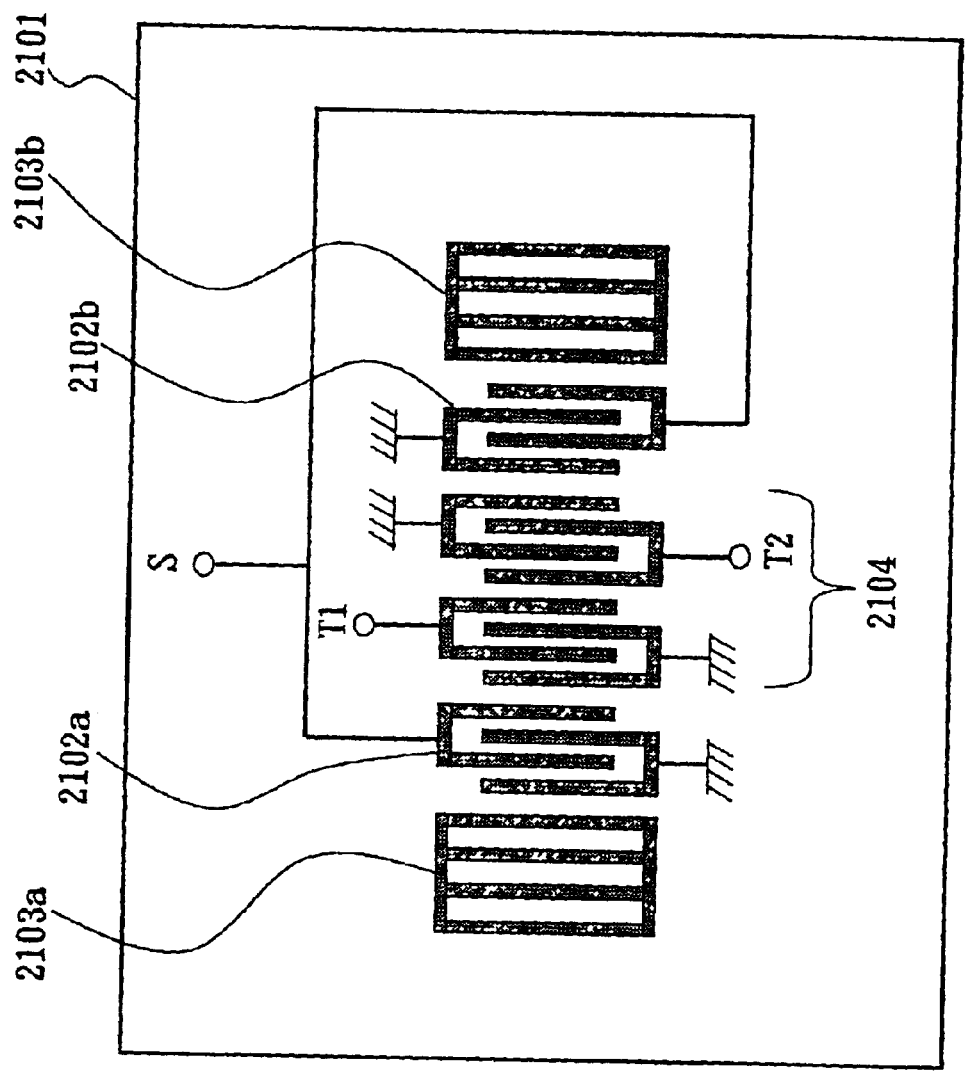
Fig. A11

Fig. A12 PRIOR ART
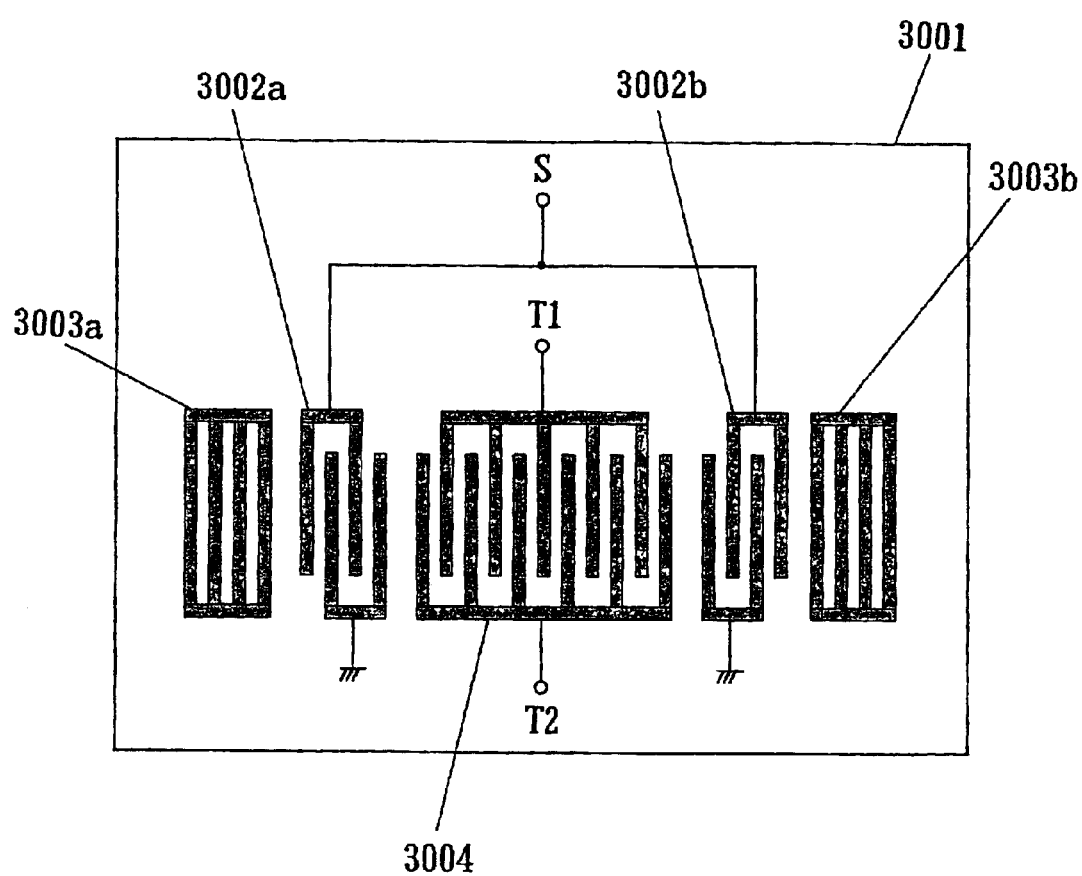

Fig. A13
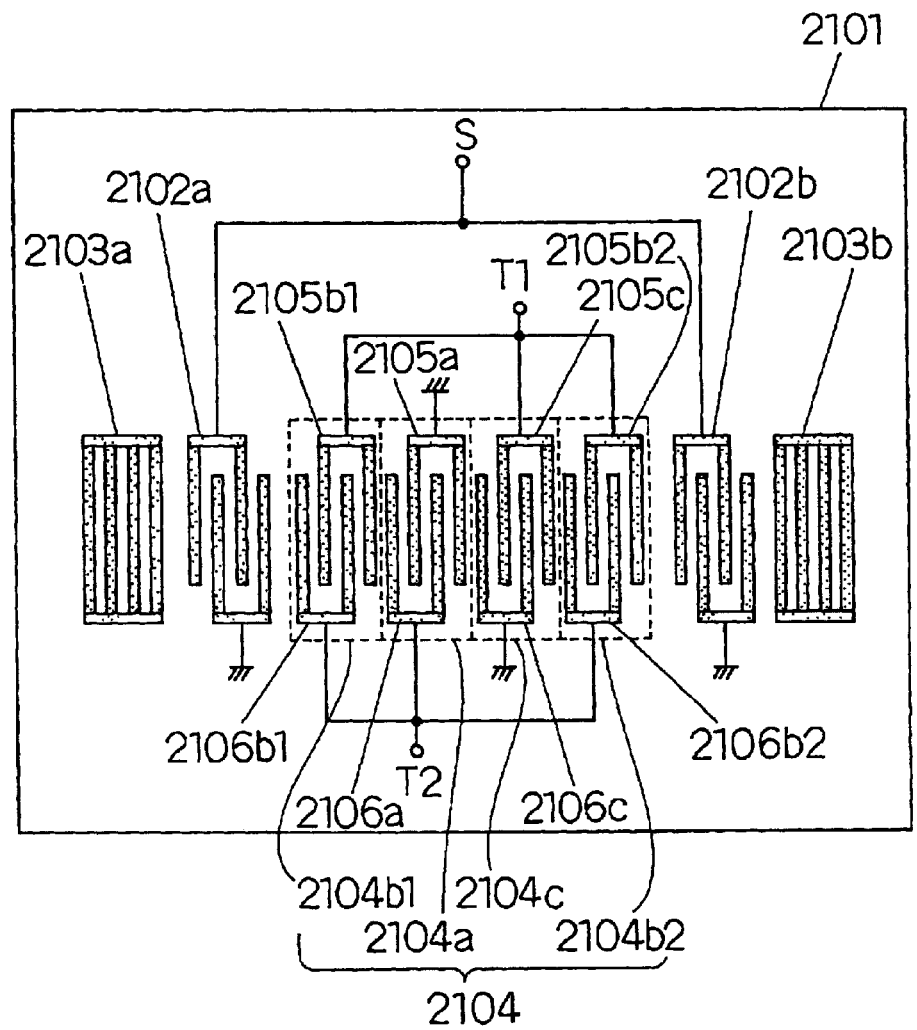
Fig. A14
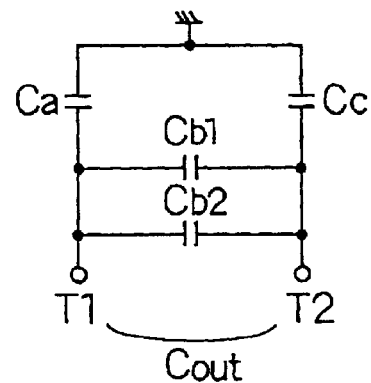

Fig. A15
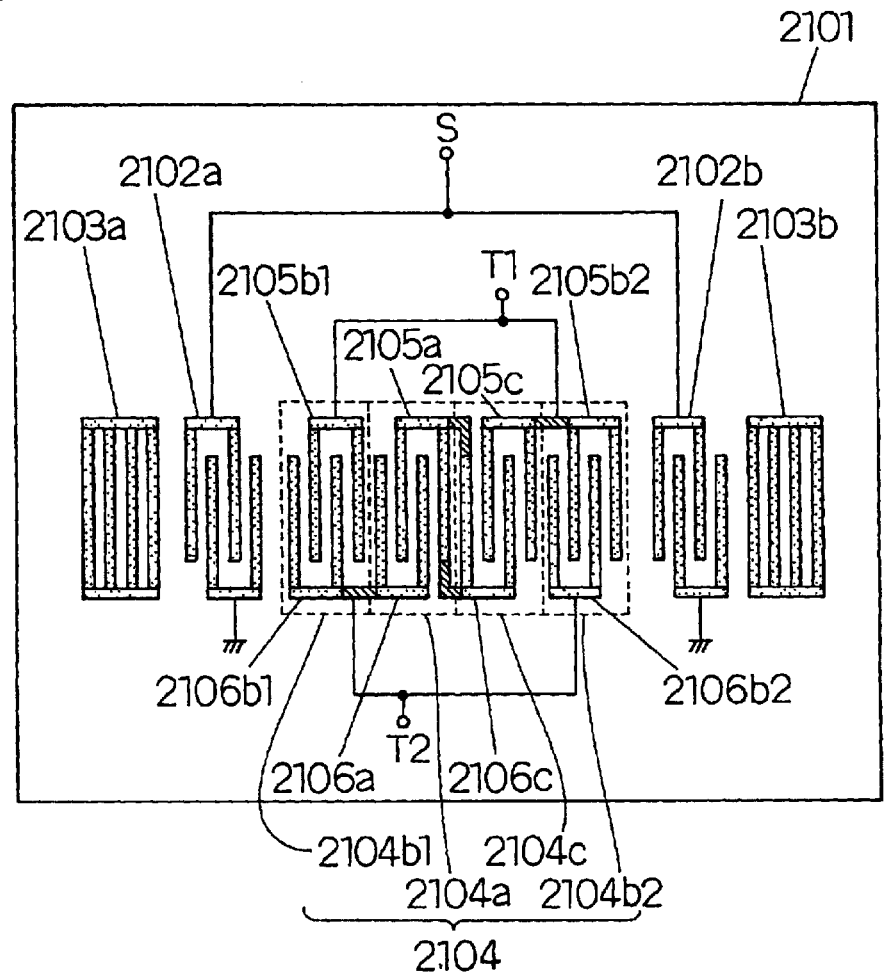
Fig. A16
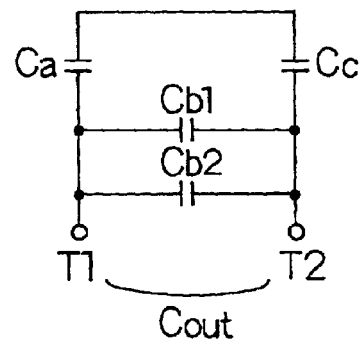

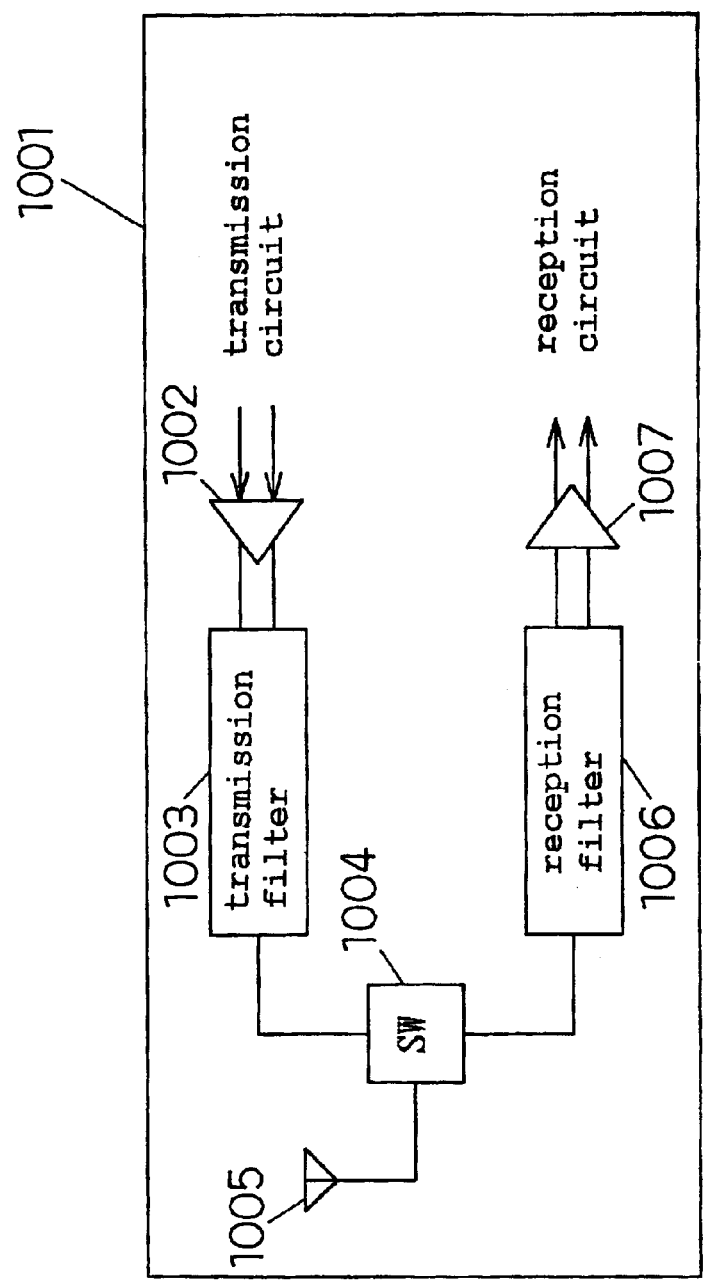
Fig. A17

Fig. B1
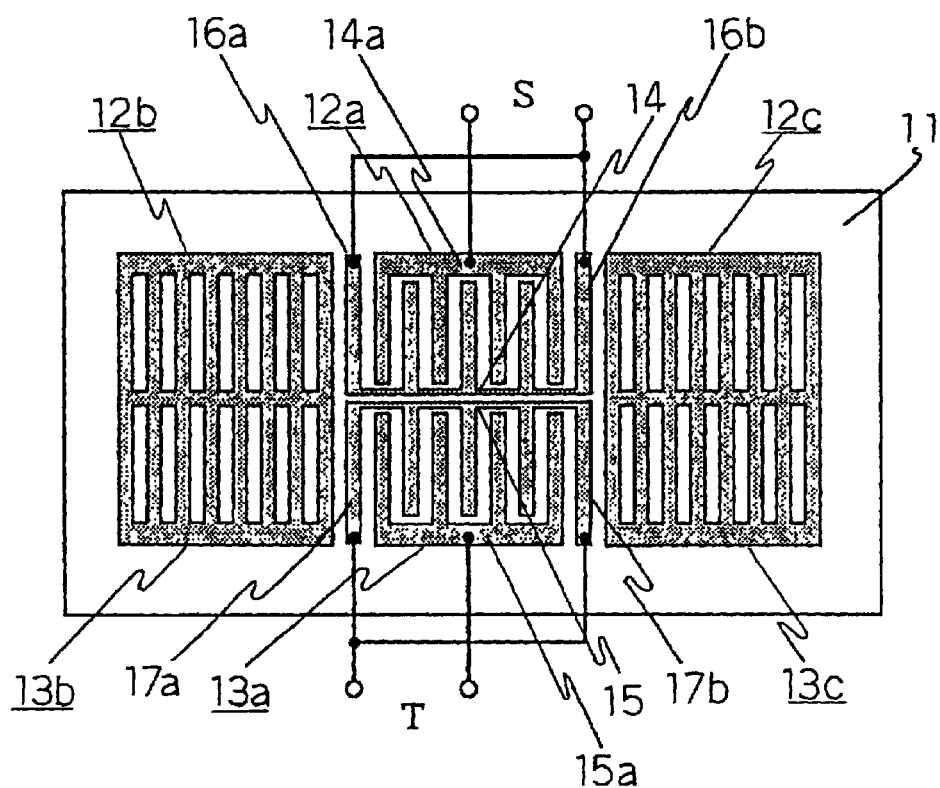

Fig. B2
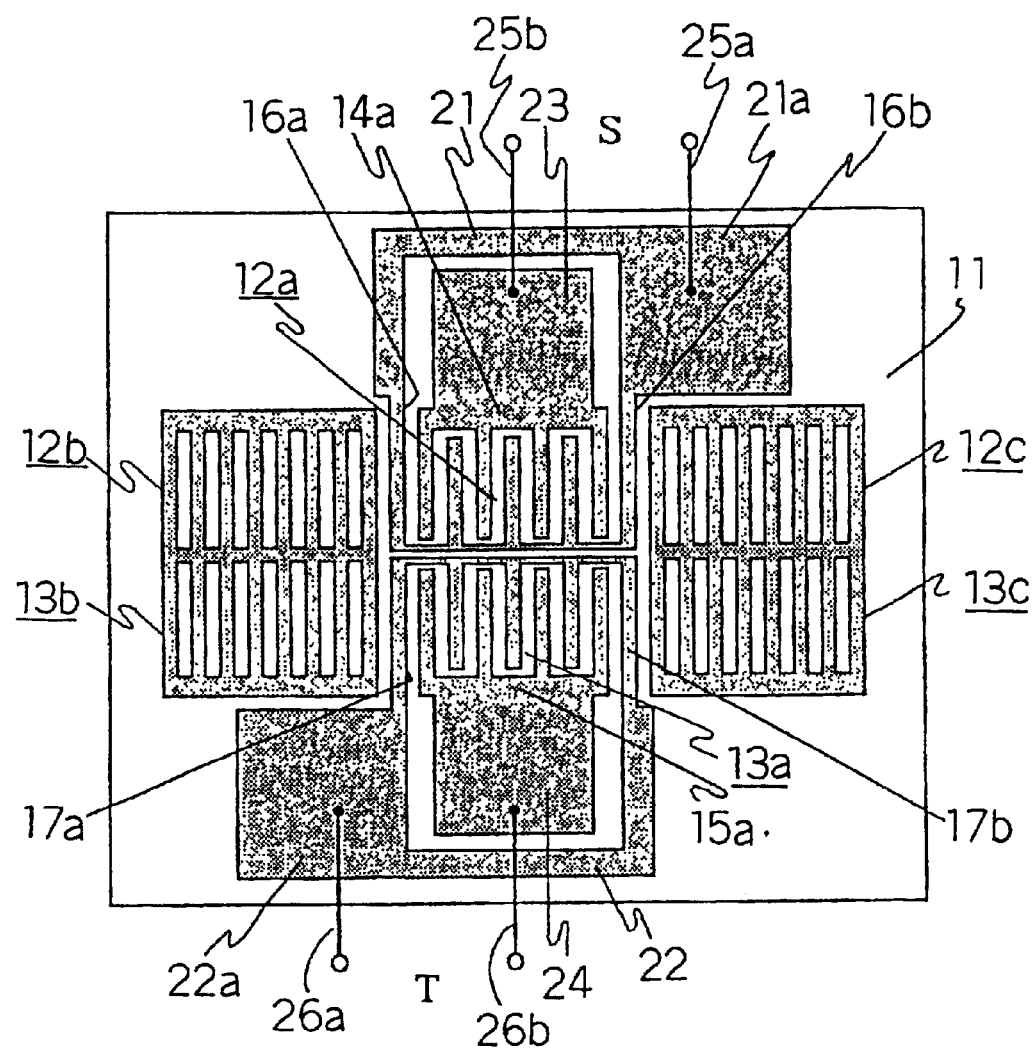

Fig. B3
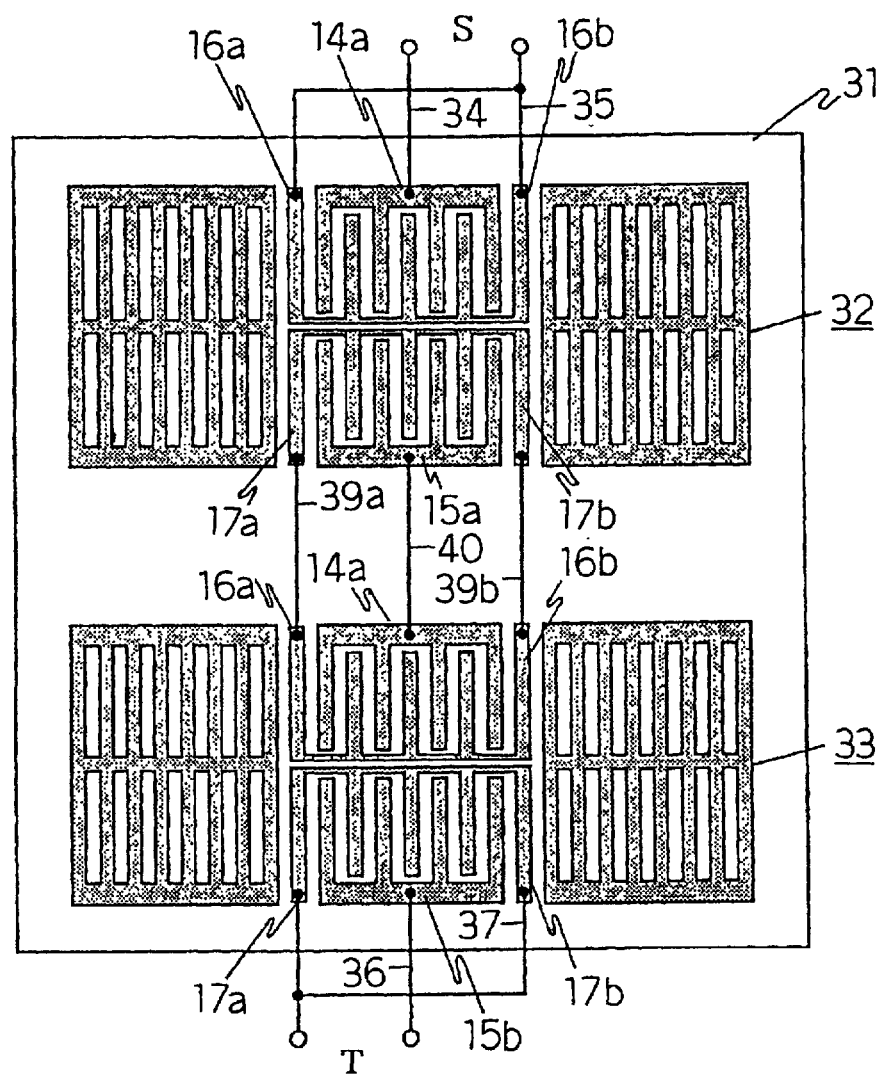

Fig. B4
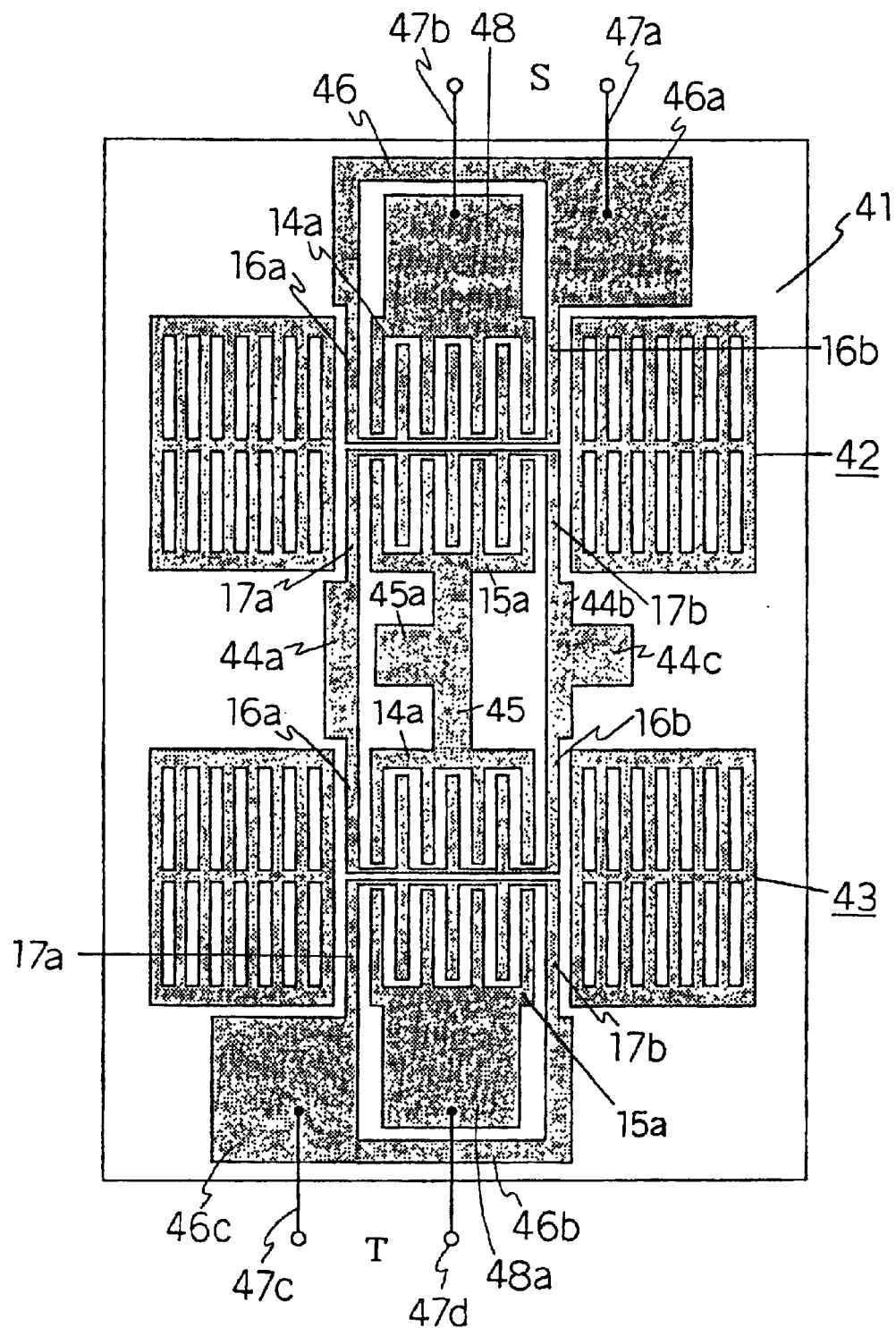

Fig. B5
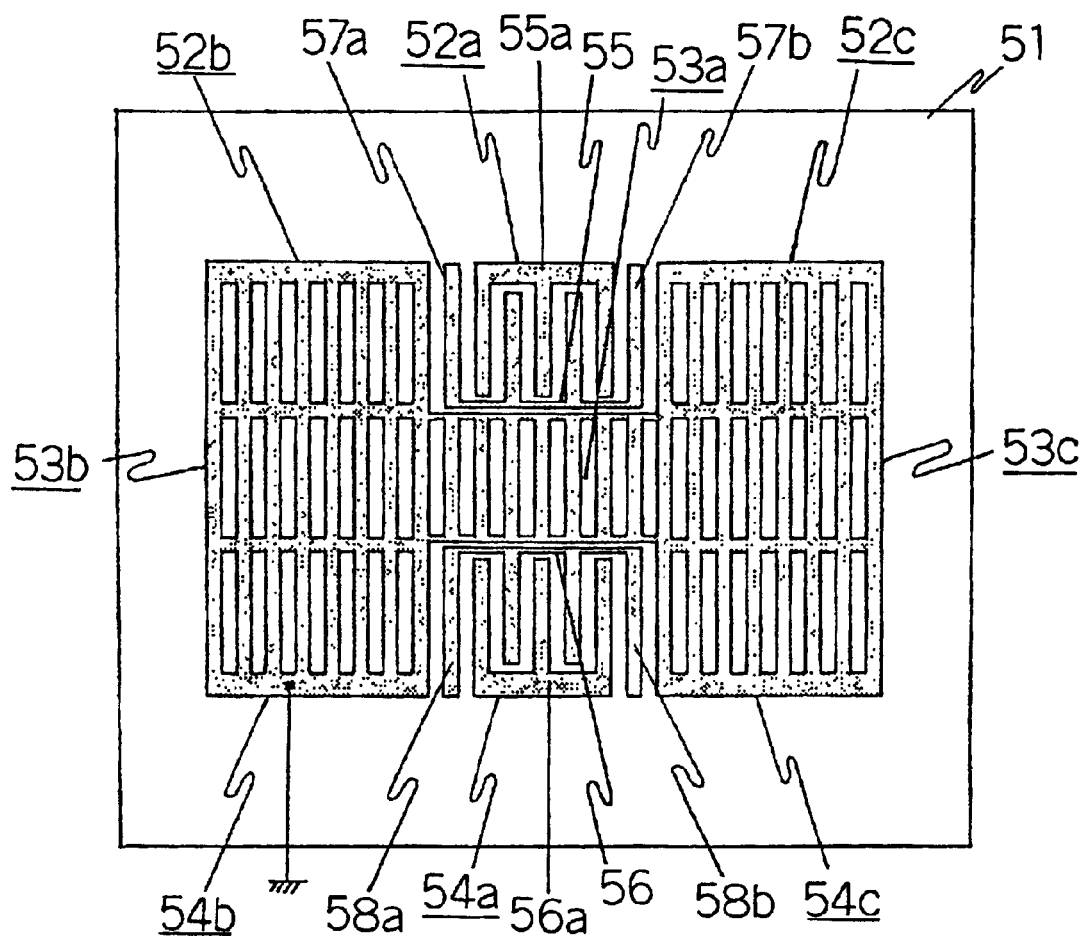

Fig. B6
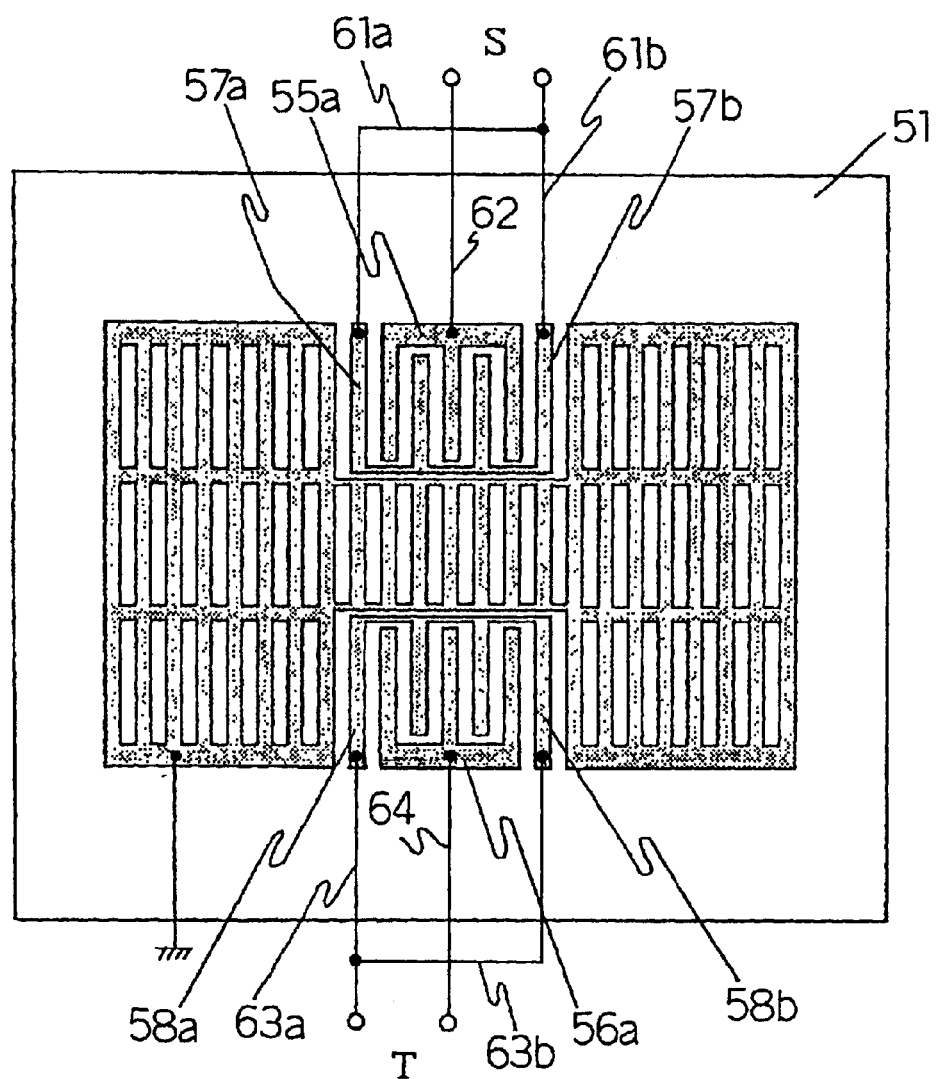

Fig. B7
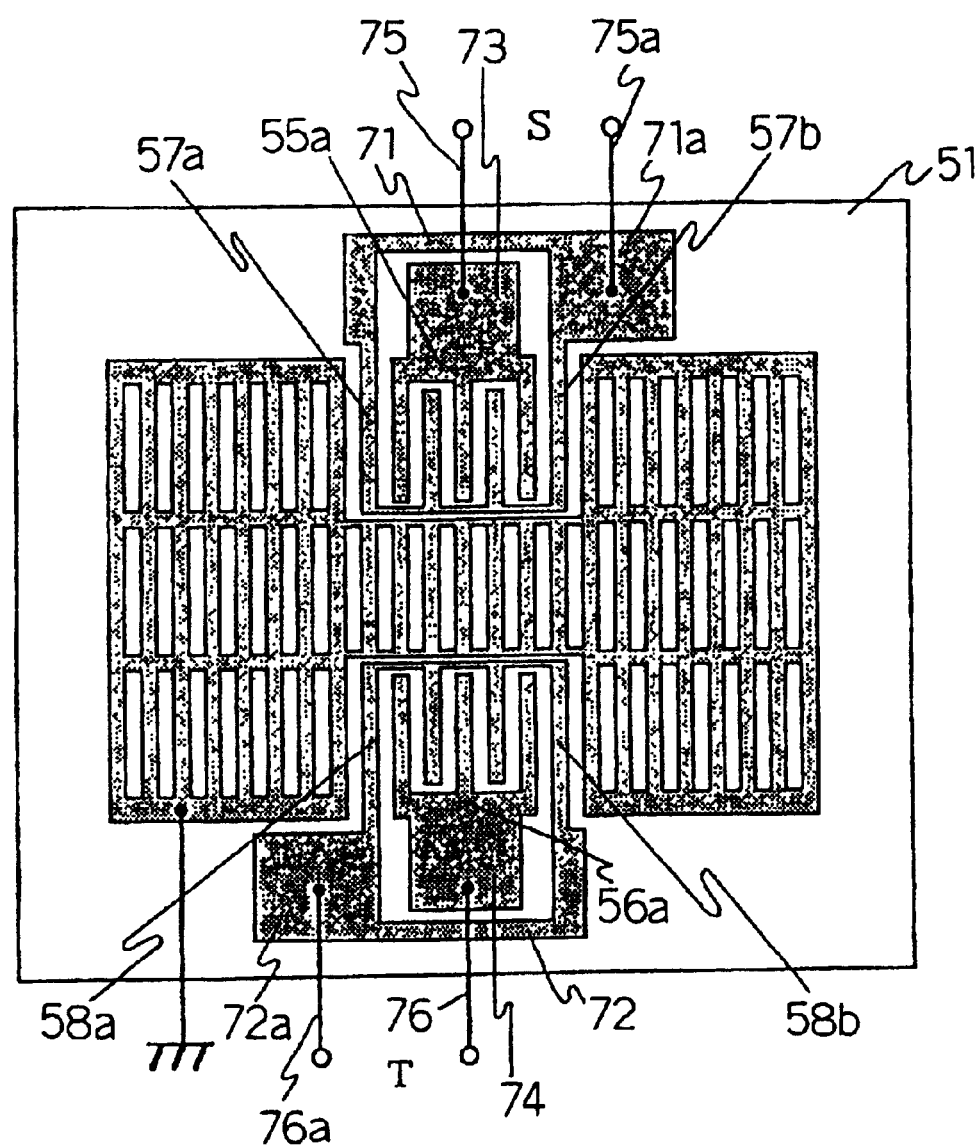

Fig. B8
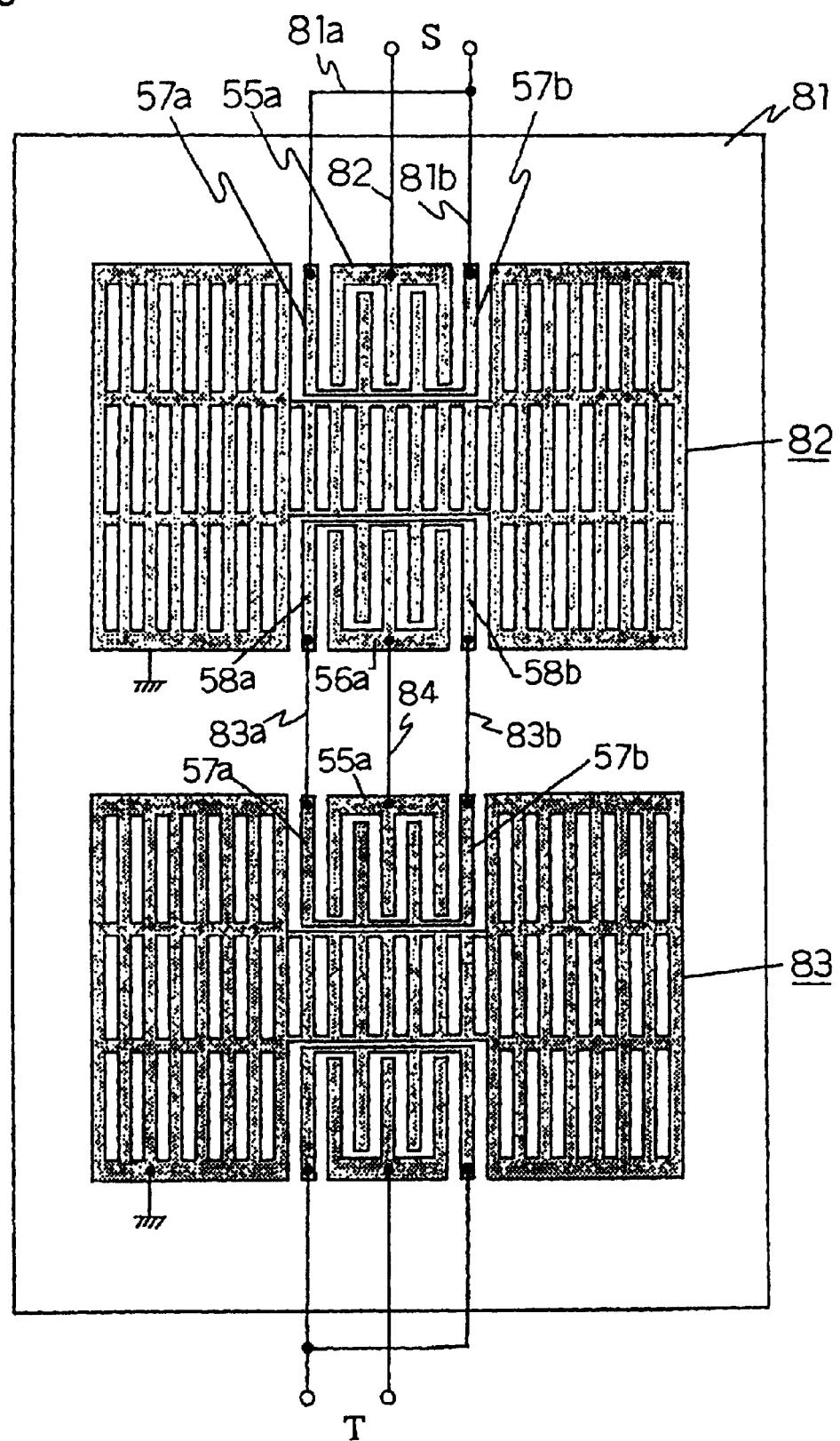

Fig. B9
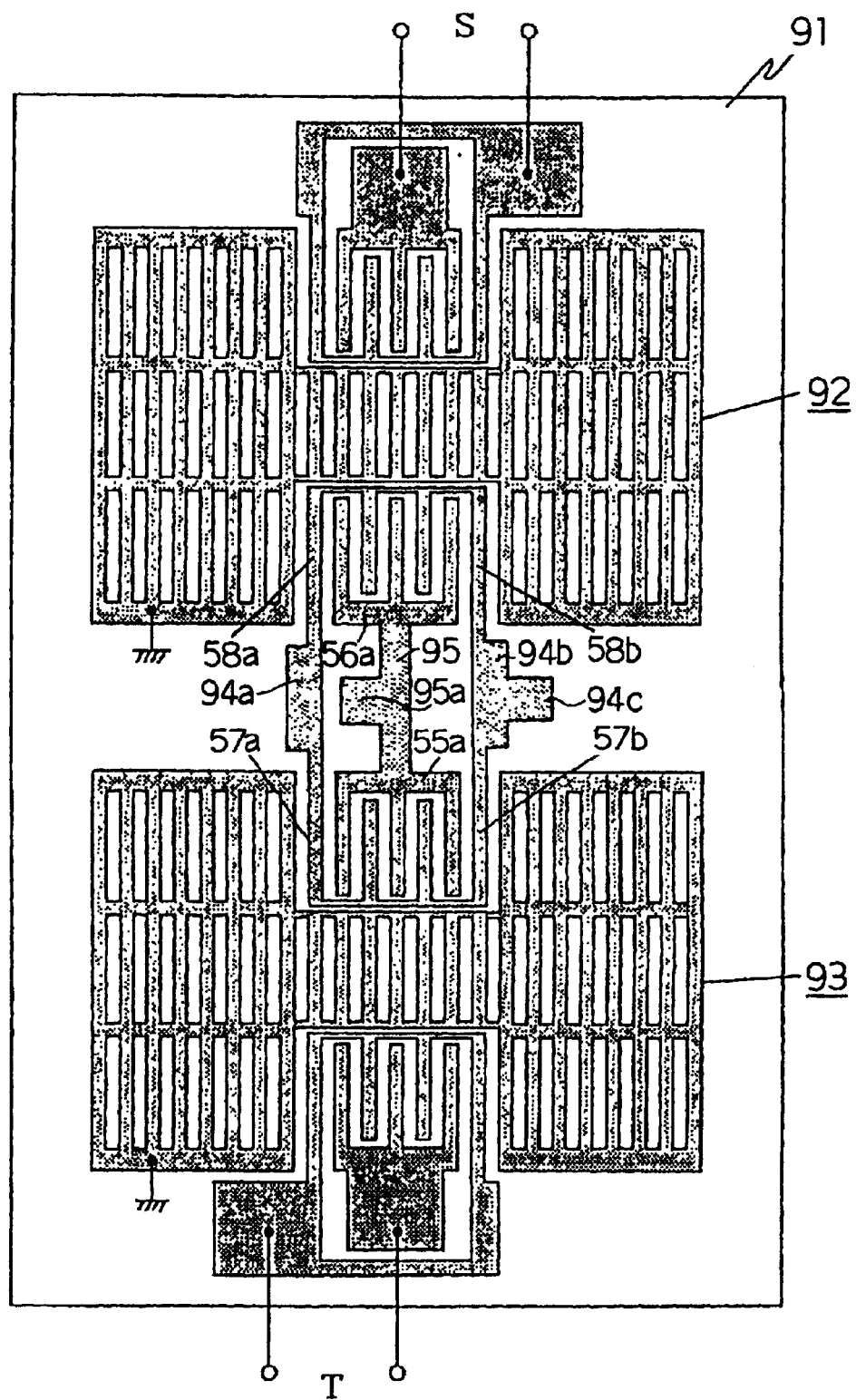

Fig. B10
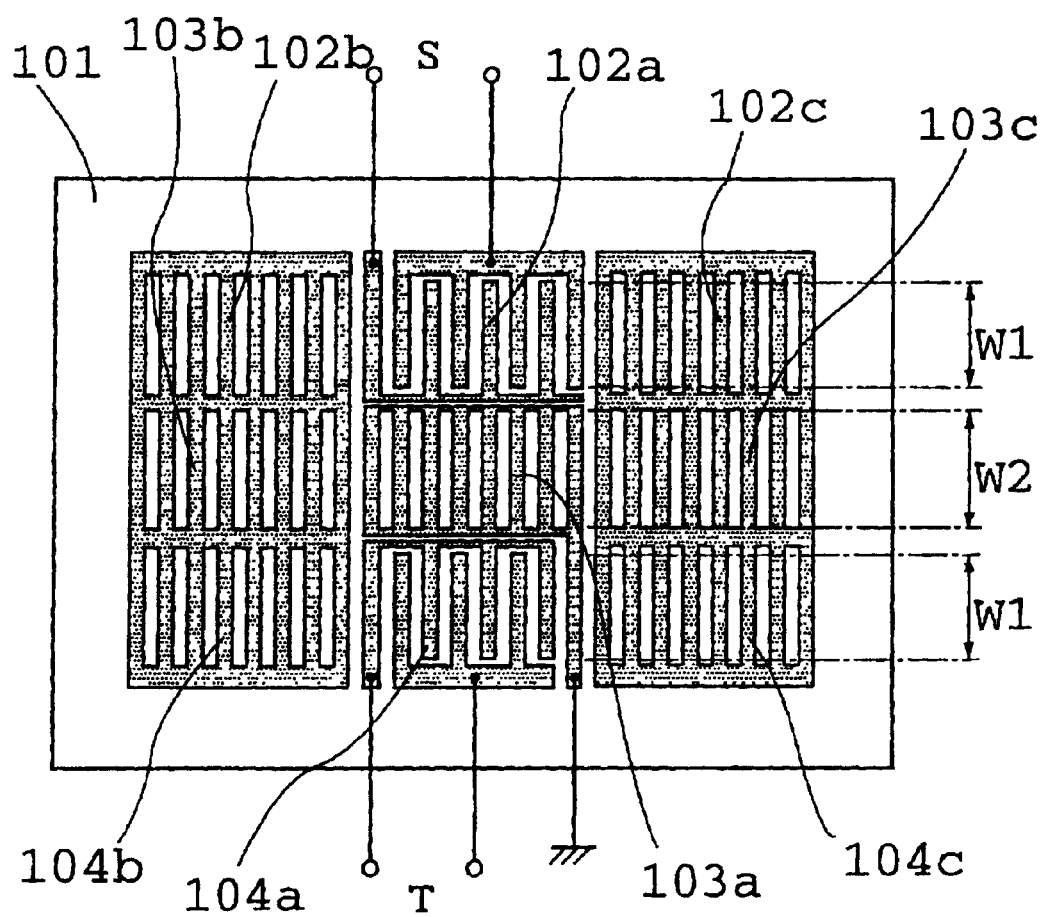

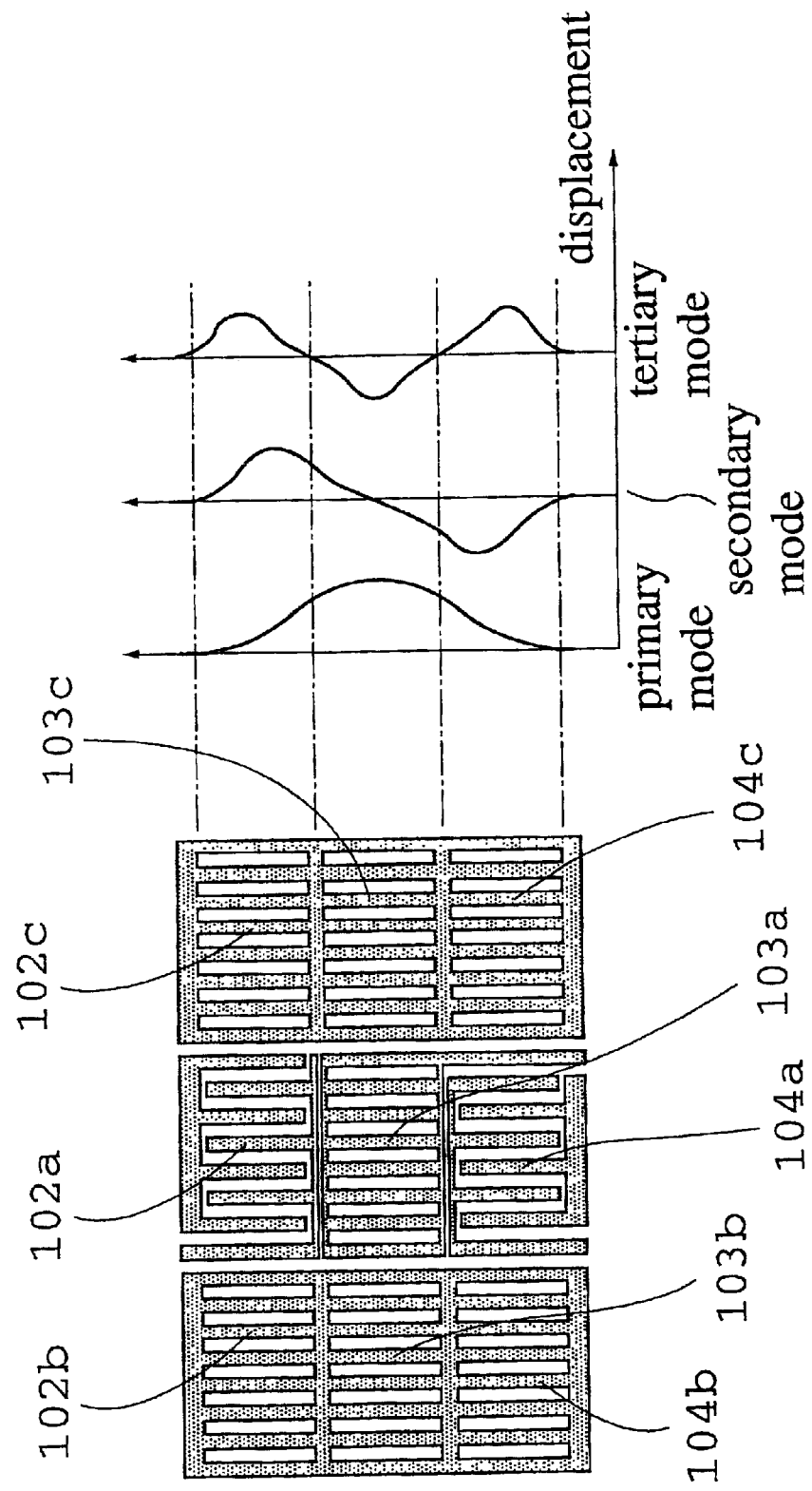

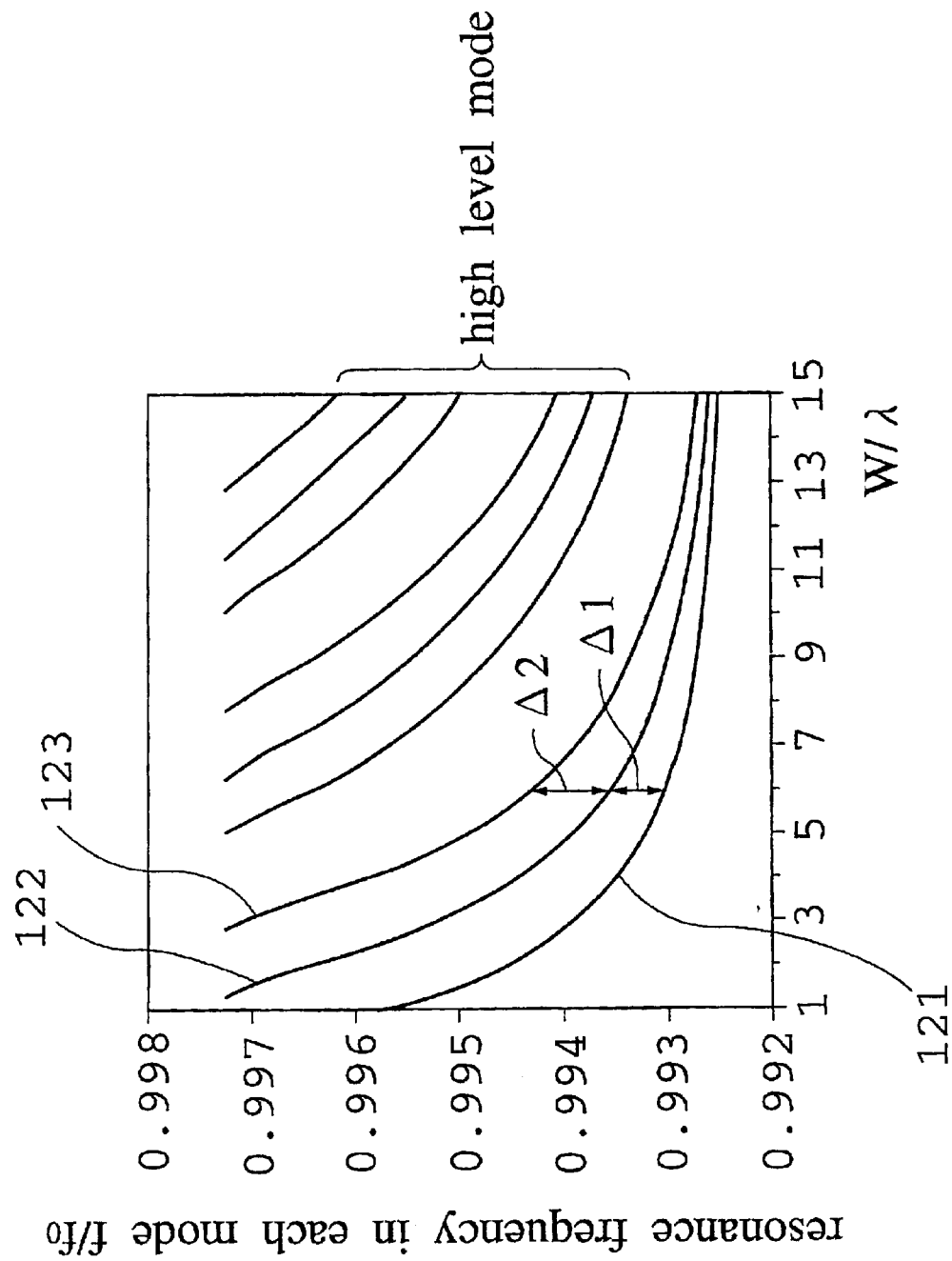
Fig. B12

Fig. B13
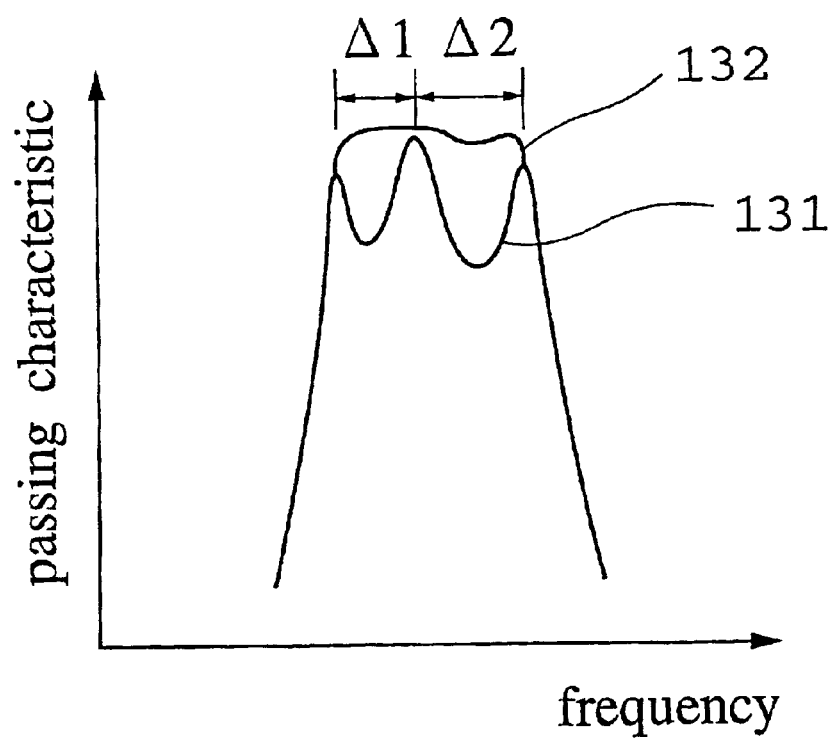

Fig. B14
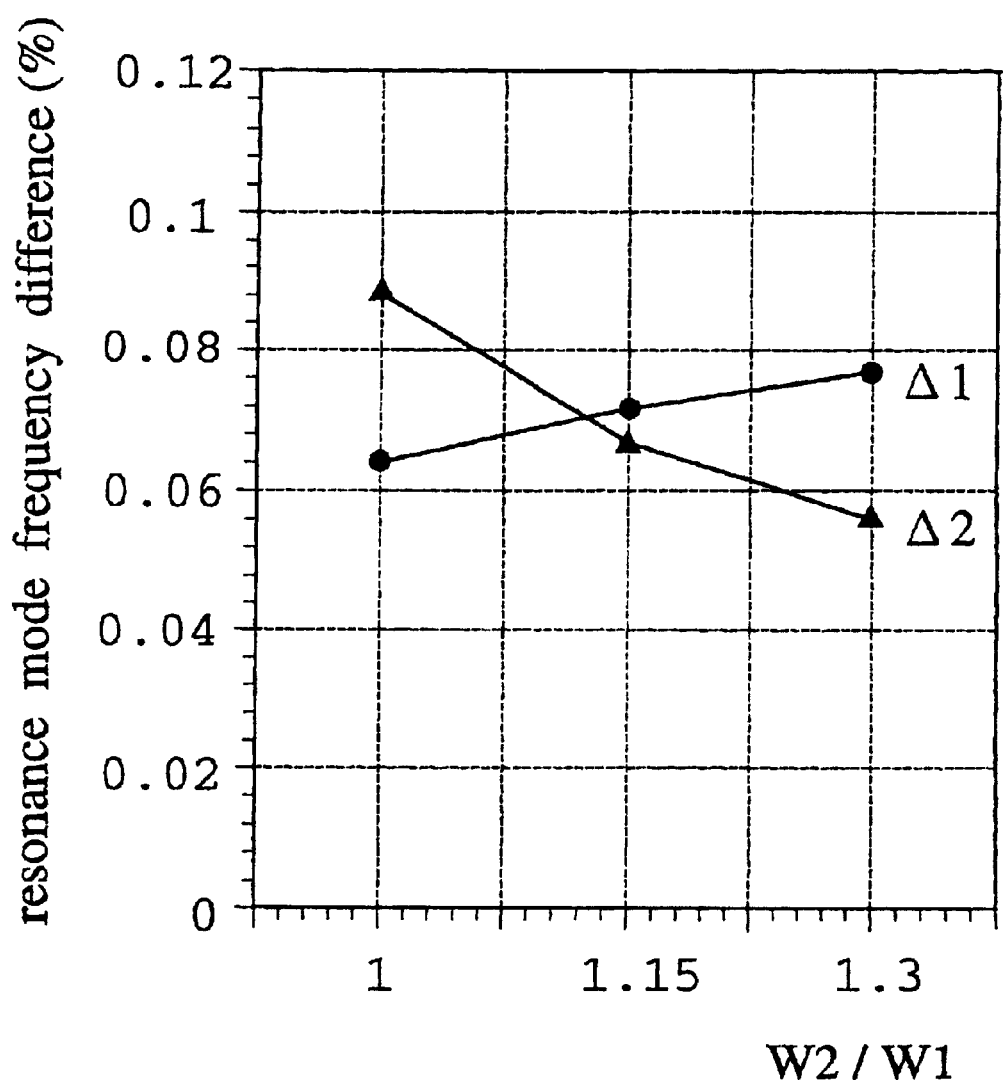

Fig. B15
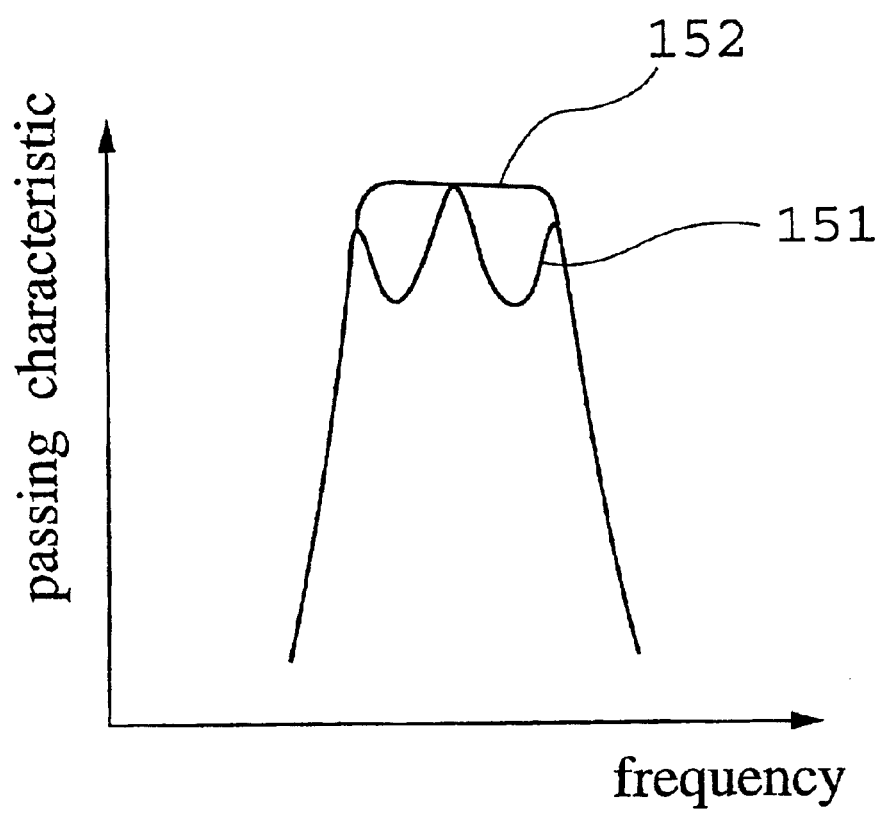

Fig. B16
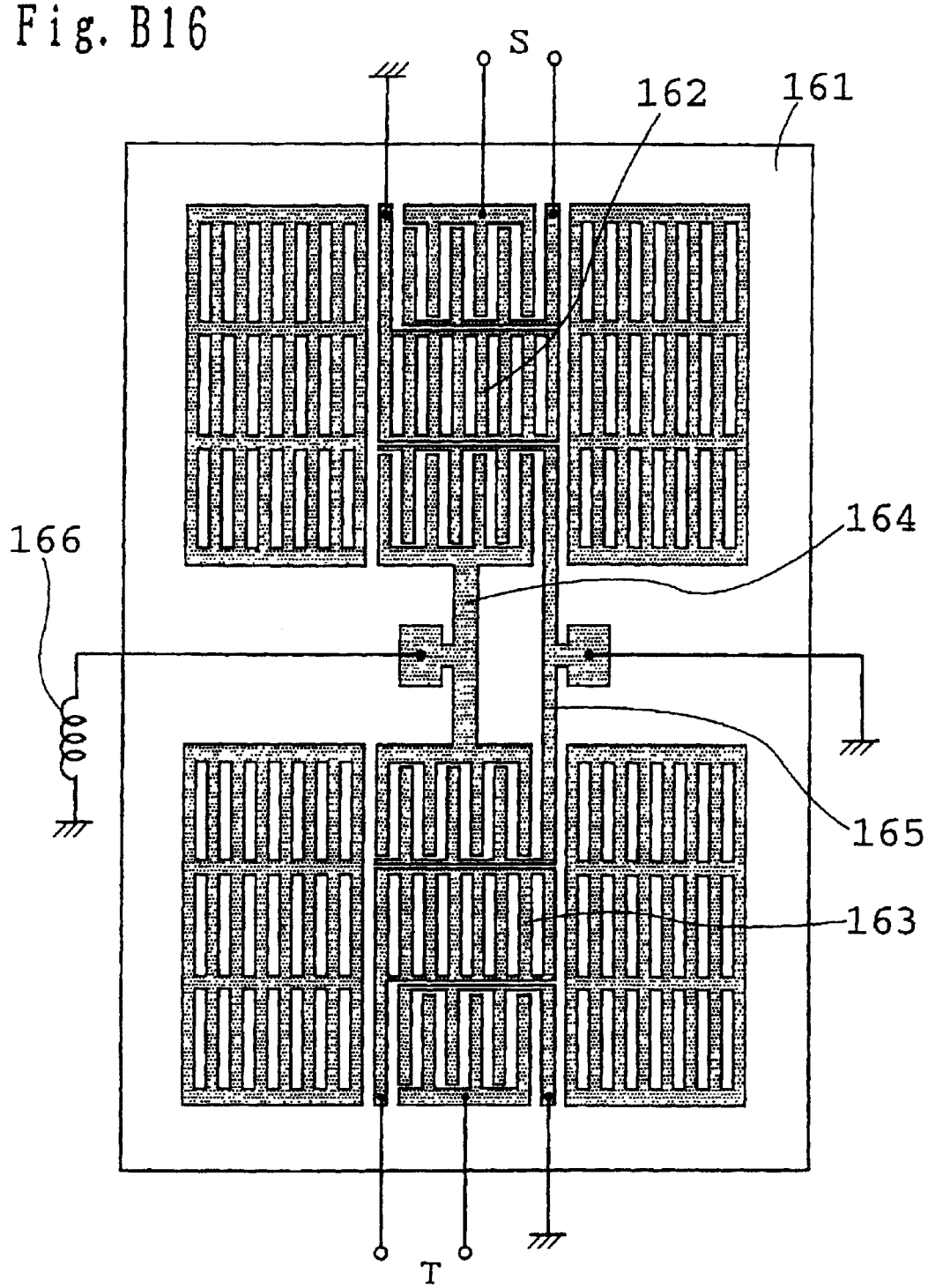

Fig. B17
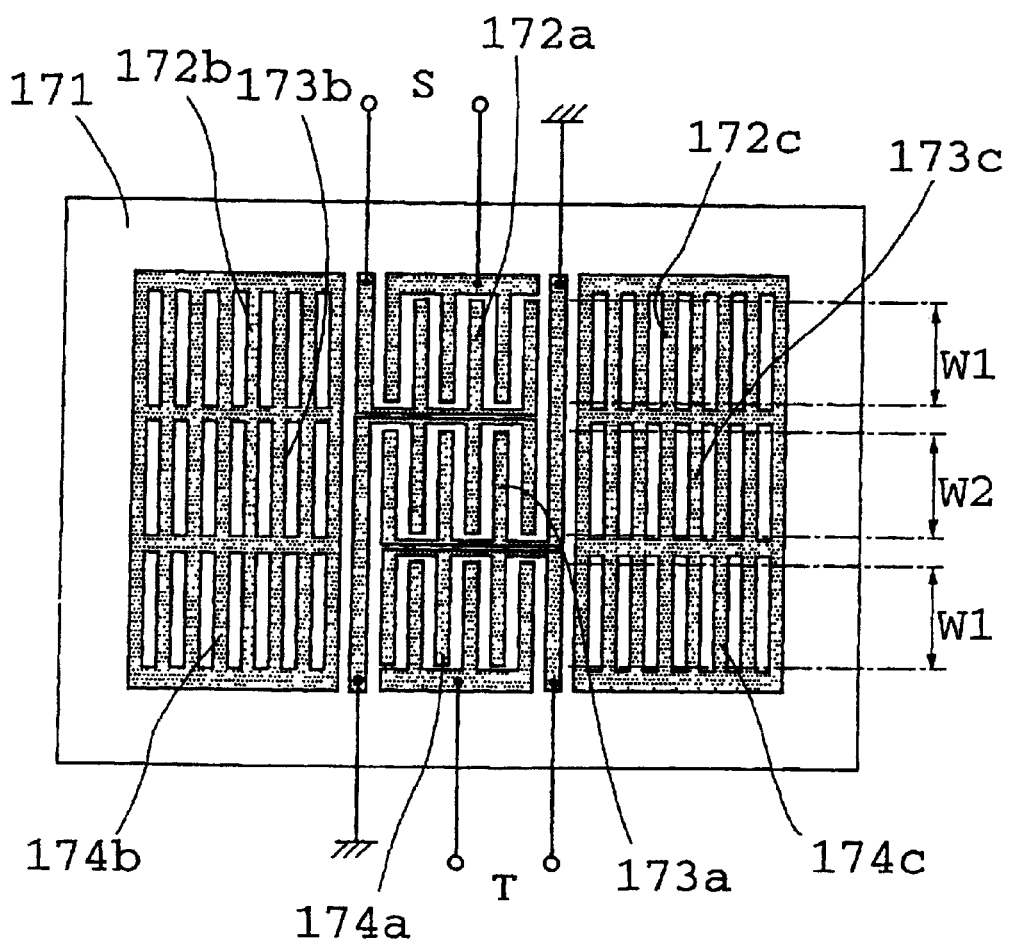

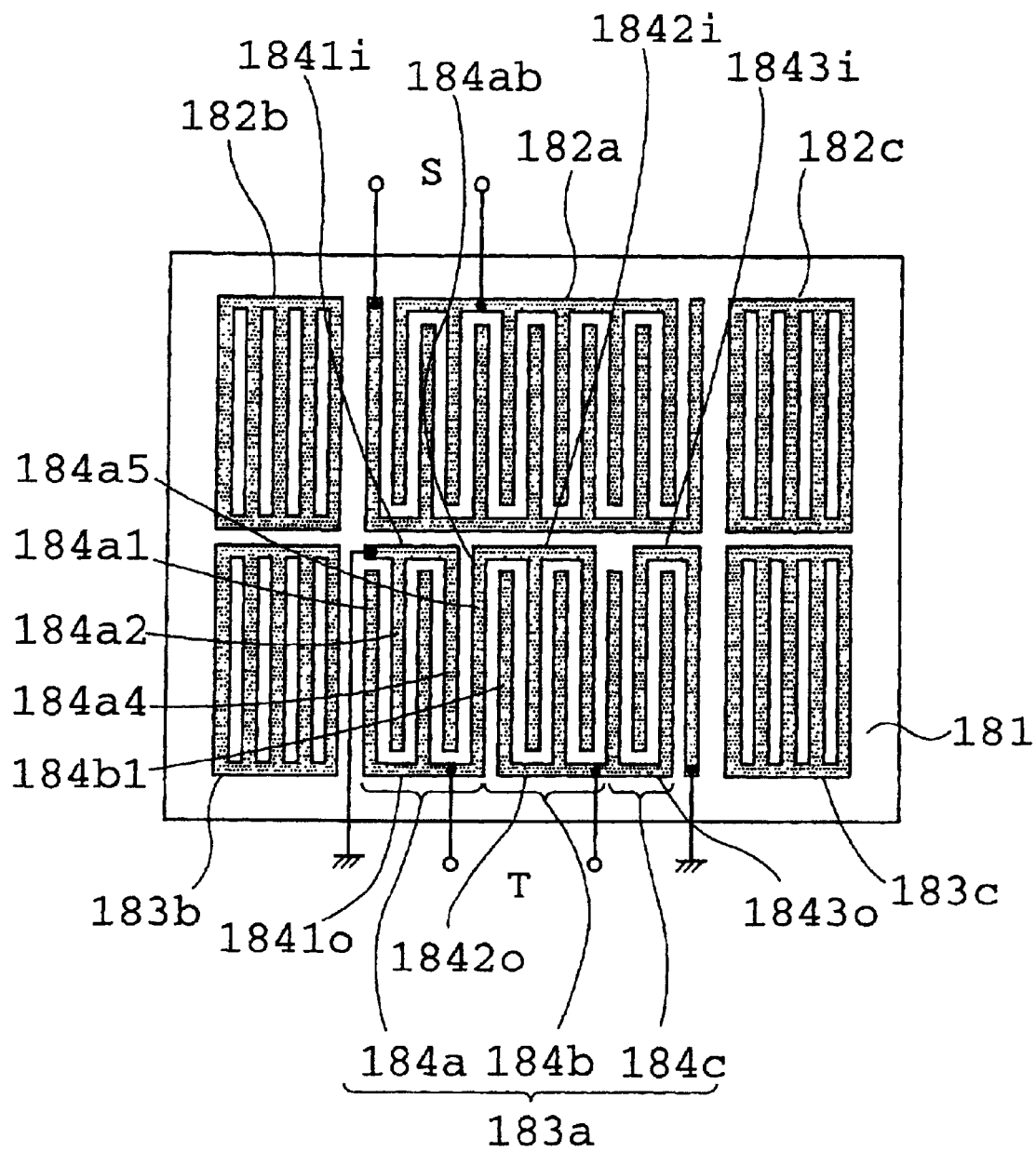
Fig. B18

Fig. B19
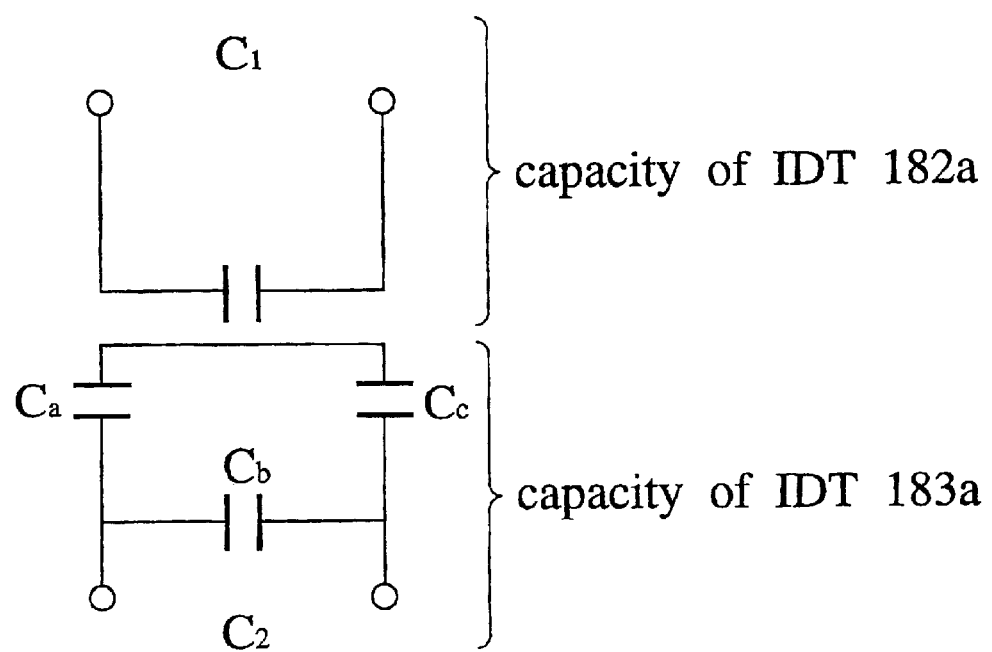

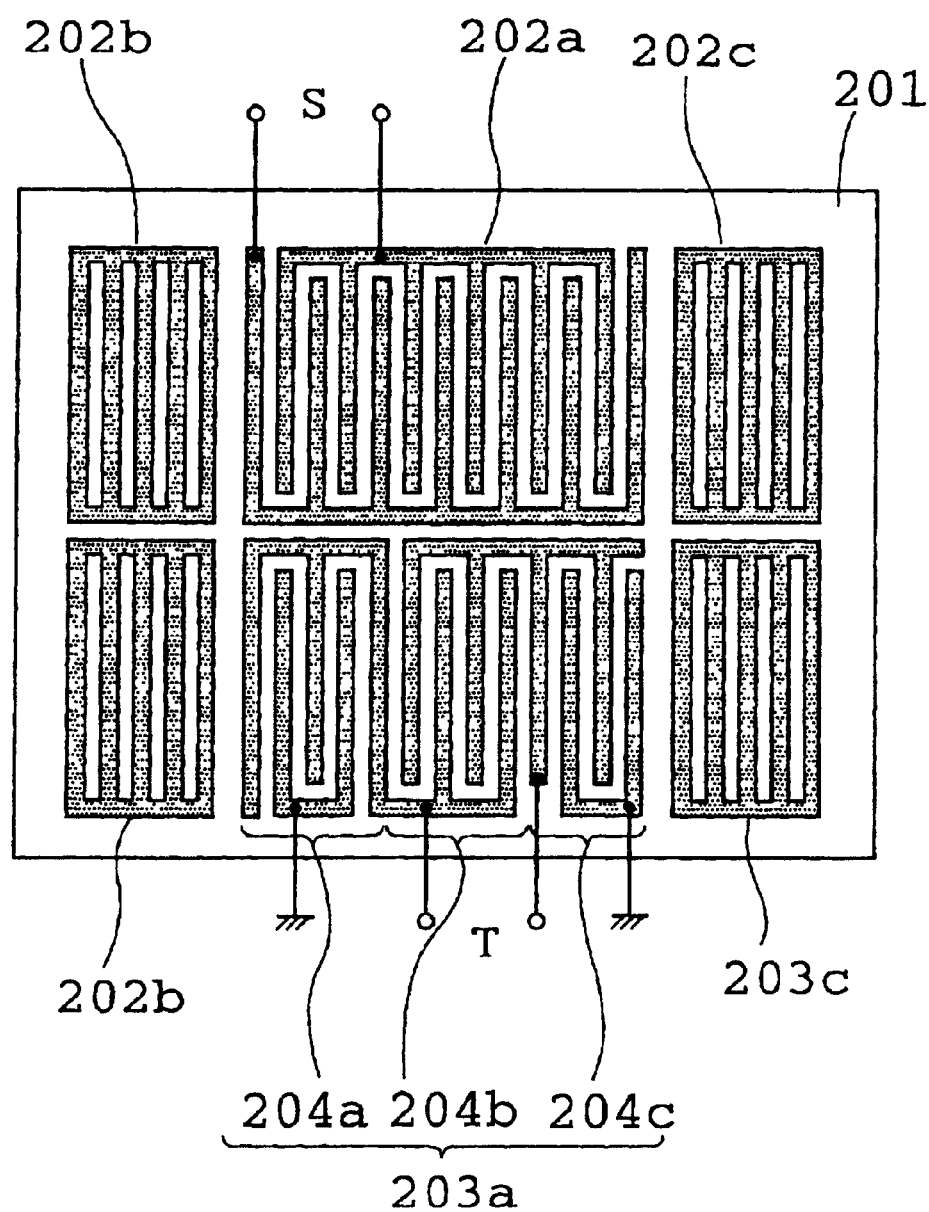
Fig. B20

Fig. B21
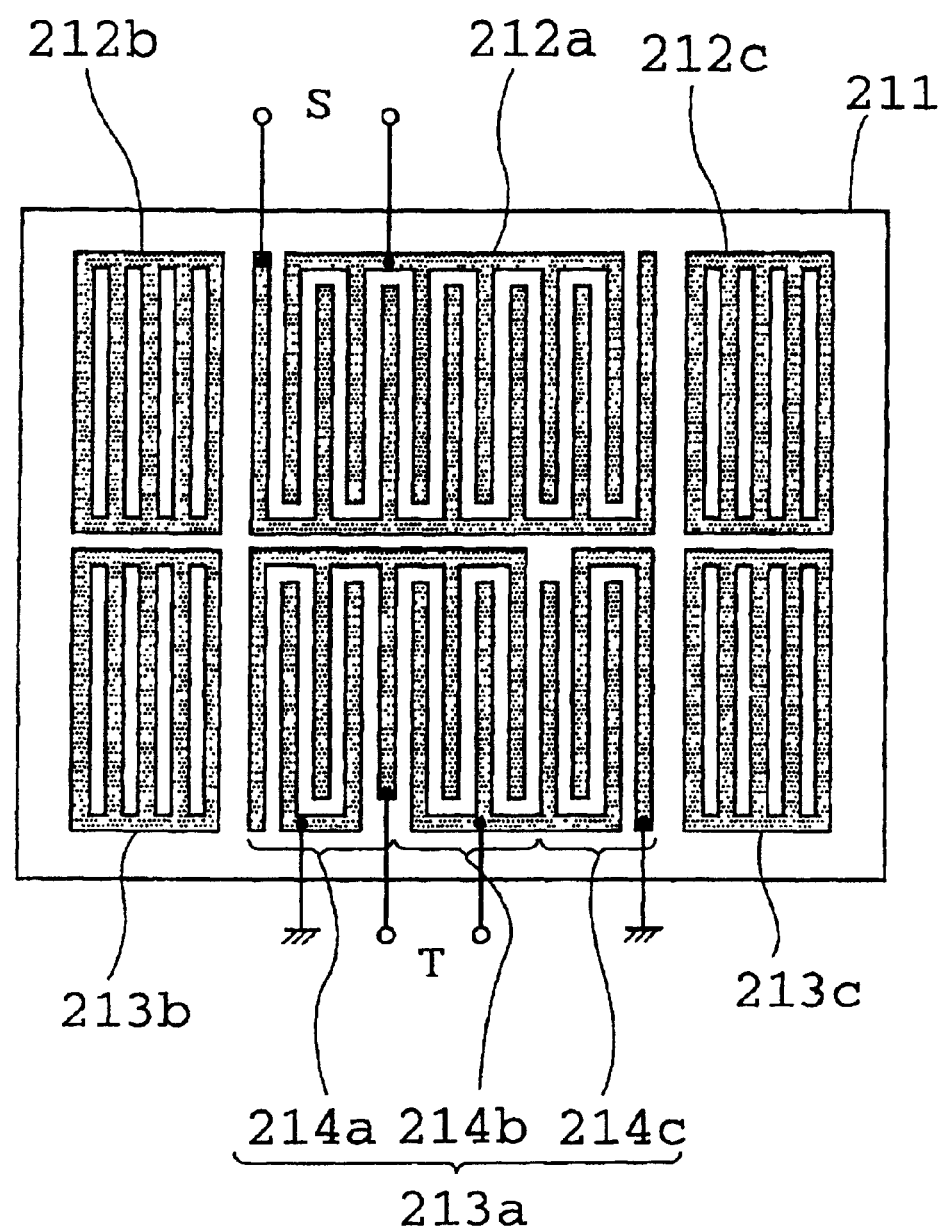

Fig. B22
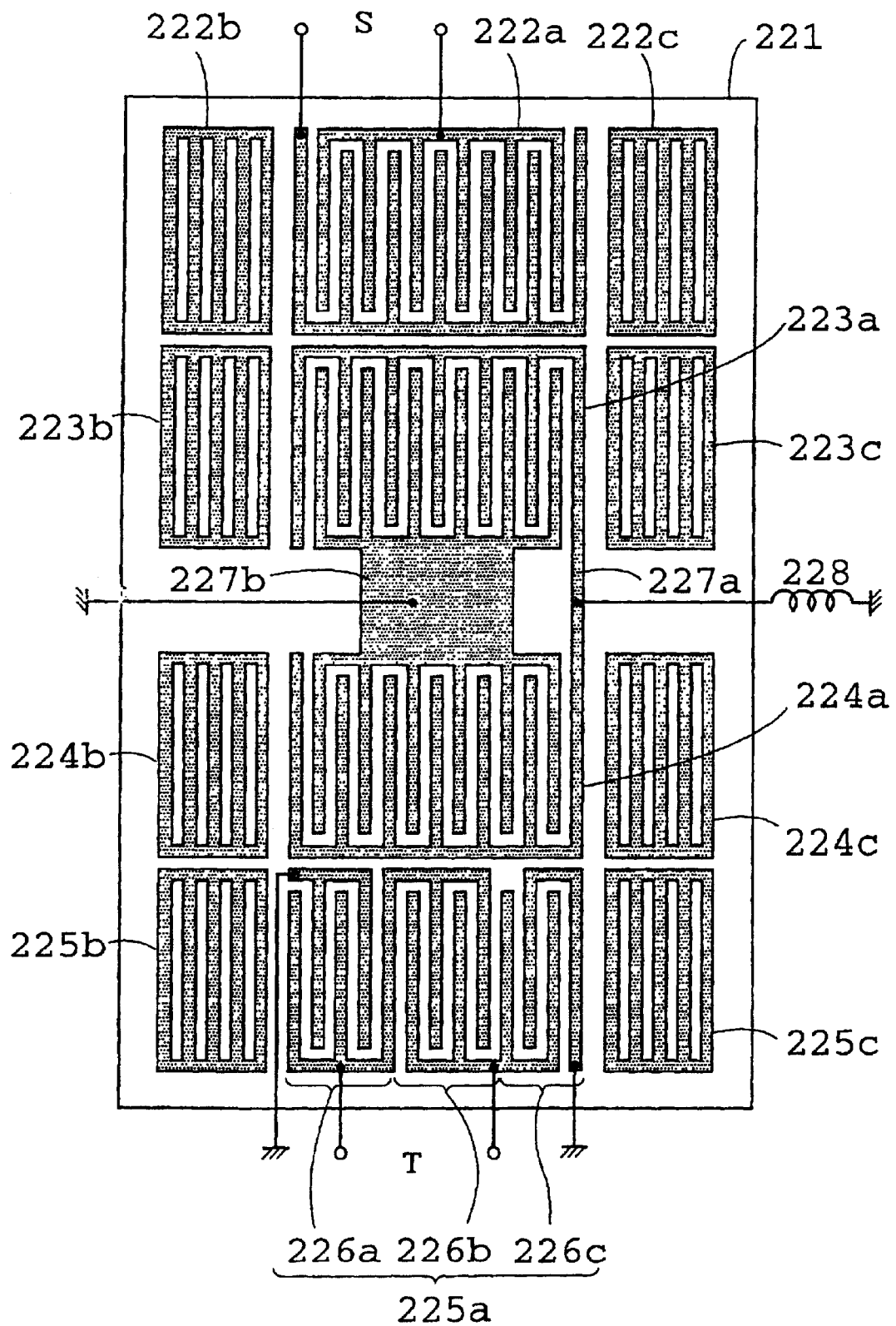

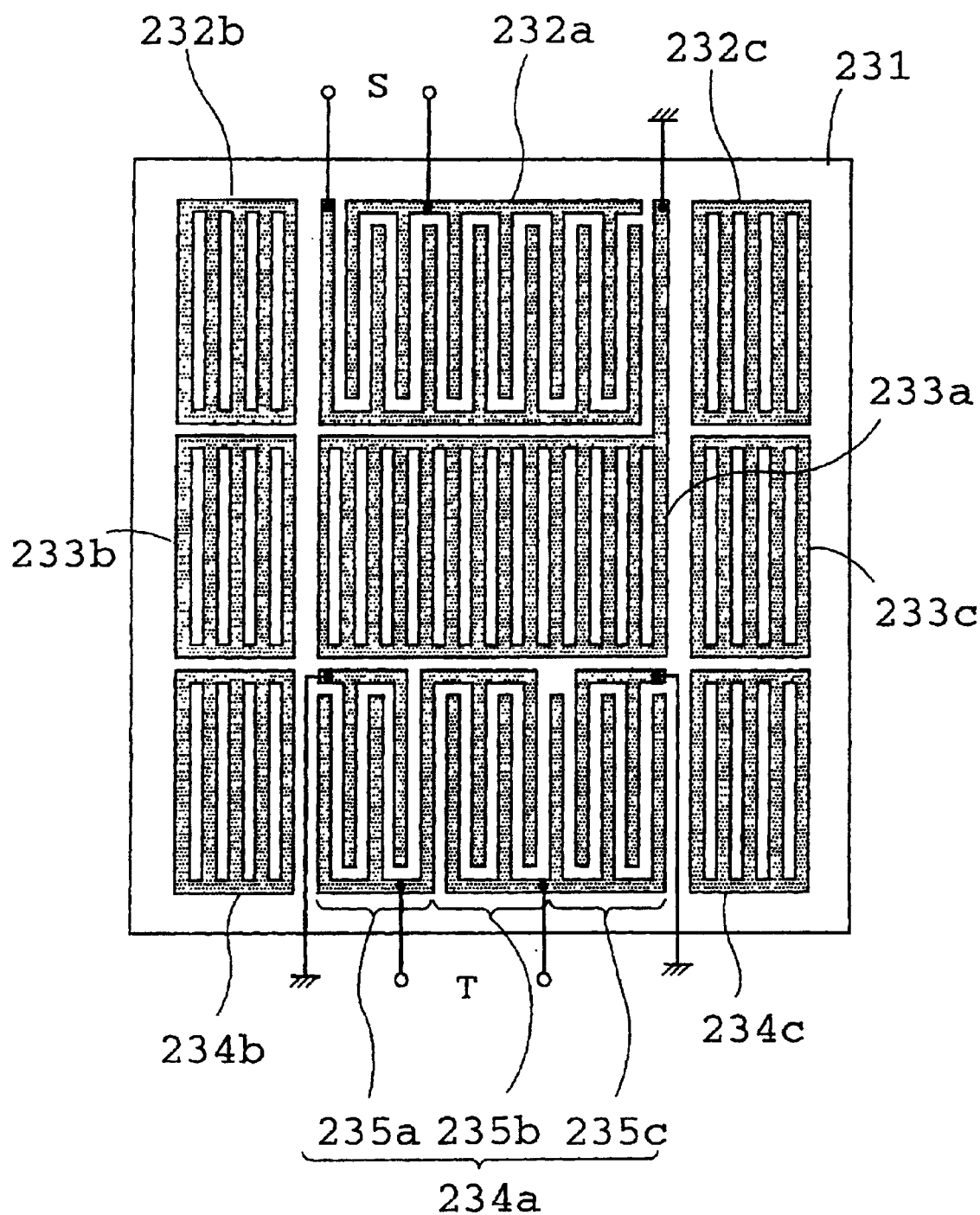
Fig. B23

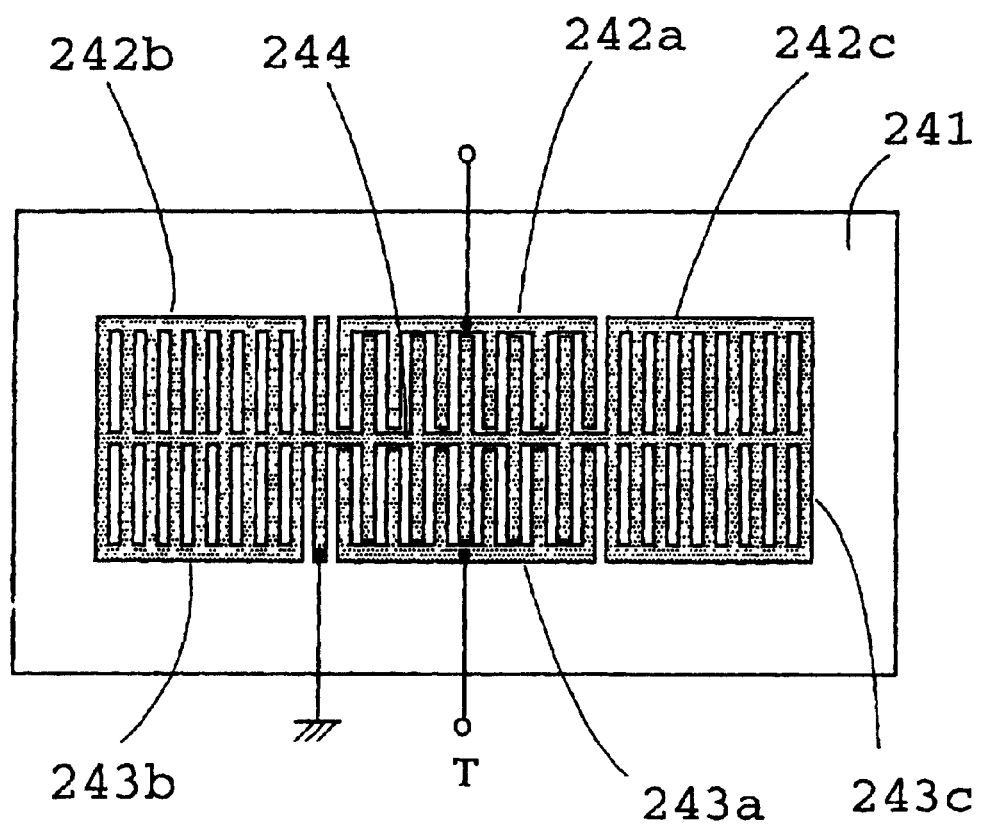
Fig. B24 PRIOR ART

INTER-DIGITAL TRANSDUCER, SURFACE ACOUSTIC WAVE FILTER AND COMMUNICATION APPARATUS USING THE SAME

This application is a continuation-in-part of the application Ser. No. 09/794,035, filed on Feb. 28, 2001, now U.S. Pat. No. 6,348,845, which is a divisional of application Ser. No. 09/390,653, filed on Sep. 7, 1999, now U.S. Pat. No. 6,351,196, which is a divisional of application Ser. No. 08/862,383, filed on May 23, 1997, now U.S. Pat. No. 5,990,762.

BACKGROUND OF THE INVENTION

1. Field of the Invention

The present invention relates to an inter-digital transducer provided with a balanced type terminal, a longitudinally coupled mode type surface acoustic wave filter and a communication apparatus using the same.

2. Description of the Related Art

As the electromechanical function parts using surface acoustic wave (SAW) have been noted with attention in the current of making the hardware high density because the acoustic velocity of wave is several kilometers/second, and the wave energy has properties to be concentrated on the surface of the propagation medium. Due to the development of inter-digital transducer (IDT) electrode and progress of the thin film preparing technique and surface processing technique, the SAW has been practically utilized for delay line for radar, band-pass filter for television receiver, etc. At present, the SAW is extensively used as RF and IF stage filters for receiving and transmitting circuits in radio-communication apparatus.

Conventionally, there are known transversal SAW filter and two kinds of longitudinally coupled mode coupled and transverse mode coupled type SAW filters. The transversal SAW filter has small group delay variation characteristic, but it has large insertion loss and large element size. On the other hand, the mode coupled type SAW filter presents steep attenuation characteristic, shows small insertion loss, and is small in element size, but its group delay variation characteristic is inferior to that of transversal type SAW filter. The longitudinally coupled mode type SAW filter is characterized by having relatively wide pass band, and the transverse mode type SAW filter is characterized by having very narrow pass band characteristic. In view of the above characteristics, as the RF filter for the mobile communication apparatus, the longitudinally coupled mode coupled type filter, and as the IF filter, the transverse mode coupled type SAW filter which is miniature in size and excellent in attenuation characteristic have been widely used.

Furthermore, balancing of semiconductor parts such as IC has advanced in recent years in order to reduce noise characteristics and balancing is also required for surface acoustic wave filters used for the RF stage. Furthermore, from the standpoint of impedance matching with ICs placed before and after, control over impedance of surface acoustic wave is required in recent years.

A surface acoustic wave filter used for the RF stage will be explained first as a first conventional technology.

A longitudinally coupled mode type surface acoustic wave filter having a conventional balanced type input/output terminals will be explained below.

FIG. A12 shows a configuration of a longitudinally coupled mode type surface acoustic wave filter having conventional balanced type input/output terminals. In FIG. A12, the surface acoustic wave filter is constructed by forming input IDT electrodes 3002a and 3002b, reflector electrodes 3003a and 3003b and output IDT electrode 3004 on a piezoelectric substrate 3001. The electrode fingers of the input IDT electrodes 3002a and 3002b on the same side are connected to an input terminal S and the other fingers are grounded. Furthermore, the upper electrode digit of the output IDT electrode 3004 is connected to one output terminal T1 and the lower electrode digit of the output IDT electrode 3004 is connected to the other output terminal T2. By adopting the above-described configuration, a surface acoustic wave filter having balanced type output terminals is obtained.

Then, a surface acoustic wave filter used for the IF stage will be explained as a second conventional technology.

A conventional transversal mode coupled type surface acoustic wave filter will be explained below.

FIG. B24 is a block diagram showing a transversal mode coupled resonator type surface acoustic wave filter according to a conventional technology. In FIG. B24, reference numeral 241 denotes a single crystal piezoelectric substrate and by forming an electrode pattern on this piezoelectric substrate 241, it is possible to excite surface acoustic wave. Reference numeral 242a denotes an IDT electrode formed on the piezoelectric substrate 241 and reflector electrodes 242b and 242c are placed on both sides of the IDT electrode forming thereby an energy-containment type surface acoustic wave resonator. Furthermore, an IDT electrode 243a, reflector electrodes 243b and 243c form a similar surface acoustic wave resonator on the piezoelectric substrate 241. These two resonators are placed close to each other and a surface acoustic wave filter is formed by generating acoustic coupling between these resonators.

In the surface acoustic wave filter configured as shown above, two kinds of surface acoustic wave mode frequencies to be excited on the piezoelectric substrate are determined according to the aperture length of the electrode fingers of the IDT electrodes and the distance between the two surface acoustic wave resonators placed close to each other and the passing bandwidth of the filter is determined.

However, the surface acoustic wave filters explained in the first and second conventional technologies are required to have impedance matching with IC elements in the preceding and following stages, and since the input/output impedance of the above-described conventional filters is dependent on the number of pairs of electrode fingers included in the IDT electrodes and aperture length closely associated with the filter characteristic, there is a problem that it is difficult to attain a desired filter characteristic and a desired impedance value simultaneously.

In view of the above-described problems, the present invention has as its object to provide an inter-digital transducer, a surface acoustic wave filter having an optimal balancing and controlling input/output impedance and communication apparatus using it.

In view of the above-described problems, it is another object of the present invention to provide an inter-digital transducer, a surface acoustic wave filter having desired input/output impedance and communication apparatus using it.

SUMMARY OF THE INVENTION

The 1st invention of the present invention is an inter-digital transducer comprising:

a piezoelectric substrate; and an IDT (inter-digital transducer) electrode having a pair of upper bus bar electrode and lower bus bar electrode placed facing each other on said piezoelectric substrate and a plurality of electrode fingers placed on said piezoelectric substrate each being led out from either said upper bus bar electrode or said lower bus bar electrode toward the other bus bar electrode, wherein said IDT electrode is constructed of a plurality of divisional IDT electrodes and connected to a balanced type terminal.

The 2nd invention of the present invention is the inter-digital transducer according to 1st invention, wherein at least two of said plurality of divisional IDT electrodes are equivalently connected in series and at least one of the remaining divisional IDT electrodes is connected in parallel with said at least two divisional IDT electrodes.

The 3rd invention of the present invention is the inter-digital transducer according to 2nd invention, wherein the ratio in the number of electrode fingers among said plurality of divisional IDT electrodes is adjusted beforehand so as to have a predetermined impedance value.

The 4th invention of the present invention is the inter-digital transducer according to 3rd invention, wherein said plurality of divisional IDT electrodes is placed in an same/reverse phase relationship so that charges of the divisional IDT electrodes do not cancel out each other.

The 5th invention of the present invention is the inter-digital transducer according to 4th invention, wherein said plurality of divisional IDT electrodes is constructed of first, second and third divisional IDT electrodes.

The 6th invention of the present invention is the inter-digital transducer according to 5th invention, wherein said second divisional IDT electrode is placed in same phase relationship between said first divisional IDT electrode and said third divisional IDT electrode, the part of said upper bus bar electrode corresponding to said first divisional IDT electrode and the part of said upper bus bar electrode corresponding to said second divisional IDT electrode are connected to one end of said balanced type terminal, and the part of said lower bus bar electrode corresponding to said second divisional IDT electrode and the part of said lower bus bar electrode corresponding to said third divisional IDT electrode are connected to the other end of said balanced type terminal.

The 7th invention of the present invention is the inter-digital transducer according to 6th invention, wherein said same phase relationship is a relationship between a pair of said mutually adjacent electrode fingers and that a pair of said mutually adjacent electrode fingers have an same phase relationship means (1) a connection relationship in which the pitch between said pair of mutually adjacent electrode fingers is $(m+1/2) \times \lambda$ (here, $m=0, 1, 2, 3, \ldots$, where $\lambda$ is a wavelength of an excited surface acoustic wave) and of those electrode fingers, one electrode digit is connected to said upper bus bar electrode and the other electrode digit is connected to the lower bus bar electrode, or (2) a connection relationship in which the pitch between said pair of mutually adjacent electrode fingers is $(m+1) \times \lambda$ and both electrode fingers are connected to said upper bus bar electrode, or (3) a connection relationship in which the pitch between said pair of mutually adjacent electrode fingers is $(m+1) \times \lambda$ and both electrode fingers are connected to said lower bus bar electrode.

The 8th invention of the present invention is the inter-digital transducer according to 7th invention, wherein substantially all adjacent pairs of electrode fingers of said plurality of electrode fingers have an same phase relationship and said substantially all of the plurality of electrode fingers is connected so that charges of the electrode fingers do not cancel out each other.

The 9th invention of the present invention is the inter-digital transducer according to 6th invention, wherein both the part of said lower bus bar electrode corresponding to said first divisional IDT electrode and the part of said upper bus bar electrode corresponding to said third divisional IDT electrode are grounded.

The 10th invention of the present invention is the inter-digital transducer according to 6th invention, wherein the part of said lower bus bar electrode corresponding to said first divisional IDT electrode is connected to the part of said upper bus bar electrode corresponding to said third divisional IDT electrode.

The 11th invention of the present invention is the inter-digital transducer according to 5th invention, wherein said second divisional IDT electrode is placed between said first divisional IDT electrode and said third divisional IDT electrode, the part of said lower bus bar electrode corresponding to said first divisional IDT electrode is connected to the part of said upper bus bar electrode corresponding to said second divisional IDT electrode, and the part of said lower bus bar electrode corresponding to said second divisional IDT electrode is connected to the part of said lower bus bar electrode corresponding to said third divisional IDT electrode.

The 12th invention of the present invention is the inter-digital transducer according to 11th invention, wherein adjacent electrode fingers of said first divisional IDT electrode and said second divisional IDT electrode have an reverse phase relationship, adjacent electrode fingers of said second divisional IDT electrode and said third divisional IDT electrode have an same phase relationship and said substantially all of the plurality of electrode fingers is connected so that respective charges do not cancel out each other.

The 13th invention of the present invention is the inter-digital transducer according to 12th invention, wherein that said pair of electrode fingers have an same phase relationship refers to a relationship when said pair of electrode fingers are mutually adjacent and (1) a connection relationship in which the pitch between said pair of mutually adjacent electrode fingers is $(m+1/2) \times \lambda$ (here, $m=0, 1, 2, 3, \ldots$, where $\lambda$ is a wavelength of an excited surface acoustic wave) and of those electrode fingers, one electrode digit is connected to said upper bus bar electrode and the other electrode digit is connected to the lower bus bar electrode, or (2) a connection relationship in which the pitch between said pair of mutually adjacent electrode fingers is $(m+1) \times \lambda$ and both electrode fingers are connected to said upper bus bar electrode, or (3) a connection relationship in which the pitch between said pair of mutually adjacent electrode fingers is $(m+1) \times \lambda$ and both electrode fingers are connected to said lower bus bar electrode, and that said pair of electrode fingers have an reverse phase relationship refers to a relationship when said pair of electrode fingers are mutually adjacent and (4) a connection relationship in which the pitch between said pair of mutually adjacent electrode fingers is $(m+1/2) \times \lambda$ (here, $m=0, 1, 2, 3, \ldots$, where $\lambda$ is a wavelength of an excited surface acoustic wave) and both electrode fingers are connected to said upper bus bar electrode, or (5) a connection relationship in which the pitch between said pair of mutually adjacent electrode fingers is (m+1/2)×λ and both electrode fingers are connected to said lower bus bar electrode, or (6) a connection relationship in which the pitch between said pair of mutually adjacent electrode fingers is (m+1)×λ and of those electrode fingers, one electrode digit is connected to said upper bus bar electrode and the other electrode digit is connected to the lower bus bar electrode.

The 14th invention of the present invention is the inter-digital transducer according to 11th invention, wherein both the upper bus bar electrode of said first divisional IDT electrode and the lower bus bar electrode of said third divisional IDT electrode are grounded.

The 15th invention of the present invention is the inter-digital transducer according to 11th invention, wherein the upper bus bar electrode of said first divisional IDT electrode is connected to the lower bus bar electrode of said third divisional IDT electrode.

The 16th invention of the present invention is the inter-digital transducer according to 4th invention, wherein said plurality of divisional IDT electrodes is constructed of first, second, third and fourth divisional IDT electrodes.

The 17th invention of the present invention is the inter-digital transducer according to 16th invention,
wherein said plurality of divisional IDT electrodes is placed in order of said first, second, third and fourth divisional IDT electrodes,
the part of said upper bus bar electrode corresponding to said first divisional IDT electrode, the part of said upper bus bar electrode corresponding to said third divisional IDT electrode and the part of said upper bus bar electrode corresponding to said fourth divisional IDT electrode are connected, and
the part of said lower bus bar electrode corresponding to said first divisional IDT electrode, the part of said lower bus bar electrode corresponding to said second divisional IDT electrode and the part of said lower bus bar electrode corresponding to said fourth divisional IDT electrode are connected.

The 18th invention of the present invention is the inter-digital transducer according to 17th invention,
wherein said same phase relationship refers to a relationship between a pair of said mutually adjacent electrode fingers and that said pair of mutually adjacent electrode fingers are in an same phase relationship means (1) a connection relationship in which the pitch between said pair of mutually adjacent electrode fingers is (m+1/2)×λ (here, m=0, 1, 2, 3, . . . , where λ is a wavelength of an excited surface acoustic wave) and of those electrode fingers, one electrode digit is connected to said upper bus bar electrode and the other electrode digit is connected to the lower bus bar electrode, or (2) a connection relationship in which the pitch between said pair of mutually adjacent electrode fingers is (m+1)×λ and both electrode fingers are connected to said upper bus bar electrode, or (3) a connection relationship in which the pitch between said pair of mutually adjacent electrode fingers is (m+1)×λ and both electrode fingers are connected to said lower bus bar electrode.

The 19th invention of the present invention is the inter-digital transducer according to 18th invention,
wherein of said plurality of electrode fingers, substantially all adjacent pairs of electrode fingers are in an same phase relationship and substantially all of the plurality of electrode fingers is connected so that respective charges do not cancel out each other.

The 20th invention of the present invention is the inter-digital transducer according to 17th invention,
wherein the part of said upper bus bar electrode corresponding to said second IDT electrode is grounded and the part of said lower bus bar electrode corresponding to said third IDT electrode is grounded.

The 21st invention of the present invention is the inter-digital transducer according to 17th invention,
wherein the part of said upper bus bar electrode corresponding to said second IDT electrode is connected to the part of said lower bus bar electrode corresponding to said third IDT electrode.

The 22nd invention of the present invention is the inter-digital transducer according to 21st invention,
wherein said "connection" means that, of adjacent electrode fingers of said second divisional IDT electrode and said third divisional IDT electrode, said second divisional IDT electrode digit is connected to both the part of said upper electrode corresponding to said second divisional IDT electrode and the part of said lower electrode corresponding to said third divisional IDT electrode, and
of adjacent electrode fingers said third divisional IDT electrode digit is connected to both the part of said lower electrode corresponding to said third divisional IDT electrode and the part of said upper electrode corresponding to said second divisional IDT electrode.

The 23rd invention of the present invention is a surface acoustic wave filter comprising:
a piezoelectric substrate;
a plurality of IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and
a plurality of reflector electrodes,
said surface acoustic wave filter being a longitudinally coupled mode type surface acoustic wave filter in which said plurality of IDT electrodes and said plurality of reflector electrodes are placed in the propagation directions of surface acoustic waves respectively,
wherein at least one of said plurality of IDT electrodes is the IDT electrode of the inter-digital transducer according to any one of 1st to 4th inventions and said piezoelectric substrate is the piezoelectric substrate of said inter-digital transducer.

The 24th invention of the present invention is a surface acoustic wave filter comprising:
a piezoelectric substrate;
three IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and
at least two reflector electrodes,
said surface acoustic wave filter being a longitudinally coupled mode type surface acoustic wave filter in which said three IDT electrodes and said at least two reflector electrodes are placed in the propagation directions of surface acoustic waves,
wherein at least one of said three IDT electrodes is the IDT electrode of the inter-digital transducer according to 5th invention, the part of said upper bus bar electrode of said IDT electrode of said inter-digital transducer corresponding to said first divisional IDT electrode and/or the part of said upper bus bar electrode of said IDT electrode corresponding to said second divisional IDT electrode are connected to one end of said balanced type terminal of said inter-digital transducer, the part of said lower bus bar electrode of said IDT electrode of said inter-digital transducer corresponding to said second divisional IDT electrode and/or the part of said lower bus bar electrode of said IDT electrode corresponding to said third divisional IDT electrode are connected to the other end of said balanced type terminal of said inter-digital transducer, and said piezoelectric substrate is the piezoelectric substrate of said inter-digital transducer.

The 25th invention of the present invention is the surface acoustic wave filter according to 24th invention, wherein said three IDT electrodes are first, second and third IDT electrodes, said second IDT electrode and said third IDT electrode are placed on both sides of said first IDT electrode respectively, said reflector electrodes are placed opposite said first IDT electrode of said second IDT electrode and opposite said first IDT electrode of said third IDT electrode respectively, and said first IDT electrode is the IDT electrode of said inter-digital transducer.

The 26th invention of the present invention is the surface acoustic wave filter according to 25th invention, wherein the upper bus bar electrode of said second IDT electrode is connected to an unbalanced type terminal and the lower bus bar electrode is grounded and the lower bus bar electrode of said third IDT electrode is connected to said unbalanced type terminal and the upper bus bar electrode is grounded.

The 27th invention of the present invention is the surface acoustic wave filter according to 24th invention, wherein a surface acoustic wave resonator is connected in series to and/or in parallel with at least two of said IDT electrodes.

The 28th invention of the present invention is a surface acoustic wave filter comprising:

a piezoelectric substrate;

a plurality of longitudinally coupled mode type surface acoustic wave filters having a plurality of IDT electrodes and a plurality of reflector electrodes placed on said piezoelectric substrate, wherein said plurality of surface acoustic wave filters are connected in multiple stages, of said plurality of surface acoustic wave filters, at least the surface acoustic wave filters on the input side and/or the surface acoustic wave filters on the output side are the surface acoustic wave filters according to 24th invention, and said piezoelectric substrates of at least the surface acoustic wave filters on the input side and/or the surface acoustic wave filters on the output side of said plurality of surface acoustic wave filters are the piezoelectric substrates of the surface acoustic wave filters according to 24th invention.

The 29th invention of the present invention is the surface acoustic wave filter according to 28th invention, wherein said plurality means 2, said plurality of acoustic wave filters are a first surface acoustic wave filter and a second surface acoustic wave filter, said first and second surface acoustic wave filters each comprise at least three IDT electrodes, said first and second surface acoustic wave filters are connected in cascade form, said first and second surface acoustic wave filters are connected at two points using at least two IDT electrodes, and the phase of one signal of said IDT electrode is opposite the phase of the other signal of said IDT electrode.

The 30th invention of the present invention is a surface acoustic wave filter comprising:

a piezoelectric substrate;

three IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and at least two reflector electrodes, said surface acoustic wave filter being a longitudinally coupled mode type surface acoustic wave filter in which said three IDT electrodes and said at least two reflector electrodes are placed in the propagation directions of surface acoustic waves respectively, wherein at least one of said three IDT electrodes is the IDT electrode of the inter-digital transducer according to 16th invention, the part of said upper bus bar electrode of said IDT electrode of said inter-digital transducer corresponding to said first divisional IDT electrode and/or the part of said upper bus bar electrode of said IDT electrode corresponding to said third divisional IDT electrode and/or the part of said upper bus bar electrode of said IDT electrode corresponding to said fourth divisional IDT electrode are connected to one end of said balanced type terminal of said inter-digital transducer, the part of said lower bus bar electrode of said IDT electrode of said inter-digital transducer corresponding to said first divisional IDT electrode and/or the part of said lower bus bar electrode of said IDT electrode corresponding to said second divisional IDT electrode and the part of said lower bus bar electrode of said IDT electrode corresponding to said fourth divisional IDT electrode are connected to the other end of said balanced type terminal, and said piezoelectric substrate is the piezoelectric substrate of said inter-digital transducer.

The 31st invention of the present invention is the surface acoustic wave filter according to 30th invention, wherein said three IDT electrodes are first, second and third IDT electrodes, said second IDT electrode and said third IDT electrode are placed on both sides of said first IDT electrode respectively, said reflector electrodes are placed opposite said first IDT electrode of said second IDT electrode and opposite said first IDT electrode of said third IDT electrode respectively, and said first IDT electrode is the IDT electrode of said inter-digital transducer.

The 32nd invention of the present invention is the surface acoustic wave filter according to 31st invention, wherein the upper bus bar electrode of said second IDT electrode is connected to an unbalanced type terminal and the lower bus bar electrode is grounded and the lower bus bar electrode of said third IDT electrode is connected to said unbalanced type terminal and the upper bus bar electrode is grounded.

The 33rd invention of the present invention is the surface acoustic wave filter according to 30th invention, wherein a surface acoustic wave resonator is connected in series to and/or in parallel with at least two of said IDT electrodes.

The 34th invention of the present invention is a surface acoustic wave filter comprising:

a piezoelectric substrate;

a plurality of longitudinally coupled mode type surface acoustic wave filters having a plurality of IDT electrodes and a plurality of reflector electrodes placed on said piezoelectric substrate, wherein said plurality of surface acoustic wave filters are connected in multiple stages, of said plurality of surface acoustic wave filters, at least the surface acoustic wave filters on the input side and/or the surface acoustic wave filters on the output side are the surface acoustic wave filters according to 30th invention, and said piezoelectric substrates of at least the surface acoustic wave filters on the input side and/or the surface acoustic wave filters on the output side of said plurality of surface acoustic wave filters are the piezoelectric substrates of the surface acoustic wave filters according to 30th invention.

The 35th invention of the present invention is the surface acoustic wave filter according to 34th invention, wherein said plurality means two, said plurality of acoustic wave filters are a first surface acoustic wave filter and a second surface acoustic wave filter, said first and second surface acoustic wave filters each comprise at least three IDT electrodes, said first and second surface acoustic wave filters are connected in cascade form, said first and second surface acoustic wave filters are connected at two points using at least two IDT electrodes, and the phase of one signal of said IDT electrode is opposite the phase of the other signal of said IDT electrode.

The 36th invention of the present invention is a surface acoustic wave filter comprising:

a piezoelectric substrate;

two IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and a plurality of reflector electrodes, said surface acoustic wave filter being a longitudinally coupled mode type surface acoustic wave filter in which said two IDT electrodes and said plurality of reflector electrodes are placed in the propagation directions of surface acoustic waves respectively, wherein at least one of said two IDT electrodes is the IDT electrode of the inter-digital transducer according to 5th invention, the part of said upper bus bar electrode of said IDT electrode of said inter-digital transducer corresponding to said first divisional IDT electrode and/or the part of said upper bus bar electrode of said IDT electrode corresponding to said second divisional IDT electrode are connected to one end of said balanced type terminal of said inter-digital transducer, the part of said lower bus bar electrode of said IDT electrode of said inter-digital transducer corresponding to said second divisional IDT electrode and/or the part of said lower bus bar electrode of said IDT electrode corresponding to said third divisional IDT electrode are connected to the other end of said balanced type terminal, and said piezoelectric substrate is the piezoelectric substrate of said inter-digital transducer.

The 37th invention of the present invention is the surface acoustic wave filter according to 36th invention, wherein said two IDT electrodes are a first and second IDT electrodes, said second IDT electrode is placed on one end of said first IDT electrode, said reflector electrodes are placed opposite said second IDT electrode of said first IDT electrode and opposite said first IDT electrode of said second IDT electrode respectively, and said first IDT electrode is the IDT electrode of said inter-digital transducer.

The 38th invention of the present invention is a surface acoustic wave filter comprising:

a piezoelectric substrate;

five IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and at least two reflector electrodes, said surface acoustic wave filter being a longitudinally coupled mode type surface acoustic wave filter in which said five IDT electrodes and said plurality of reflector electrodes are placed in the propagation directions of surface acoustic waves respectively, wherein at least one of said five IDT electrodes is the IDT electrode of the inter-digital transducer according to 5th invention, the part of said upper bus bar electrode of said IDT electrode of said inter-digital transducer corresponding to said first divisional IDT electrode and/or the part of said upper bus bar electrode of said IDT electrode corresponding to said second divisional IDT electrode are connected to one end of a balanced type terminal, the part of said lower bus bar electrode of said IDT electrode of said inter-digital transducer corresponding to said second divisional IDT electrode and/or the part of said lower bus bar electrode of said IDT electrode corresponding to said third divisional IDT electrode are connected to the other end of said balanced type terminal, and said piezoelectric substrate is the piezoelectric substrate of said inter-digital transducer.

The 39th invention of the present invention is a communication apparatus comprising:

a transmission circuit that outputs transmission waves; and a reception circuit that receives reception waves, wherein the surface acoustic wave filter used for said transmission circuit and/or said reception circuit is the inter-digital transducer according to 1st invention.

The 40th invention of the present invention is a communication apparatus comprising:

a transmission circuit that outputs transmission waves; and a reception circuit that receives reception waves, wherein the surface acoustic wave filter used for said transmission circuit and/or said reception circuit is the surface acoustic wave filter according to 23rd invention.

Figure 1:
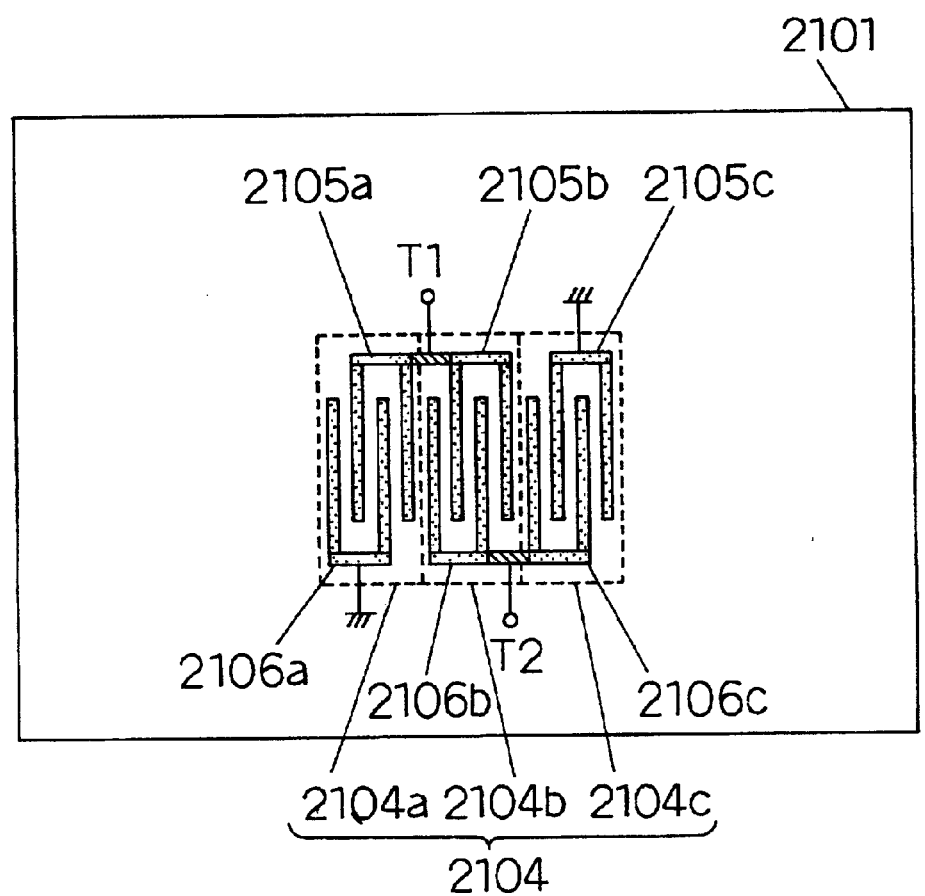
FIG. 1 is a block diagram of an inter-digital transducer according to Embodiment 1 of the present invention.

FIG. A1 is a block diagram of a surface acoustic wave filter according to Embodiment A1 of the present invention;

FIG. A2 illustrates a capacitance equivalent circuit of the surface acoustic wave filter according to Embodiment A1 of the present invention;

FIG. A3 is a block diagram of a surface acoustic wave filter having a pad electrode according to Embodiment A1 of the present invention;

FIG. A4 is another block diagram of the surface acoustic wave filter according to Embodiment A1 of the present invention;

FIG. A5 is a block diagram of a surface acoustic wave filter according to Embodiment A2 of the present invention;

FIG. A6 is a block diagram of a surface acoustic wave filter according to Embodiment A3 of the present invention;

FIG. A7A is a block diagram of a conventional surface acoustic wave filter;

FIG. A7B is a block diagram of a surface acoustic wave filter according to Embodiment A3 of the present invention;

FIG. A8 is another block diagram of the surface acoustic wave filter according to Embodiment A3 of the present invention;

FIG. A9 is another block diagram of the surface acoustic wave filter according to Embodiment A3 of the present invention;

FIG. A10 is another block diagram of the surface acoustic wave filter according to Embodiment A1 of the present invention;

FIG. A11 is another block diagram of the surface acoustic wave filter according to Embodiment A1 of the present invention;

FIG. A12 is a block diagram of a conventional surface acoustic wave filter;

FIG. A13 is a block diagram of a surface acoustic wave filter according to Embodiment A4 of the present invention;

FIG. A14 illustrates a capacitance equivalent circuit of the surface acoustic wave filter according to Embodiment A4 of the present invention;

FIG. A15 is a block diagram of a surface acoustic wave filter according to Embodiment A5 of the present invention;

FIG. A16 illustrates a capacitance equivalent circuit of the surface acoustic wave filter according to Embodiment A5 of the present invention;

FIG. A17 illustrates a configuration of a communication apparatus according to Embodiment A6 of the present invention;

FIG. B1 is a block diagram showing a surface acoustic wave filter according to Embodiment B1 of the present invention;

FIG. B2 is a block diagram showing another example of the surface acoustic wave filter according to Embodiment B1 of the present invention;

FIG. B3 is a block diagram showing a multi-stage surface acoustic wave filter according to Embodiment B1 of the present invention;

FIG. B4 is a block diagram showing another example of the multi-stage surface acoustic wave filter according to Embodiment B1 of the present invention;

FIG. B5 is a block diagram showing a surface acoustic wave filter according to Embodiment B2 of the present invention;

FIG. B6 is a block diagram showing another example of the surface acoustic wave filter according to Embodiment B2 of the present invention;

FIG. B7 is a block diagram showing another example of the surface acoustic wave filter according to Embodiment B2 of the present invention;

FIG. B8 is a block diagram showing the multi-stage surface acoustic wave filter according to Embodiment B2 of the present invention;

FIG. B9 is a block diagram showing another example of the multi-stage surface acoustic wave filter according to Embodiment B2 of the present invention;

FIG. B10 is a block diagram showing a surface acoustic wave filter according to Embodiment B3 of the present invention;

FIGS. B11A and B11B are a surface acoustic wave filter and an excitation mode distribution diagram illustrating an operation of the surface acoustic wave filter according to Embodiment B3 of the present invention;

FIG. B12 illustrates a resonance frequency characteristic diagram in each mode with respect to a value of W specified with wavelength $\lambda$ of a surface acoustic wave when W1=W2=W3 in Embodiment B3 of the present invention;

FIG. B13 is a typical measured diagram showing a comparison example of a passing characteristic of the surface acoustic wave filter according to Embodiment B3 of the present invention;

FIG. B14 is a measured diagram of a resonance mode frequency difference with respect to W2/W1 according to Embodiment B3 of the present invention;

FIG. B15 is a measured diagram showing a passing characteristic of the surface acoustic wave filter according to Embodiment B3 of the present invention;

FIG. B16 is a block diagram showing another example of the surface acoustic wave filter according to Embodiment B3 of the present invention;

FIG. B17 is a block diagram showing a surface acoustic wave filter according to Embodiment B4 of the present invention;

FIG. B18 is a block diagram showing a surface acoustic wave filter according to Embodiment B5 of the present invention;

FIG. B19 illustrates a capacitance equivalent circuit of the surface acoustic wave filter according to Embodiment B5 of the present invention;

FIG. B20 is a block diagram showing another example of the surface acoustic wave filter according to Embodiment B5 of the present invention;

FIG. B21 is a block diagram showing a surface acoustic wave filter according to Embodiment B6 of the present invention;

FIG. B22 is a block diagram showing a surface acoustic wave filter according to Embodiment B7 of the present invention;

FIG. B23 is a block diagram showing a surface acoustic wave filter according to Embodiment B8 of the present invention; and FIG. B24 illustrates an electrode pattern of a conventional surface acoustic wave filter.

DESCRIPTION OF SYMBOLS

2101 PIEZOELECTRIC SUBSTRATE
2102a, 2102b INPUT IDT ELECTRODE
2103a, 2103b REFLECTOR ELECTRODE
2104 OUTPUT IDT ELECTRODE
2104a FIRST DIVISIONAL IDT ELECTRODE
2104b SECOND DIVISIONAL IDT ELECTRODE
2104c THIRD DIVISIONAL IDT ELECTRODE
2105a, 2105b, 2105c UPPER ELECTRODE
2106a, 2106b, 2106c LOWER ELECTRODE
2301 INPUT SIDE PAD ELECTRODE
2303a FIRST OUTPUT SIDE PAD ELECTRODE
2303b SECOND OUTPUT SIDE PAD ELECTRODE
2302a, 2302b ROUTING WIRING
2501 PIEZOELECTRIC SUBSTRATE
2502a, 2502b INPUT IDT ELECTRODE
2503a, 2503b REFLECTOR ELECTRODE
2504 OUTPUT IDT ELECTRODE
2504a, 2504b, 2504c DIVISIONAL IDT ELECTRODE
2505a, 2505b, 2505c UPPER ELECTRODE
2506a, 2506b, 2506c LOWER ELECTRODE
2601 PIEZOELECTRIC SUBSTRATE
2602a, 2602b REFLECTOR ELECTRODE
2603 IDT ELECTRODE
2604 SURFACE ACOUSTIC WAVE RESONATOR
2605a, 2605b REFLECTOR ELECTRODE
2606 IDT ELECTRODE
2607 SURFACE ACOUSTIC WAVE RESONATOR
2801 SURFACE ACOUSTIC WAVE RESONATOR
2802 FIRST-STAGE SURFACE ACOUSTIC WAVE FILTER
2803 INPUT IDT ELECTRODE
2804a, 2804b REFLECTOR ELECTRODE
2805a, 2805b OUTPUT IDT ELECTRODE
SECOND-STAGE SURFACE ACOUSTIC WAVE FILTER
PIEZOELECTRIC SUBSTRATE
FIRST-STAGE SURFACE ACOUSTIC WAVE FILTER
INPUT IDT ELECTRODE
2904a, 2904b REFLECTOR ELECTRODE
2905a, 2905b OUTPUT IDT ELECTRODE
2906 SECOND-STAGE SURFACE ACOUSTIC WAVE FILTER
2502a, 2502b INPUT IDT ELECTRODE
2504 OUTPUT IDT ELECTRODE
11, 31, 41, 51, 101 SINGLE CRYSTAL PIEZOELECTRIC SUBSTRATE
12a, 13a, 52a, 54a IDT ELECTRODE
12b, 12c, 13b, 13c REFLECTOR
14 FIRST BUS BAR ELECTRODE
14a THIRD BUS BAR ELECTRODE
15 SECOND BUS BAR ELECTRODE
15a FOURTH BUS BAR ELECTRODE
16a, 16b, 17a, 17b ROUTING ELECTRODE DIGIT
103a CYCLIC STRUCTURE STRIP LINE ELECTRODE ARRAY
166, 228 REACTANCE ELEMENT
184a FIRST DIVISIONAL IDT ELECTRODE
184b SECOND DIVISIONAL IDT ELECTRODE
184c THIRD DIVISIONAL IDT ELECTRODE

DESCRIPTION OF THE PREFERRED EMBODIMENTS

With reference now to the attached drawings, embodiments of the present invention will be explained below.

(Embodiment 1)

First, only an outline of the inter-digital transducer (hereinafter referred to as "IDT electrode") according to Embodiment 1 of the present invention will be explained.

Details thereof will be explained in respective embodiments of group A and group B below.

FIG. 1 shows an IDT electrode 2104 according to Embodiment 1 of the present invention. The IDT electrode 2104 is placed on a piezoelectric substrate 2101 and is an electrode that converts a surface acoustic wave propagating on the piezoelectric substrate to an electric signal and converts an electric signal to a surface acoustic wave propagating on the piezoelectric substrate.

The IDT electrode 2104 is divided into three portions, first, second and third divisional IDT electrodes 2104a, 2104b and 2104c and constructed by connecting the three groups of divisional IDT electrodes 2104a, 2104b and 2104c.

Here, the first divisional IDT electrode 2104a, second divisional IDT electrode 2104b and third divisional IDT electrode 2104c are placed in such a way as to be same phase with one another. Furthermore, upper electrodes 2105a and 2105b of the first and second divisional IDT electrodes 2104a and 2104b are electrically connected and also connected to one end T1 of a balanced type output terminal. Furthermore, lower electrodes 2106b and 2106c of the second and third divisional IDT electrodes 2104b and 2104c are electrically connected and also connected to the other end T2 of the balanced type output terminal. Furthermore, the lower electrode 2106a of the first divisional IDT electrode 2104a and the upper electrode 2105c of the third divisional IDT electrode 2104c are grounded.

Then, an operation of this embodiment will be explained.

The IDT electrode 2104 converts a surface acoustic wave propagating on the piezoelectric substrate to an electric signal and outputs to the balanced type output terminals T1 and T2.

On the contrary, it is also possible to use the balanced type output terminals T1 and T2 as input terminals. In this case, the IDT electrode 2104 converts an electric signal input from T1 or T2 to a surface acoustic wave propagating on the piezoelectric substrate 101.

Thus, the IDT electrode 2104 of this embodiment can convert an electric signal to a surface acoustic wave and convert a surface acoustic wave to an electric signal.

This embodiment is characterized in that when the IDT electrode 2104 of this embodiment is divided into the first divisional IDT electrode 2104a, second divisional IDT electrode 2104b and third divisional IDT electrode 2104c and the ratio of the number of electrode fingers between the first, second and third divisional IDT electrodes 2104a, 2104b and 2104c is changed, impedance values at T1 and T2 change, whereas the frequency characteristic of the IDT electrode 2104 does not mostly change.

Therefore, when a predetermined frequency characteristic is obtained by adjusting the number and width of the electrode fingers and center distance between the electrode fingers of the IDT electrode 2104, it is possible to change only impedance without substantially changing the acquired predetermined frequency characteristic by simply adjusting the ratio of the number of electrode fingers between the first, second and third divisional IDT electrodes 2104a, 2104b and 2104c of the IDT electrode 2104 while fixing the number and width of the electrode fingers and center distance between the mutually adjacent electrode fingers, etc. Thus, the IDT electrode 2104 of this embodiment has an excellent feature of being capable of controlling impedance.

Figure 2:
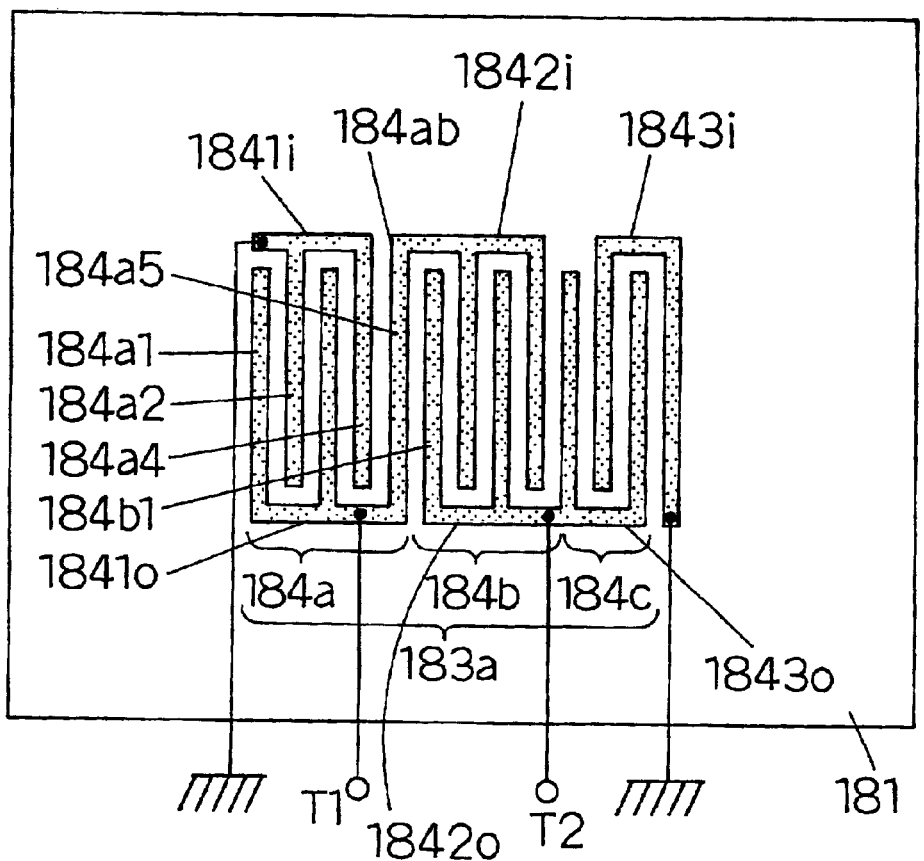
FIG. 2 is another block diagram of the inter-digital transducer according to Embodiment 1 of the present invention.

On the other hand, FIG. 2 illustrates an IDT electrode 183a which differs from the IDT electrode 2104 in the layout of electrode fingers, etc. As in the case of the IDT electrode 2104 in FIG. 1, the IDT electrode 183a is divided into three portions of first, second, third divisional IDT electrodes 184a, 184b and 184c and is constructed by connecting the three groups of the divisional IDT electrodes 184a, 184b and 184c.

Therefore, the IDT electrode 183a in FIG. 2 also has an excellent feature of being capable of controlling impedance in the same way as the IDT electrode 2104 in FIG. 1.

Then, of the embodiments of the present invention, the embodiments of group A will be explained below.

(Embodiment A1)

First, Embodiment A1 of the present invention will be explained.

FIG. A1 is a schematic view of a surface acoustic wave filter according to Embodiment A1.

In FIG. A1, reference numeral 2101 denotes a piezoelectric substrate and it is possible to excite a surface acoustic wave by constructing electrode patterns crossing in strip-line form with a cyclic structure on this piezoelectric substrate 2101. A longitudinally coupled mode type surface acoustic wave filter comprising input IDT electrodes 2102a and 2102b, reflector electrodes 2103a and 2103b and an output IDT electrode 2104 is formed on the piezoelectric substrate 2101.

Each IDT electrode consists of a pair of mutually facing comb-like electrodes and each comb-like electrode consists of electrode fingers and electrodes (upper electrode and lower electrode) from which these electrode fingers are led out.

In the above-described surface acoustic wave filter, the upper electrodes of the input IDT electrodes 2102a and 2102b are connected to an input terminal S and the lower electrodes of the input IDT electrodes 2102a and 2102b are grounded.

Furthermore, the output IDT electrode 2104 is divided into three portions, first, second and third divisional IDT electrodes 2104a, 2104b and 2104c and constructed by connecting the three groups of divisional IDT electrodes 2104a, 2104b and 2104c. Here, the first divisional IDT electrode 2104a, second divisional IDT electrode 2104b and third divisional IDT electrode 2104c are placed in such a way as to be same phase with one another. Furthermore, upper electrodes 2105a and 2105b of the first and second divisional IDT electrodes 2104a and 2104b are electrically connected and also connected to one end T1 of a balanced type output terminal. Furthermore, lower electrodes 2106b and 2106c of the second and third divisional IDT electrodes 2104b and 2104c are electrically connected and also connected to the other end T2 of the balanced type output terminal. Furthermore, the lower electrode 2106a of the first divisional IDT electrodes 2104a and the lower electrode 2106c of the third divisional IDT electrodes 2104c are grounded.

Here, the above-described same phase will be explained.

First, a structural positional relationship between the two adjacent electrode fingers (that is, a pair of adjacent electrode fingers) will be explained.

That is, that the two adjacent electrode fingers are in an same phase relationship means that the two adjacent electrode fingers are in such a connection relationship that one of the two electrode fingers is connected to the upper electrode and extends downward and the other electrode digit is connected to the lower electrode and extends upward. Here, suppose that the charge of the upper electrode is different from that of the lower electrode. Also suppose that the pitch between the two adjacent electrode fingers (center distance) is $1/2 \times \lambda$. Here, the above-described pitch between the electrode fingers may also be $(m+1/2) \times \lambda$.

On the other hand, if the above-described pitch between the electrode fingers is $(m+1/2) \times \lambda$, then the above-described same phase relationship is completely opposite the same phase relationship described above. That is, that the two adjacent electrode fingers are in an same phase relationship means that the pitch between the electrode fingers is $(m+1) \times \lambda$ and both electrode fingers are connected to the upper electrode or that the pitch between the electrode fingers is $(m+1) \times \lambda$ and both electrode fingers are connected to the lower electrode. Here, $\lambda$ denotes the wavelength of an excited surface acoustic wave and $m=0, 1, 2, 3, \ldots$ As described above, the upper electrodes 2105a and 2105b of the first and second divisional IDT electrodes 2104a and 2104b are electrically connected and also connected to one end T1 of the balanced type output terminal and the lower electrodes 2106b and 2106c of the second and third divisional IDT electrodes 2104b and 2104c are electrically connected and also connected to the other end T2 of the balanced type output terminal. In this way, since the one end T1 and the other end T2 of the balanced type output terminal are connected to the upper and lower sides opposite each other, in the case where both of the above-described two adjacent electrode fingers in an same phase relationship are led out from the upper electrode or lower electrode both of which are connected to the balanced type terminals, their respective positive and negative charges are reversed. Furthermore, in the case where either of the above-described two adjacent electrode fingers in an same phase relationship is led out from the upper electrode or lower electrode connected to the balanced type terminal and the other is led out from the grounded upper electrode or lower electrode, the charge of the electrode digit led out from the grounded upper electrode or lower electrode does not cancel out the charge of the electrode digit led out from the upper electrode or lower electrode connected to the balanced type terminal. Therefore, in either case, these two electrode fingers can excite surface acoustic waves in such a way that surface acoustic waves do not cancel out each other.

The same also applies to the case of an IDT electrode with a pair of balanced type terminals such as the IDT electrode 183a in FIG. B18 of Embodiment B5 connected to either the upper side or lower side of the IDT electrode.

Furthermore, all electrode fingers are assumed to be substantially same phase, and this means that some electrode fingers may be placed at different locations due to withdrawing, etc. and that any configuration is acceptable if the electrode fingers as a whole at least allow surface acoustic waves to be excited.

This applies not only to Embodiment A1 but also to Embodiment 1 and Embodiment A1 and subsequent embodiments and also applies to the IDT electrode such as the IDT electrode 183a in FIG. B18 of Embodiment B5 in particular.

Furthermore, this embodiment has such a configuration that the adjacent electrode fingers of the input IDT electrode 2102a and divisional IDT electrode 2104a are led out from the lower electrodes in the same direction and the adjacent electrode fingers of the input IDT electrode 2102b and divisional IDT electrode 2104c are led out from the upper electrodes in the same direction, but this positional relationship may change depending on the number of electrode fingers, etc. and any positional relationship different from this positional relationship may also be adopted if it at least allows surface acoustic waves to be excited without being cancelled out.

Here, the input IDT electrodes 2102a and 2102b and output IDT electrode 2104 are examples of the IDT electrodes of the present invention, and the respective upper electrodes and lower electrodes of input IDT electrodes 2102a and 2102b and output IDT electrode 2104 are examples of the upper bus bar electrodes and lower bus bar electrodes of the present invention.

An operation of the surface acoustic wave filter of Embodiment A1 configured as shown above will be explained below.

FIG. A2 is a capacitance equivalent circuit diagram of Embodiment A1. Reference characters Ca, Cb and Cc denote capacitances of the first, second and third divisional IDT electrodes 2104a, 2104b and 2104c respectively and a total capacitance of Ca, Cb and Cc constitutes a total capacitance Cout of the output IDT electrode 2104 and is expressed in the following expression. That is, the first divisional IDT electrode 2104a and third divisional IDT electrode 2104c are connected in series, while the second divisional IDT electrode 2104b is connected in parallel with the first divisional IDT electrode 2104a and third divisional IDT electrode 2104c.

[Mathematical Expression 1]

$$Cout=(Ca \cdot Cb + Cb \cdot Cc + Cc \cdot Ca)/(Ca+Cc)$$

where, the number of pairs of electrode fingers included in the output IDT electrode 2104 is N, the capacitance before being divided is C0, the numbers of pairs of electrode fingers of the first, second and third divisional IDT electrodes 2104a, 2104b and 2104c are Na, Nb and Nc. Then, the following expression is set up.

[Mathematical Expression 1]

$$N = Na + Nb + Nc$$

$$C0 = Ca + Cb + Cc$$

$$Ca = (Ca+Cb+Cc) \times Na/(Na+Nb+Nc) = C0 \times Na/(Na+Nb+Nc)$$

$$Cb = (Ca+Cb+Cc) \times Nb/(Na+Nb+Nc) = C0 \times Nb/(Na+Nb+Nc)$$

$$Cc = (Ca+Cb+Cc) \times Nc/(Na+Nb+Nc) = C0 \times Nc/(Na+Nb+Nc)$$

Therefore, total capacitance Cout after the division is as follows.

[Mathematical Expression 3]

$$Cout = C0 \times (Na \cdot Nb + Nb \cdot Nc + Nc \cdot Na)/\{(Na+Nc) \times N\}$$

Since the capacitances of the IDT electrodes are dominant in impedance of the surface acoustic wave filter, it is possible to control the total capacitance Cout of the input IDT electrode 2104 and control impedance by changing the number of pairs Na, Nb and Nc of the divisional IDT electrodes 2104a, 2104b and 2104c.

For example, impedance can be controlled as follows. First, the number of pairs N and pitch of electrode fingers, etc. of the input IDT electrode 2104 are determined in the design stage to obtain a desired filter characteristic. Then, while the numbers of pairs N of the input IDT electrode 2104 is fixed, the numbers of pairs Na, Nb and Nc of the divisional IDT electrodes 2104a, 2104b and 2104c are changed. In this way, it is possible to obtain impedance of the surface acoustic wave filter from Mathematical expression 3. Therefore, it is possible to determine Na, Nb and Nc using Mathematical expression 3 so that the desired impedance is obtained. Thus, it is known that the filter characteristic of the surface acoustic wave filter does not change significantly when the ratio between Na, Nb and Nc is changed while N is fixed. Thus, using the surface acoustic wave filter of this embodiment makes it possible to obtain a desired filter characteristic and control impedance so that desired impedance can be obtained.

For example, suppose the impedance of the output IDT electrode before the division is Z0 and capacitance is C0. If the numbers of pairs of the divisional IDT electrodes 2104a, 2104b and 2104c are equal, that is, Na=Nb=Nc, Cout becomes 1/2×C0, that is, Cout is reduced by half compared to Cout before the division. Furthermore, as is apparent from mathematical expression 3, as the number of pairs Nb of the second divisional IDT electrode becomes smaller, Cout decreases and when the number of pairs Nb of the second divisional IDT electrode is reduced to zero, Cout becomes 1/4×C0. That is, impedance is almost quadruple that before the division.

In this way, a longitudinally coupled mode type surface acoustic wave filter is obtained whose impedance is controllable by changing the ratio of the number of pairs among the divisional IDT electrodes.

Furthermore, mounting a surface acoustic wave filter requires a pad electrode so that it can be connected to input terminals or output terminals. FIG. A3 shows a schematic view of a surface acoustic wave filter having a pad electrode. A pad electrode 2301 on the input side is connected to the input IDT electrodes 2102a and 2102b via routing electrodes 2302a and 2302b. Furthermore, first and second pad electrode 2303a and 2303b on the output side are connected to the upper side and lower side of the output electrode. The first output side pad electrode 2303a is connected to the upper bus bar electrode 2105a of the first divisional IDT electrode 2104a and the upper bus bar electrode 2105b of the second divisional IDT electrode and the second output side pad electrode 2303b is connected to the lower bus bar electrode 2106b of the second divisional IDT electrode 2104b and the lower bus bar electrode 2106c of the third divisional IDT electrode 2104c. Thus, by preserving the structural symmetry of the balanced type terminals T1 and T2 on the output side, it is possible to implement a surface acoustic wave filter with an excellent balance characteristic.

By the way, connecting with the respective pad electrodes can be performed using wires or directly through face down mounting.

In FIG. A1, the divisional IDT electrode 2104a and divisional IDT electrode 2104c have the same number of electrode fingers and the adjacent electrode fingers of the input IDT electrode 2102a and divisional IDT electrode 2104a are led out from the lower bus bar electrodes in the same direction and the adjacent electrode fingers of the input IDT electrode 2102b and divisional IDT electrode 2104c are led out from the upper bus bar electrodes in the same direction. However, as shown in FIG. A4, even if the adjacent electrode fingers of the input IDT electrode 2102a and divisional IDT electrode 2104a are led out from their respective bus bar electrodes in directions crossing each other and the adjacent electrode fingers of the input IDT electrode 2102b and divisional IDT electrode 2104c are led out from their respective bus bar electrodes in directions crossing each other, the characteristic as the surface acoustic wave filter can be obtained likewise as far as those electrodes are in such a positional relationship that surface acoustic waves are excited without canceling out each other.

If the first and third divisional IDT electrodes 2104a and 2104c have the same number of divided pairs and the divisional IDT electrode 2104b has the same number of upper and lower electrode fingers, the same number of IDT electrode digit pairs are connected to both balanced type output terminals. Adopting such a configuration provides a surface acoustic wave filter with excellent balancing.

This embodiment has described the case where the respective upper bus bar electrodes of the input IDT electrodes 2102a and 2102b are connected to the input terminal S and the respective lower bus bar electrodes of the input IDT electrodes 2102a and 2102b are grounded, but this embodiment is not limited to this. As shown in FIG. A10, the upper bus bar electrode of the input IDT electrode 2102a and the lower bus bar electrode of the input IDT electrode 2102b may also be connected to the input terminal S and the lower bus bar electrode of the input IDT electrode 2102a and the upper bus bar electrode of the input IDT electrode 2102b may be grounded. Or on the contrary, the lower bus bar electrode of the input IDT electrode 2102a and the upper bus bar electrode of the input IDT electrode 2102b may also be connected to the input terminal S and the upper bus bar electrode of the input IDT electrode 2102a and the lower bus bar electrode of the input IDT electrode 2102b may be grounded. That is, the signal route from the input terminal S is connected structurally upside down. Furthermore, the electrode fingers of the input IDT electrodes 2102a and 2102b are placed in such a way that surface acoustic waves do not cancel out each other.

Furthermore, in FIG. A10, the adjacent electrode fingers of the input IDT electrode 2102a and divisional IDT electrode 2104a are led out from the upper bus bar electrode and lower bus bar electrode in directions crossing each other respectively and the adjacent elect rode fingers of the input IDT electrode 2102b and divisional IDT electrode 2104c are led out from the upper bus bar electrode in the same directions, but this positional relationship varies depending on the number of electrode fingers, etc. and any positional relationship different from this positional relationship may also be used if it at least allows surface acoustic waves to be excited without canceling out each other.

Adopting such a configuration suppresses the deterioration of balancing due to spatial coupling between wiring lead out from the input IDT electrodes 2102a and 2102b connected to the input terminal S and wiring lead out from the IDT electrode 2104 connected to the output terminals T1 and T2 making it possible to obtain a surface acoustic filter having optimal balancing.

Moreover, this embodiment has explained that the divisional IDT electrodes are on the output side, but the divisional IDT electrodes can also be on the input side. In this case the divisional IDT electrodes can control impedance on the input side.

Furthermore, this embodiment has explained that the output IDT electrode 2104 is divided into divisional IDT electrodes 2104a, 2104b and 2104c, but it is also possible to divide the input IDT electrode 2102a and/or input IDT electrode 2102b into divisional IDT electrodes to form a balanced type terminal configuration. In this case, both the input side and output side constitute balanced type terminals, making it possible to control impedance.

Furthermore, this embodiment has explained that the output IDT electrode 2104 is divided into three portions, divisional IDT electrodes 2104a, 2104b and 2104c, but it is also possible to divide the output IDT electrode 2104 into 4, 5 or more divisional IDT electrodes.

When the output IDT electrode 2104 is divided into two divisional IDT electrodes, that is, when the number of electrode fingers of the divisional IDT electrode 2104b is zero, it is possible to connect the upper electrode to the balanced type terminal T1 and connect the lower electrode to the balanced type terminal T2 and secure isolation between the balanced type terminals. That is, FIG. A11 shows a case where the output IDT electrode 2104 is divided into two divisional IDT electrodes. In FIG. A11, by adopting a configuration whereby the upper electrode of the input IDT electrode 2102a and the lower electrode of the input IDT electrode 2102b are connected to the unbalance type terminal S, it is possible to suppress deterioration of balancing due to spatial coupling between lead wiring of the input IDT electrode 2102a and T1 and between lead wiring of the input IDT electrode 2102b and T2.

This embodiment has described the case where the surface acoustic wave filter comprises a total of 3 IDT electrodes, that is, one output IDT electrode 2104 and two input IDT electrodes 2102a and 2102b, but this embodiment is not limited to this. The surface acoustic wave filter of this embodiment may also be constructed of two, five, seven or any number of IDT electrodes.

This embodiment has described the case where the upper electrodes 2105a and 2105b of the first and second divisional IDT electrodes 2104a and 2104b are electrically connected, but these upper electrodes may also be united into one common upper electrode. On the other hand, the lower electrodes 2106b and 2106c of the second and third divisional IDT electrodes 2104b and 2104c are electrically connected, but these lower electrodes may also be united into one common lower electrode. Moreover, as shown in FIG. A3, when the pad electrodes 2303a and 2303b are used, it is also possible to electrically connect the upper electrodes 2105a and 2105b of the first and second divisional IDT electrodes 2104a and 2104b via the pad electrode 2303a instead of directly electrically connecting them. Likewise, it is also possible to electrically connect the lower electrodes 2106b and 2106c of the second and third divisional IDT electrodes 2104b and 2104c via the pad electrode 2303b instead of directly electrically connecting them.

Furthermore, with regard to the method of grounding the upper electrode 2105c of the divisional IDT electrode 2104c and the lower electrode 2106a of the divisional IDT electrode 2104a, it is also possible to provide independent grounding apart from the grounding electrodes of the input IDT electrodes 2102a and 2102b or instead of actually grounding the upper electrode 2105c of the divisional IDT electrode 2104c and the lower electrode 2106a of the divisional IDT electrode 2104a, it is also possible to electrically connect them thereby providing virtual grounding. The case of virtual grounding is equivalent to a configuration of the capacitance equivalent circuit in FIG. A2 without grounding. In these cases, it is possible to suppress deterioration of the characteristic due to routing of the signal from GND.

Furthermore, since this embodiment adopts an unbalanced type for the input side and a balanced type for the output side, the surface acoustic wave filter of this embodiment also assumes the role of conversion between balance and unbalance. That is, the surface acoustic wave filter of this embodiment can also function as a balun.

As shown above, the surface acoustic wave filter of this embodiment can not only have a balanced type terminal but also control input/output impedance of the surface acoustic wave filter.

(Embodiment A2)

The surface acoustic wave filter according to Embodiment A2 of the present invention will be explained below with reference to the attached drawings. FIG. A5 is a schematic view of the surface acoustic wave filter according to Embodiment A2.

In FIG. A5, reference numeral 2501 denotes a piezoelectric substrate and it is possible to excite a surface acoustic wave by constructing comb-like electrode patterns crossing in strip-line form with a cyclic structure on this piezoelectric substrate 2501. A longitudinally coupled mode type surface acoustic wave filter comprising input IDT electrodes 2502a and 2502b, reflector electrodes 2503a and 2503b and an output IDT electrode 2504 is formed on the piezoelectric substrate 2501.

In the above-described surface acoustic wave filter, the upper electrode of the input IDT electrode 2502a is connected to one input terminal S1 and the upper electrode of the input IDT electrode 2502b is connected to the other input terminal S2 and the lower electrodes of the input IDT electrodes 2502a and 2502b are grounded. This embodiment A2 is different from Embodiment A1 in that the input IDT electrodes 2502a and 2502b are of a balanced type.

Furthermore, S1 and S2 constitute balanced type terminals and the signals input from S1 and S2 to the input IDT electrodes 2502a and 2502b have phases opposite each other. Furthermore, the adjacent electrode fingers of the input IDT electrode 2502a and the divisional IDT electrode 2504a are led out from the lower bus bar electrode and upper bus bar electrode in directions crossing each other and the adjacent electrode fingers of the input IDT electrode 2502b and the divisional IDT electrode 2504c are led out from the upper bus bar electrodes in the same directions. This positional relationship varies depending on the number of electrode fingers and a positional relationship different from this positional relationship may also be used as far as it at least allows surface acoustic waves to be excited without canceling out each other.

Furthermore, the output IDT electrode 2504 is constructed of three groups, first, second and third divisional IDT electrodes 2504a, 2504b and 2504c. Here, the first divisional IDT electrode 2504a, second divisional IDT electrode 2504b and third divisional IDT electrode 2504c are placed same phase with one another. The upper electrodes 2505a and 2505b of the first and second divisional IDT electrodes 2504a and 2504b are electrically connected and also connected to one terminal T1 of the balance type output terminal. The lower electrodes 2506b and 2506c of the second and third divisional IDT electrodes 2504b and 2504c are electrically connected and also connected to the other end T2 of the balanced type output terminal. The lower electrode 2506a of the first divisional IDT electrode 2504a and the lower electrode 2506c of the third divisional IDT electrode 2504c are grounded.

The surface acoustic wave filter according to Embodiment A2 configured as shown above is different from Embodiment A1 only in the balanced type input terminals and the locations of the input IDT electrodes, and the same in the method of division, operation and effects of the output IDT electrodes.

Furthermore, since signals to the input IDT electrodes 2502a and 2502b in the above configuration have phases opposite each other, it is possible to suppress characteristic deterioration due to spatial coupling and reduce deterioration of balancing due to direct coupling between the input IDT 2502a and 2502b and output IDT 2504.

This embodiment assumes that the upper electrodes 2505a and 2505b of the first and second divisional IDT electrodes 2504a and 2504b are electrically connected, but the respective upper electrodes may also be united into one common upper electrode. Furthermore, this embodiment also assumes that the lower electrodes 2506b and 2506c of the second and third divisional IDT electrodes 2504b and 2504c are electrically connected, but the respective upper electrodes may also be united into one common lower electrode. Furthermore, when a pad electrode is used as in the case of Embodiment A1, instead of directly electrically connecting the upper electrodes 2505a and 2505b of the first and second divisional IDT electrodes 2504a and 2504b, it is possible to electrically connect the upper electrodes 2505a and 2505b via the pad electrode as in the case of Embodiment A1. Likewise, instead of directly electrically connecting the lower electrodes 2506b and 2506c of the second and third divisional IDT electrodes 2504b and 2504c, it is possible to electrically connect the lower electrodes 2506b and 2506c via the pad electrode as in the case of Embodiment A1.

Furthermore, with respect to the method of grounding the upper electrode 2505c of the divisional IDT electrode 2504c and the lower electrode 2506a of the divisional IDT electrode 2504a, it is also possible to independently ground them apart from the grounding electrodes of the input IDT electrodes 2502a and 2502b or electrically connect the upper electrode 2505c of the divisional IDT electrode 2504c and the lower electrode 2506a of the divisional IDT electrode 2504a.

Thus, even if a symmetric configuration is adopted for the above-described surface acoustic wave filter, the same effects can be obtained.

(Embodiment A3)

The surface acoustic wave filter according to Embodiment A3 of the present invention will be explained below with reference to the attached drawings. FIG. A6 is a schematic view of the surface acoustic wave filter according to Embodiment A3.

In FIG. A6, reference numeral 2601 denotes a piezoelectric substrate and it is possible to excite a surface acoustic wave by constructing electrode patterns crossing in strip-line form with a cyclic structure on this piezoelectric substrate 2601. A longitudinally coupled mode type surface acoustic wave filter comprising input IDT electrodes 2102a and 2102b, reflector electrodes 2103a and 2103b and an output IDT electrode 2104 is formed on the piezoelectric substrate 2601, and this embodiment in this configuration is the same as the surface acoustic wave filter shown in Embodiment A1.

In the above-described surface acoustic wave filter, the upper electrodes of the input IDT electrodes 2102a and 2102b are connected to an input terminal S via a surface acoustic wave resonator 2604 connected in series and formed of reflector electrodes 2602a, 2602b and an IDT electrode 2603. Furthermore, between the surface acoustic wave resonator 2604 and the upper electrodes of the input IDT electrodes 2102a and 2102b, a surface acoustic wave resonator 2607 formed of reflector electrodes 2605a and 2605b and an IDT electrode 2606 is connected in parallel and one end of the surface acoustic wave resonator 2607 is grounded.

FIG. A7 shows a passing characteristic of the above-described surface acoustic wave. FIG. A7A shows a configuration before the division, that is, a passing characteristic when the conventional configuration shown in FIG. A10 is used as the output IDT electrode. In FIG. A7A, the system is designed assuming that the number of pairs of output IDTs is 18 and output impedance is 50 Ω. FIG. A7B shows a characteristic assuming that the numbers of pairs of the first, second and third divisional IDT electrodes 2104a, 2104b and 2104c are 6 respectively and output impedance is 100 Ω. With regard to the passing characteristic in FIG. A7, FIG. A7A and FIG. A7B show the results of evaluation with 50 Ω and 100 Ω respectively as the condition of impedance on the output side. In FIG. A7B, the system is designed to have a total capacitance of the output IDT electrodes ½ and impedance of 100 Ω twice those before the division. FIG. A7B shows that output impedance is changed while the waveform of the surface acoustic wave filter using the divisional IDT electrode maintains the passing characteristic almost equivalent to that before the division in FIG. A7A.

This embodiment places the surface acoustic wave resonator 2607 in series between the input IDT electrodes 2102a and 2102b and input terminal S and in parallel with the surface acoustic wave resonator 2604, but it is also possible to place a longitudinally coupled mode type surface acoustic wave filter as shown in FIG. A8 and form a surface acoustic wave filter in two-stage configuration.

In FIG. A8, reference numeral 2801 denotes a piezoelectric substrate, a first-stage surface acoustic wave filter 2802 is constructed of an input IDT electrode 2803, reflector electrodes 2804a and 2804b and output IDT electrodes 2805a and 2805b. The upper electrode of the input IDT electrode 2803 is connected to the input terminal S and the lower electrode is grounded. The upper electrode of the output IDT electrode 2805a is grounded and the lower electrode is connected to the input IDT electrode 2102a of a second-stage surface acoustic wave filter 2806. Furthermore, the upper electrode of the output IDT electrode 2805b is grounded and the lower electrode is connected to the input IDT electrode 2102b of the second-stage surface acoustic wave filter 2806. Here, the second-stage surface acoustic wave filter 2806 has the same configuration as that in FIG. A1 shown in Embodiment A1.

That is, the adjacent electrode fingers of the input IDT electrode 2803 and output IDT electrode 2805a of the first-stage surface acoustic wave filter 2802 are led out from the lower bus bar electrodes in the same direction and the adjacent electrode fingers of the input IDT electrode 2803 and output IDT electrode 2805c are led out from the lower bus bar electrodes in the same direction. In this case, same phase signals are transmitted from the output IDT electrodes 2805a and 2805b of the first-stage surface acoustic wave filter 2801 to the second-stage surface acoustic wave filter 2806.

Here, this embodiment assumes that the adjacent electrode fingers of the input IDT electrode 2803 and output IDT electrode 2805a of the first-stage surface acoustic wave filter 2802 are led out from the lower electrodes in the same direction and the adjacent electrode fingers of the input IDT electrode 2803 and output IDT electrode 2805b are led out from the lower bus bar electrodes in the same direction, but even if the adjacent electrode fingers of the input IDT electrode 2805 and output IDT electrode 2805a are led out from the respective electrodes in directions crossing each other and the adjacent electrode fingers of the input IDT electrode 2803 and output IDT electrode 2805b are led out from the respective electrodes in directions crossing each other, the same characteristic as the surface acoustic wave filter can be obtained likewise as far as the output IDT electrodes 2805a and 2805b are in such a phase relationship that surface acoustic waves do not cancel out each other.

This positional relationship varies depending on the number of electrode fingers, etc. and a positional relationship different from this positional relationship may also be used as far as it provides at least a phase relationship whereby surface acoustic waves are excited without canceling out each other.

Furthermore, this embodiment places the surface acoustic wave resonator 2607 in series between the input IDT electrodes 2102a and 2102b and input terminal S, and in parallel with the surface acoustic wave resonator 2604, but it is also possible to place a longitudinally coupled mode type surface acoustic wave filter as shown in FIG. A9 to form a surface acoustic wave filter in a two-stage configuration.

In FIG. A9, reference numeral 2901 denotes a piezoelectric substrate, a first-stage surface acoustic wave filter 2902 is constructed of an input IDT electrode 2903, reflector electrodes 2904a and 2904b and output IDT electrodes 2905a and 2905b. The upper electrode of the input IDT electrode 2903 is connected to the input terminal S and the lower electrode is grounded. The upper electrode of the output IDT electrode 2905a is grounded and the lower electrode is connected to the input IDT electrode 2502a of a second-stage surface acoustic wave filter 2906. Furthermore, the upper electrode of the output IDT electrode 2905b is grounded and the lower electrode is connected to the input IDT electrode 2502b of the second-stage surface acoustic wave filter 2906. Here, the second-stage surface acoustic wave filter 2906 has the same configuration as that in Embodiment A2.

Furthermore, the output IDT electrodes 2905a and 2905b of the first-stage surface acoustic wave filter 2902 are in a positional relationship having phases opposite each other. That is, reverse phase signals are transmitted from the output IDT electrodes 2905a and 2905b of the first-stage surface acoustic wave filter 2902 to the second-stage surface acoustic wave filter 2906.

The above-described configuration makes the signals from the output IDT electrodes 2905a and 2905b of the first-stage surface acoustic wave filter 2902 opposite each other, making it possible to suppress characteristic degradation due to spatial coupling in the route up to the second-stage surface acoustic wave filter and reduce balancing deterioration due to direct coupling between the input IDT electrodes 2502a and 2502b and the output IDT 2504 of the second-stage surface acoustic wave filter 2906.

By placing a surface acoustic wave filter using divisional IDT electrodes for both the first and second stages, this embodiment can control impedance on both the input side and output side.

Furthermore, the surface acoustic wave filter of the present invention can control impedance and using this surface acoustic wave filter for a mobile unit communication apparatus facilitates impedance matching of IC, etc. and makes it possible to realize a high performance communication apparatus.

Thus, this embodiment has an advantage of providing a longitudinally coupled mode type surface acoustic wave filter with balanced type terminals, capable of controlling input/output impedance.

Furthermore, a communication apparatus using the surface acoustic wave filter of the present invention for a transmission circuit and/or reception circuit also belongs to the present invention.

(Embodiment A4)

The surface acoustic wave filter according to Embodiment A4 of the present invention will be explained below with reference to the attached drawings. FIG. A13 is a schematic view of the surface acoustic wave filter according to Embodiment A4.

In FIG. A13, reference numeral 2101 denotes a piezoelectric substrate and it is possible to excite a surface acoustic wave by constructing comb-like electrode patterns crossing in strip-line form with a cyclic structure on this piezoelectric substrate 2101. A longitudinally coupled mode type surface acoustic wave filter comprising input IDT electrodes 2102a and 2102b, reflector electrodes 2103a and 2103b and an output IDT electrode 2104 is formed on the piezoelectric substrate 2101.

In the above-described surface acoustic wave filter, the upper electrodes of the input IDT electrodes 2102a and 2102b are connected to an unbalanced type input terminal S and the lower electrodes of the input IDT electrodes 2102a and 2102b are grounded.

Furthermore, the output IDT electrode 2104 is divided into four portions of first, second, third and fourth divisional IDT electrodes 2104b1, 2104a, 2104c and 2104b2 and is constructed by connecting the four groups of divisional IDT electrodes 2104b1, 2104a, 2104c and 2104b2. Here, the first divisional IDT electrode 2104b1, second divisional IDT electrode 2104a, third divisional IDT electrode 2104c and fourth divisional IDT electrode 2104b2 are placed in such a way as to be same phase with one another.

That is, the output IDT electrode 2104 has a configuration in which the second divisional IDT electrode 2104b of the output IDT electrode 2104 in FIG. 1 of Embodiment A1 is further divided into two portions of the divisional IDT electrode 2104b1 and divisional IDT electrode 2104b2, and the divisional IDT electrode 2104b1 and divisional IDT electrode 2104b2 are placed outside the divisional IDT electrode 2104a and divisional IDT electrode 2104b respectively.

Furthermore, the upper electrode 2105b1 of the first divisional IDT electrode 2104b1, the upper electrode 2105c of the third divisional IDT electrode 2104c and the upper electrode 2105b2 of the fourth divisional IDT electrode 2104b2 are connected to one end T1 of a balanced type output terminal. On the other hand, the lower electrode 2106b1 of the first divisional IDT electrode 2104b1, the lower electrode 2106a of the second divisional IDT electrode 2104a and the lower electrode 2106b2 of the fourth divisional IDT electrode 2104b2 are connected to the other end T2 of the balanced type output terminal.

The upper electrode 2105a of the second divisional IDT electrode 2104a and the lower electrode 2106c of the third divisional IDT electrode 2104c are grounded.

An operation of the surface acoustic wave filter configured as shown above of Embodiment A4 will be explained below.

FIG. A14 is a capacitance equivalent circuit of Embodiment A4 and reference characters Cb1, Ca, Cc and Cb2 denote capacitances of the first, second, third and fourth divisional IDT electrodes 2104b1, 2104a, 2104c and 2104b2 respectively and a total capacitance of Cb1, Ca, Cc and Cb2 constitutes a total capacitance Cout of the output IDT electrode 2104 and is expressed in the following expression. That is, the second divisional IDT electrode 2104a and third divisional IDT electrode 2104c are connected in series, while the first divisional IDT electrode 2104b1 and fourth divisional IDT electrode 2104b2 are connected in parallel with the second divisional IDT electrode 2104a and third divisional IDT electrode 2104c respectively.

(Mathematical Expression 4)

$$Cout=(Ca\cdot(Cb1+Cb2)+Cb\cdot(Cb1+Cb2)\cdot Cc+Cc\cdot Ca)/(Ca+Cc)$$

where, suppose the number of pairs of electrode fingers of the second divisional IDT electrode 2104b in FIG. A1 is the same as the sum of the number of pairs of electrode fingers of the first divisional IDT electrode 2104b1 and the number of pairs of electrode fingers of the fourth divisional IDT electrode 2104b2.

The mathematical expression 4 is equivalent to the parts Cb in mathematical expression 1 replaced with (Cb1+Cb2). Therefore, in the same way as explained in Embodiment A1, it is also possible to control the total capacitance Cout of the input IDT electrode 2104, that is, control impedance by changing the respective number of pairs of electrode fingers Nb1, Na, Nc and Nb2 of the divisional IDT electrodes 2104b1, 2104a, 2104c and 2104b2 for the surface acoustic wave filter of this embodiment in the same way as explained in Embodiment A1.

Parts other than this are the same as Embodiment A1 and therefore explanations thereof are omitted.

It goes without saying that various modifications described in the foregoing embodiments are also applicable to Embodiment A4.

(Embodiment A5)

The surface acoustic wave filter according to Embodiment A5 of the present invention will be explained below with reference to the attached drawings. FIG. A15 is a schematic view of the surface acoustic wave filter according to Embodiment A5.

In FIG. A15, reference numeral 2101 denotes a piezoelectric substrate and it is possible to excite a surface acoustic wave by constructing comb-like electrode patterns crossing in strip-line form with a cyclic structure on this piezoelectric substrate 2101. A longitudinally coupled mode type surface acoustic wave filter comprising input IDT electrodes 2102a and 2102b, reflector electrodes 2103a and 2103b and an output IDT electrode 2104 is formed on the piezoelectric substrate 2101 as in the case of Embodiment A4.

In the above-described surface acoustic wave filter, the upper electrodes of the input IDT electrodes 2102a and 2102b are connected to an unbalanced type input terminal S and the lower electrodes of the input IDT electrodes 2102a and 2102b are grounded.

Furthermore, the output IDT electrode 2104 is divided into four portions of first, second, third and fourth divisional IDT electrodes 2104b1, 2104a, 2104c and 2104b2 as in the case of Embodiment A4 and is constructed by connecting the four groups of divisional IDT electrodes 2104b1, 2104a, 2104c and 2104b2.

Furthermore, the upper electrode 2105b1 of the first divisional IDT electrode 2104b1, the upper electrode 2105c of the third divisional IDT electrode 2104c and the upper electrode 2105b2 of the fourth divisional IDT electrode 2104b2 are electrically connected and connected to one end T1 of a balanced type output terminal. On the other hand, the lower electrode 2106b1 of the first divisional IDT electrode 2104b1, the lower electrode 2106a of the second divisional IDT electrode 2104a and the lower electrode 2106b2 of the fourth divisional IDT electrode 2104b2 are connected electrically and connected to the other end T2 of the balanced type output terminal.

That is, unlike Embodiment A4, the upper electrode 2105c of the third divisional IDT electrode 2104c and the upper electrode 2105b2 of the fourth divisional IDT electrode 2104b2 are electrically connected and then connected to the one end T1 of the balanced type output terminal. Likewise, unlike Embodiment A4, the lower electrode 2106b1 of the first divisional IDT electrode 2104b1 and the lower electrode 2106a of the second divisional IDT electrode 2104a are electrically connected and then connected to the other end T2 of the balanced type output terminal.

Furthermore, unlike Embodiment A4, of the electrode fingers led out from the upper electrode 2105a of the second divisional IDT electrode 2104a, the electrode digit adjacent to the electrode digit of the third divisional IDT electrode 2104c is also connected to the lower electrode 2106c of the third divisional IDT electrode 2104c. Furthermore, of the electrode fingers led out from the lower electrode 2106c of the third divisional IDT electrode 2104c, the electrode digit adjacent to the electrode digit of the second divisional IDT electrode 2104a is also connected to the upper electrode 2105a of the second divisional IDT electrode 2104a.

That is, in Embodiment A5, none of the divisional IDT electrodes 2104b1, 2104a, 2104c or 2104b2 is grounded.

An operation of the surface acoustic wave filter configured as shown above of Embodiment A5 will be explained below focused on the differences from Embodiment 4.

FIG. A16 is a capacitance equivalent circuit of Embodiment A5 and reference characters Cb1, Ca, Cc and Cb2 denote capacitances of the first, second, third and fourth divisional IDT electrodes 2104b1, 2104a, 2104c and 2104b2 respectively and a total capacitance of Cb1, Ca, Cc and Cb2 constitutes a total capacitance Cout of the output IDT electrode 2104 and is expressed by the mathematical expression 4 shown in Embodiment A4.

That is, in Embodiment A5, instead of grounding none of the divisional IDT electrodes of the output IDT electrode 2104, virtual grounding is realized by electrically connecting the upper electrode 2105a of the second divisional IDT electrode 2104a and the lower electrode 2106c of the third divisional IDT electrode 2104c.

Therefore, in addition to the ability to obtain effects equivalent to those of Embodiment A4, none of the divisional IDT electrodes of the IDT electrode 2104 is grounded, and therefore this embodiment can also prevent characteristic deterioration due to signal routing from the ground and especially improve balance characteristics.

It goes without saying that various modifications described in the foregoing embodiments are also applicable to Embodiment A5.

By the way, even if the surface acoustic wave filter of this embodiment has a symmetric configuration, the same effects can be obtained.

The piezoelectric substrate of the present invention may also be formed of a single crystal piezoelectric material or may be a substrate consisting of a predetermined substrate on which a thin film of piezoelectric material is formed. It is possible to use, for example, $LiNbO_3$, $LiTaO_3$, quarts or $Li_2B_4O_7$, etc. as the piezoelectric material of the single crystal and (Pb, Zr) $TiO_3$-based ceramics or ZnO-based thin film or AlN as the piezoelectric material used for the film. Furthermore, the substrate consisting of the predetermined substrate on which a thin film of piezoelectric material is formed refers to a substrate formed into a thin film of piezoelectric material by forming a diamond thin film on a silicon substrate, coating a piezoelectric material such as ZnO through sputtering.

(Embodiment A6)

A communication apparatus according to Embodiment A6 of the present invention will be explained below with reference to the attached drawings. FIG. A17 is a block diagram of communication apparatus 1001 using the surface acoustic wave filter or balanced type filter of the present invention. In FIG. A17, a transmission signal output from a transmission circuit is passed through a transmission amplifier 1002, a transmission filter 1003 and a switch 1004 and sent out from an antenna 1005. On the other hand, a reception signal received by antenna 1005 is passed through the switch 1004, a reception filter 1006 and a reception amplifier 1007 and input to a reception circuit.

Here, since the transmission amplifier 1002 is of a balanced type and the switch 1004 is of an unbalanced type, the transmission filter 1003 has a configuration having an unbalanced-balanced type terminal. Furthermore, since the reception amplifier 1007 is of a balanced type and the switch 1004 is of an unbalanced type, the reception filter 1006 has a configuration having an unbalanced-balanced type terminal.

Applying the surface acoustic wave filter or balanced type filter of this embodiment of the present invention to the transmission filter 1003 or reception filter 1006 of the communication apparatus 1001 can suppress deterioration in modulation accuracy during transmission due to deterioration of the balance characteristic and suppress deterioration in the sensitivity during reception due to deterioration of the balance characteristic, making it possible to realize a high performance communication apparatus.

By the way, Embodiment A6 has been described assuming that the transmission filter 1003 and reception filter 1006 are of an unbalanced-balanced type, but when the switch 1004 is of a balanced type, it is possible to provide balanced type transmission filter 1003 and balanced type reception filter 1006.

Furthermore, when the switch 1004 is of a balanced type and the transmission amplifier 1002 or reception amplifier 1007 is of an unbalanced type, it is possible to obtain similar effects by switching between the balanced type and unbalanced type input/output terminals of the transmission filter 1003 or reception filter 1006.

Furthermore, this embodiment has described the case where the switch 1004 is used as the means for switching between transmission and reception at communication apparatus 1001, but a duplexer can be used instead.

The surface acoustic wave filter of this embodiment allows impedance matching without adding an inductance between the balanced type terminals as the matching circuit. Therefore, applying the surface acoustic wave filter of this embodiment to a mobile unit communication apparatus further makes it possible to reduce the size of the mobile unit communication apparatus.

Of the embodiments of the present invention, the embodiments of group A have been explained so far. Next, embodiments of group B will be explained below.

(Embodiment B1)

FIG. B1 is a constitution view showing a SAW filter according to the embodiment B1 of the present invention. By forming an electrode pattern having a strip line shaped periodical structure on a single crystal piezoelectric substrate 11 shown in FIG. B1, SAW can be excited. On the piezoelectric substrate 11 there is formed a first SAW resonator of energy strage type constituted by an IDT electrode 12a and reflector electrodes 12b, 12c. Also, on the piezoelectric substrate 11, there is constituted a second SAW resonator of constituted by an IDT electrode 13a and reflector electrodes 13b, 13c. And, these two SAW resonators are disposed close to each other, and by formation of acoustic couple between them, a SAW filter is constituted.

A remarkable difference in the electrode pattern constitutions between the SAW filter of the embodiment B1 of the present invention shown in FIG. B1 and that of prior art as shown in FIG. B24 is that the bus bar electrodes 244 common to the two resonators disposed nearby of conventional style in FIG. B24 are electrically separated in the IDT electrode part into the inside first bus bar 14 and the second bus bar 15 in the embodiment B1 of the present invention. The first bus bar 14 belongs to the first SAW resonator, and the second bus bar 15 to the second SAW resonator. By this bus bar separation constitution, the first and second SAW resonators can have fully electrically independent input or output stages. Namely, the balanced input stage of the first SAW resonator is constituted by an electrode finger formed by being bound by the first bus bar electrode 14 and an IDT electrode 12a comprising an electrode finger to be coupled with said electrode finger. In the same manner, the balanced output stage of the second SAW resonator is constituted by an IDT electrode 13a comprising an electrode finger formed by being bound by the second bus bar electrode 15 and an electrode finger to be coupled with said electrode finger. Here, the first IDT electrode of the present invention corresponds to the IDT electrode 12a. The second IDT electrode of the present invention corresponds to the IDT electrode 13a.

The connection of the signal line to the balanced circuit constituted as above may be made to apply an input signal to the spot between the first bus bar electrode 14 and the third bus bar electrode 14a positioned outside the IDT electrode to be coupled therewith, and to take out the output signal from the spot between the second bus bar electrode 15 and the fourth bus bar electrode 15a positioned outside the IDT electrode to be coupled therewith. By this step, the object of balancing the input and output terminals has been attained. When this is observed from the aspect of the insertion loss, the amount is about 3.2 dB in the case of the above connection.

With respect to one terminal of the balanced type input terminal described above, a connection line is led from one spot of the first bus bar electrode 14, and as to the one terminal in the balanced type output terminals, explanation has been given on the case where a connection line is led from one spot of the second bus bar electrode 15. Against this, the case of the constitution leading out the connection lines from the two spots of the first and second bus bar electrodes 14, 15 is described next.

With respect to this insertion loss, by leading out two connection lines (leading out electrode fingers 16a, 16b) from two spots of the first bus bar electrode 14 to make a terminal of the input side, and leading out two connection lines (leading out electrode fingers 17a, 17b) from two spots of the second bus bar electrode 15 to make a terminal of the input side, improvement of the balancing level in the balanced type input and output terminal is realized, the difference of loss formed in each terminal is decreased to reduce the above insertion loss to a large extent to about 2.8 dB. This is an effect having an important value in a miniature type portable communication apparatus which weighs as being important the minor loss and a balance level in the balanced type input and output terminal. In other words, in FIG. B1, from both ends of the first bus bar electrode 14, the leading out electrode fingers 16a, 16b directed outward are formed on the space between the IDT electrode 12a and the reflector electrodes 12b, 12c, and by connecting the end parts of these electrode fingers as illustrated, the effect as mentioned above is obtained. The leading out electrode fingers 17a, 17b at both ends of the second bus bar electrode 15 also have the same effect. The leading out electrode fingers 16a, 16b can be regarded as being constituted by the electrode fingers having the same length as other electrode fingers which are connected to the two end parts of the first bus bar electrode 14 and the leading out electrodes of short length connected to the front end parts of those two electrode fingers. Same comments can be made on the leading out electrode fingers 17a, 17b.

FIG. B2 shows an example of variations of the embodiment B1 of the present invention shown in FIG. B1. To the parts which perform the same functions as those given in FIG. B1 the same marks are affixed and explanations thereon are omitted.

The wiring pattern 21 to connect between the leading electrode fingers 16a and 16b is formed on the piezoelectric substrate 11 and has a line width wider than the resonator electrode. A part of it is further expanded as shown in FIG. B2 to form a one connection land 21a for connecting between the balanced type input and output terminals and the outside wiring member 25a.

The wiring pattern 22 for connecting between the leading out electrode fingers 17a and 17b is formed on the piezoelectric substrate 11, and has a line width wider than the resonator electrode width. A part of it is further expanded, as shown in the same figure, to form one connection land 22a for the connection line between the balanced type output terminal and the outside wiring member 26a.

The bus bar electrode 14a is extended outward to form another connection land 23 for connecting between the balanced type output terminal and the outside wiring member 25b. The bus bar electrode 15a is also extended outward to form another connection land 24 for connecting between the balanced type output terminal and the outside wiring member 26b.

The above constitution is effective for assuring the characteristics of low insertion loss and good balanced level of the SAW filter having low insertion loss and balanced type input and output terminals, and for stabilizing the filter characteristics.

Taking an example of a SAW filter of single stage constitution, explanation has been given above by referring to FIG. B1 and FIG. B2. Such SAW filter can be used in multi-stage constitution.

FIG. B3 is an example thereof, and when a multi-stage connection SAW filter is constituted by cascade connecting a plurality of SAW filters on the same piezoelectric substrate 31, great improvement can be obtained in the characteristics in rejection band and transition band, though there may be some increase in the insertion loss. The two-stage cascade connected filters shown in FIG. B3 comprise a first SAW resonator constituted by an IDT electrode 12a and reflector electrodes 12b, 12c as explained in FIG. B1, and a second SAW resonator constituted by an IDT electrode 13a and reflector electrodes 13b, 13c, which are disposed near to each other to form a SAW filter 32 and a SAW filter 33 of the same constitution thereof formed on the piezoelectric substrate 31, and the two members are connected by a connecting wire.

In FIG. B3, the leading out electrodes 17a and 17b on the output side of the first stage SAW filter 32 are connected to the leading out electrodes 16a and 16b on the input side of the next stage SAW filter 33 with the connecting wires 39a and 39b, respectively. The bus bar electrode 15a of IDT electrode which is another output of the first stage output is connected by the connecting wire 40 to the IDT electrode 14a which is another output of the next stage.

In this manner, even between the filter stages, there can be realized reduction of increase in insertion loss at the time of the multi-stage operation and improvement to the balance level of balanced type input and output terminals, by connecting one part of the IDT electrodes at two places of 39a and 39b.

The wire connections of the multi-stage filter on the input side and output side as shown in FIG. B3 are similar to those of FIG. B1, and have the same action and effect.

FIG. B4 shows an example where the inter-stage and input and output wirings are carried out by the wiring patterns formed on the substrate 41.

On the piezoelectric substrate 41, there are formed the first SAW filter 42 and the second SAW filter 43 which have the same constitutions as the SAW filters shown in FIG. B1, FIG. B2, and FIG. B3.

The leading out electrodes 17a and 17b on the output side of the first SAW filter 42 are connected to the leading out electrodes 16a and 16b on the input side of the second filter 43 by forming the first inter-stage connection electrodes 44a, 44b of wider width than the resonator electrodes on a piezoelectric substrate 41. Also, another output 15a of the first filter 42 and another input 14a of the second filter 43 are connected by forming the second inter-stage connecting electrode 45 having wider width than the electrode of the resonator on the piezoelectric substrate 41.

The leading out electrodes 16a and 16b on the input side of the first filter 42 are connected by the wiring pattern 46 having the wider width than the resonator electrode formed on the piezoelectric substrate 41. Further, a part of said wiring pattern 46 is further expanded to form one connecting land 46a with the outer wiring member 47a of the balanced type input terminal, and the bus bar electrode 14a of outside IDT electrode is expanded outward to form a connecting land 48a with the external wiring member 47b of the balanced type input terminal.

On the other hand, the area between the leading out electrodes 17a and 17b on the output side of the second filter is connected by the wiring pattern 46b of wider line width than the resonator electrode width formed on the piezoelectric substrate 41. Further, a part of the said wiring pattern is further extended to form a connection land 46c with the outside wiring member 47c of the balanced type output terminal, and the bus bar electrode 15a is extended outward to form a connection land 48a with the external wiring member 47d of the balanced type output terminal.

By such a pattern constitution, there can be provided a balanced type multi-stage SAW filter having low insertion loss and good balancing level.

The lands 44c, 45a for external wiring provided on the inter-stage connection electrodes 44b, 45 of FIG. B4 are useful in the connection of the external circuit element for filter characteristic adjustment.

By the way, there may be cases where the desired good transmission characteristics cannot be obtained because of the mismatching of the input and output impedance's in the stages.

In such a case, the reactance element such as an inductor may be connected as a matching element to the inter-stage connecting electrode to make adjustment. The lands 44c, 45a for external wiring are useful for the purpose. Alternatively, by adopting such a constitution that a reactance element such as a spiral inductance is formed on the same piezoelectric substrate 41 or on a separate substrate and connected to the inter-stage connecting electrode, no extra space is necessitated, and reduction of filter circuit size can be easily realized. The reactance element for adjustment may be connected to either one of the inter-stage connecting lands 44c, 45a and the other land may be grounded. According to the experiment, improvements of the symmetric property of the filter transmission characteristic is observed in the case that the reactance element is connected to the first connection land 44c.

(Embodiment B2)

FIG. B5 is a constitution view showing a SAW filter according to the embodiment B2 of the present invention.

By forming an electrode pattern having a strip line shaped periodical structure on a piezoelectric substrate 51 shown in FIG. B5, SAW can be excited. On the piezoelectric substrate 51 there is formed a first SAW resonator of energy strage type constituted by an IDT electrode 52a and reflector electrodes 52b, 52c. Also, on the piezoelectric substrate 51, there is constituted a third SAW resonator constituted by an IDT electrode 54a and reflector electrodes 54b, 54c.

The point to be specially noted here is that the IDT electrode part of the second SAW resonator formed between the first SAW resonator and the third SAW resonator accompanied with the reflector electrodes 53b, 53c, has a similar structure to that of the reflector electrode, and is constituted by a periodic structure strip line electrode row 53a having approximately the same length as the crossing width of the electrode fingers of the IDT electrodes 51a, 54a in the first and third SAW resonators.

In other words, even if the structure of the electrode part of the second SAW resonator is not of the same structure as those of the above-described IDT electrodes 52a, 54a but is changed to the periodic structured strip line electrode row 53a, if the electrode period is the same, the SAW can be transmitted in entirely the same manner. Accordingly, the acoustic behaviors of the central part second SAW resonator make no difference from the case of the IDT electrode structure.

The above three SAW resonators have the acoustic couple closely disposed to one another. The bus bar electrodes of the parts adjacent to one another are electrically independent. From both ends of the bus bar electrode 55 adjacent to the second SAW of the IDT electrode in the first SAW resonator, there are formed outward the first and second electrode fingers 57a and 57b which constitute a part of the balanced type input terminal, in the space between the IDT electrode 52a and the reflector electrodes 52b, 52c. Also, from both ends of the bus bar electrode 56 adjacent to the second SAW of the IDT electrode in the third SAW resonator, there are formed outward the third and fourth electrode fingers 58a and 58b which constitute a part of the balanced type output terminal, in the space between the IDT electrode 54a and the reflector electrodes 54b, 54c. The electrode constitutions described above are the basic constitutions of the triple mode SAW filter having the balanced type input and output terminals of low insertion loss according to the present invention.

FIG. B6 shows an example of connection of a balanced type input and output terminal of the present invention for the triple mode SAW filter as explained in FIG. B5.

As shown in said figure, the first electrode finger 57a and the second electrode finger 57b of the first SAW resonator are connected by the connecting wires 61a, 61b to make one input terminal of the balanced type input terminal, and the connecting wire 62 is led out from the bus bar electrode 55a of the outside IDT electrode to make the other input terminal of the balanced type input terminal. And, the third electrode finger 58a and the fourth electrode finger 58b of the third SAW resonator are connected by the connecting wires 63a, 63b to make one output terminal of the balanced type input terminal, and the connecting wire 64 is led out from the bus bar electrode 56a of the outside IDT electrode to make the other output terminal of the balanced type input terminal.

FIG. B7 shows another embodiment of the constitution of the balanced type input and output terminal of the triple mode SAW filter.

As shown in said figure, the area between the first electrode finger 57a of the first SAW resonator and the second electrode finger 57b is connected by the wiring pattern 71 of wider line width than the resonator electrode width formed on the piezoelectric substrate 51. Further, the pattern 71 is further extended to form a connection land 71a with the external wiring member 75a, and the bus bar electrode 55a of IDT electrode is extended outward to form a connection land 73 with the external wiring member 75, and the area between the third and fourth electrode fingers 58a and 58b of the third SAW resonator is formed on a piezoelectric substrate 51 to make a resonator electrode, and connection is made by the wiring pattern 72 which has the wider line width than the resonator electrode. The pattern 72 is further extended to form a connection land 72a with the external wiring member 76a, and the bus bar electrode 56a of IDT electrode is extended outward to form a connection land 74 with the external wiring member 76. According to such a constitution, similarly to what SAW described in the embodiment B1, it becomes possible to provide a triple mode SAW filter in which the insertion loss is further reduced and connection with the external circuit is easy, as explained in the embodiment B1.

FIG. B8 shows an example of the case where a plurality of the triple mode SAW filters as explained with reference to FIG. B5 are stepwise connected cascade.

As shown in the figure, on the piezoelectric substrate 81 there are formed a first triple mode SAW filter 82 and a second triple mode SAW filter 83. The third and fourth electrode fingers 58a, 58b on the output side of the first filter 82 and the bus bar electrode 56a on the output side are stepwise connected to the first and second electrode fingers 57a, 57b on the input side and the bus bar electrode 55a on the input side, of the second filter 83, by the connecting wires 83a, 83b, and 84. The balanced type wire connections of the input circuit and output circuit are entirely same as the wiring constitution of the single stage filter shown in FIG. B6.

FIG. B9 shows another example of the input and output constitutions and the inter-stage constitutions of the vertical connection triple mode SAW filter as shown in FIG. B8.

As shown in said figure, on the piezoelectric substrate 91, there are formed a first triple mode SAW filter 92 and a second triple mode SAW filter 93. The two filters are Inter-stage connected by the inter-stage connecting electrodes 94a, 94b, and 95 having wider widths than the width of the resonator electrode which is formed by placing the third and fourth electrode fingers 58a, 58b on the output side, and the bus bar electrode 56a, of the first filter 92, and the first and second electrode fingers 57a, 57b on the input side, and the bus bar electrode 55a on the input side of the second filter 93, on the piezoelectric substrate 91. The lands 94c, 95a formed on a part of each connecting electrode are convenient to use for the connection of the external elements for adjusting filter characteristics. The wiring patterns of the input circuit and output circuit are entirely same as those of the single stage filter constitution shown in FIG. B7.

As described above, according to the embodiments B1 and B2, because the bus bar electrode of the IDT electrode is electrically independent, balanced input and output mode can be realized, and accordingly, the filter characteristics do not have the effects of floating capacity by the grounding condition of electrode, so that the characteristics in the rejection band and transition band are improved, and moreover, due to the leading out electrode structure which is characterized by the present invention, remarkable improvement of insertion loss and improvement in balance level in the balanced type input and output terminal can be realized.

In the embodiment B3, there is employed an example wherein, as a balanced type triple mode filter, there is used one in which the IDT electrode of the central part resonator as shown in FIG. B5 has a periodic structured electrode constitution same as the reflector electrode. Even when this part is an IDT electrode structure same as being heretofore used, the effect of improvement in the filter characteristic by the balanced wiring connection by the present invention is obtainable in exactly the same manner.

(Embodiment B3)

FIG. B10 is a constitution view showing the embodiment B3 of the SAW filter according to the present invention.

In FIG. B10, the part 101 is a single crystal piezoelectric substrate. By forming an electrode pattern on the piezoelectric substrate 101, SAW can be excited. On the piezoelectric substrate 101 there is formed an energy strage type first SAW resonator constituted by an IDT electrode 102a and reflector electrodes 102b, 102c. Also, on the piezoelectric substrate 101, there is formed a third SAW resonator constituted by an IDT electrode 104a and reflector electrodes 104b, 104c. The electrode part 103a of the second SAW resonator formed between the first SAW resonator and the third SAW resonator accompanied with the reflector electrodes 103b, 103c has the same structure as that of the reflector electrode.

As reviewed above, even if the structure of the electrode part 103a of the second SAW resonator is not of the same structure as those of the above-described IDT electrodes but is changed to the periodic structured strip line electrode row, if the electrode period is the same, the SAW can be transmitted in entirely the same manner. Accordingly, the acoustic behaviors of the second SAW resonator disposed at the central part make no difference from the case of the IDT electrode structure.

Furthermore, assuming that the electrode finger crossing width of IDT electrodes 102a, 104a in the first and third SAW resonators is W1, and the length of the strip line constituting the IDT electrode part 103a of the second SAW resonator is W2, setting is so made that the relative size between W1 and W2 becomes: W1<W2.

The above three SAW resonators have the acoustic couple closely disposed to one another. The electrode finger of the IDT electrode 102a in the first SAW resonator is connected to the balanced type input terminal S, and the electrode finger of the IDT electrode 104a in the third SAW resonator is connected to the balanced type output terminal T. The periodic structure strip line electrode row 103a in the second SAW resonator is grounded.

Hereinafter, the operation of the SAW filter constituted as above is explained.

FIG. B11 is an excitation mode distribution chart of the SAW filter in the present embodiment. To the parts corresponding to those of FIG. B10 the same marks are assigned. In FIG. B11, (a) is a constitution view of the electrode of the SAW filter shown in FIG. B10. Due to the closely related disposition of the first to third SAW resonators, acoustic couple is formed therebetween, and there are excited the primary, secondary, and tertiary modes having the potentials as shown in FIG. B11 (b). Here, due to all electrical grounding of the electrode part 103a of the third SAW resonator disposed at the center, the polarity of the secondary mode potential distribution is reversible at the center, so that there can be obtained strong excitation strength on the same level as that of the primary and tertiary modes. As this permits to constitute a multi-stage mode filter made by effective utilization of the three excitation modes, there can be realized a SAW filter having broad bandwidth with acute attenuation characteristics.

FIG. B12 shows a change of the resonant frequency of each mode to the value of W standardized by the SAW wavelength λ in the case of W1=W2=W, obtained by the wave guide path mode analysis. The curves 121, 122, and 123 show the changes of the resonance frequencies in primary, secondary, and tertiary modes, respectively. As shown in FIG. B12, to a certain given value W, the frequency difference Δ1 between the primary mode and the secondary mode and the frequency difference Δ2 between the secondary mode and the tertiary mode become the difference values. Namely, when viewed with 50 Ω system, as shown in FIG. B13, the pass characteristic of the SAW filter does not show equal distance between the peaks of the three resonance modes as in the curve 131. Accordingly, even when the input and output are matched, ripples remain in the band as in the curve 132, and the filter characteristic is degraded.

Here, an effect of the case where the ratio of the length of the strip line W2 constituting the electrode part 103a of the second SAW resonator to the electrode finger cross difference width W1 of IDT electrodes 102a, 104a in the first and third SAW resonator (W2/W1) is shown in FIG. B14. In FIG. B14, there is shown a standardized value of the actually measured amount of the frequency difference (Δ1, Δ2 in FIG. B13) in resonance mode to W2/W1 in the SAW filter of the present invention having the constitution of FIG. B10. FIG. B14 shows the values where the length W2 of the strip line constituting the electrode part 103a of the second SAW resonator is varied in the case where the IDT electrode finger crossing difference width W1 of the first and third SAW resonators is 6.5 wavelength, and the combined gap length G is 1 wavelength. As shown in FIG. B14, when the value of W2/W1 is about 1.13, the relation becomes: Δ1=Δ2, i.e., the distance between the three resonance frequencies becomes equal. As to the allowance range, the relative sizes of W1 and W2 may be set so that they come into the range of 1<W2/W1≦1.3. Practically, considering the scattering in manufacture, the values of W1 and W2 may be set in the range of 1<W2/W1≦1.16.

FIG. B15 shows the passing characteristic of the SAW filter in the case of W1=6.5 wavelengths, W2=7.5 wavelengths, i.e., W2/W1=1.15. In FIG. B15, the numeral 151 shows the characteristic of the case observed in 50 Ω system, and 152 shows the characteristic of the case of matching taken. It can be seen that, in comparison with the case of FIG. B13, the ripples in the pass band apparently decrease to give excellent passing characteristic.

As described above, according to the embodiment B3 of the present invention, three SAW resonators are disposed in adjacent relations with one another, and the electrode part of the central SAW resonator is constituted by a strip line having slightly longer periodic structure than the cross difference width of the IDT electrode fingers of the first and third SAW resonators, and all of them are grounded. By such constitution, there can be obtained a SAW filter having wide bandwidth and flat pass characteristic and acute attenuation characteristic.

Furthermore, due to the electrical isolation of the bus bar at the central part of the IDT electrode, it becomes possible to wire the IDT electrode 102a of the first SAW resonator and the SAW resonator 104a of the third SAW resonator all independently, so that the balanced input and output of the SAW filter can be made. Consequently, the filter characteristic becomes free from the effect of the floating capacity or the like depending on the grounding condition of the electrode, and the characteristics of the rejection band and transition band are further improved. In addition, it becomes possible to connect the balanced type elements such as IC to the front and rear stages of the filter without using any external extra circuit such as Balun, thus improving the noise characteristics of the whole circuit.

In FIG. B10, the electrode part 103a of the second SAW resonator is grounded through the electrode pattern existing in the space between the IDT electrode 104a of the third SAW resonator and the reflector electrode 104c, but the constitution is not limited to it; and the grounding may be made through the reflector electrodes 103b, 103c on both sides of the electrode part 103a.

In this embodiment B3, explanation is given by taking an example of a SAW filter of single stage constitution. However, as shown in FIG. B16, when a multi-stage connection type SAW filter is constituted by cascade connecting a plurality of SAW filters 162, 163 on the same piezoelectric substrate 161, though the insertion loss increases to some extent, the characteristics of the rejection band and transition band are remarkably improved to give more excellent filter characteristics. In this case, it is preferable for the first SAW resonator electrode of the front stage SAW filter to be connected to the balanced type input terminal, and the third SAW resonator electrode of the rear stage SAW resonator to be connected to the balanced type output terminal. This is because the filter can be easily connected to the peripheral circuit such as a balanced type front end IC, making it unnecessary to secure ground for wiring, so that the stabilized filter characteristics are obtainable with less effect of floating capacity.

By the way, a simple vertical connection of the SAW filters may not give good transmission characteristic due to the mismatching of the input and output impedances in each stage. In such a case, the reactance elements such as inductance may be connected as matching elements to the inter-stage connecting electrode patterns 164, 165. In this case, in order to make full coordination with the balanced type input and output circuit, a matching element is required to be connected between the electrode patterns 164 and 165. However, in practice, the inter-stage portions have no electrical connection with the input and output terminals but have acoustic couple only. Accordingly, if one electrode pattern (e.g., electrode pattern 165) is directly grounded, and the other electrode pattern (e.g., electrode pattern 164) is grounded through the reactance element, the operation similar to the case of a reactance element having been connected between the two can be realized. And, when such a constitution is adopted, the wiring for grounding can be made on an electrode pattern, and therefore the use of bonding wires can be reduced.

(Embodiment B4)

FIG. B17 is a constitution view showing the embodiment B4 of the SAW filter according to the present invention.

In FIG. B17, the part 171 shows a single crystal piezoelectric substrate. By forming an electrode pattern on the piezoelectric substrate 171, a SAW can be excited in the same manner as in the embodiment B3. On the piezoelectric substrate 171, there is formed a first SAW resonator of energy strage type constituted by an IDT electrode 172a and reflector electrodes 172b, 172c. Also, on the piezoelectric substrate 171, there are formed a second SAW resonator of energy strage type constituted by an IDT electrode 173a and reflector electrodes 173b, 173c and a third SAW resonator of energy strage type constituted by an IDT electrode 174a and reflector electrodes 174b, 174c. And, these three SAW resonators are disposed in close relations to one another, and the bus bar electrodes of mutually adjacent IDT electrodes are electrically independent. Also, the reflector electrodes are connected by the common bus bar. The electrode finger of the IDT electrode 172a in the first SAW resonator is connected to the balanced type input terminal S, and the electrode finger of the IDT electrode 174a in the third SAW resonator is connected to the balanced type output terminal T. The electrode fingers of the IDT electrode 173a in the second SAW resonator are all grounded. Furthermore, when the electrode finger crossing difference width of the IDT electrodes 172a and 174a in the first and third SAW resonator is assumed to be W1, and the electrode finger crossing difference width of the IDT electrode 173a in the second SAW resonator is assumed to be W2, setting is so made that the relative sizes of W1 and W2 become: W1<W2.

With respect to the SAW filter having the above constitution, the electrode structure of the second SAW resonator at the central part is changed from the periodic structure strip line electrode rows in the above embodiment B3 to the IDT electrode 173a, but as the transmission of the SAW is carried out in exactly the same manner, the basic operation is same as the case of the embodiment B3 shown in FIG. B10. Accordingly, flattening of passing characteristic of SAW filter and inhibition of spurious in the rejection band are realized in the same manner as in the embodiment B3.

According to this embodiment B4, three SAW resonators are disposed in adjacent relations with one another, and all the IDT electrodes 173a constituting the central second SAW resonator are grounded, and their crossing widths are made slightly longer than the crossing width of the IDT electrode fingers of the first and the third SAW resonators, by which there can be obtained a SAW filter having wide bandwidth and flat pass characteristic and acute attenuation characteristic. Furthermore, due to the electrical isolation of the bus bar at the central part of the IDT electrode, it becomes possible to wire the IDT electrode 172a of the first SAW resonator and the SAW resonator 174a of the second SAW resonator all independently, so that the balanced input and output of the SAW filter can be realized. Consequently, the filter characteristic becomes free from the effect of the floating capacity or the like depending on the grounding condition of the electrode, and the characteristics of the rejection band and transition band are improved. In addition, it becomes possible to connect the balanced type elements such as IC to the front and rear stages of the filter without using any external extra circuit such as Balun, thus improving the noise characteristics of the whole circuit.

Furthermore, in this embodiment B4, when a plurality of SAW filters are cascade connected to constitute a multi-stage connection SAW filter, the characteristics of the transition band and the rejection band are remarkably improved. The method of vertical connection and method of connecting the reactance element (matching element) to the inter-stage part are exactly the same as those of the embodiment B3 shown in FIG. B16, and the effect on the filter characteristic is same as that described in the embodiment B3.

In the above embodiment B3, as shown in FIG. B10, the IDT electrode 102a of the first SAW resonator and the IDT electrode 104a of the second SAW resonator are disposed to be in reverse phase to each other. However, the invention is not necessarily limited to this constitution but the electrode dispositions maybe of the same phase. Even in this case, except the slight difference in the mode of presence of extra-band spurious, the action and effect make no difference. In this respect, same thing applies to the embodiment B4.

In the above third and embodiments B4, the input and output terminals are of balanced type, but they are not necessarily limited to the said constitution but it is possible to ground the unilateral sides of the input and output terminals respectively to adopt an unbalanced type. Moreover, in case of the grounding of either one side, a SAW filter having balanced-unbalanced terminals can be constituted.

(Embodiment B5)

FIG. B18 shows a constitution view of an electrode pattern according to Embodiment B5 of the SAW filter of the present invention.

In FIG. B18, the part 181 is a single crystal piezoelectric substrate. By forming an electrode pattern of periodic structure on the piezoelectric substrate 181, a SAW can be excited. On the piezoelectric substrate 181, there is formed a first SAW resonator of energy strage type constituted by an IDT electrode 182a and reflector electrodes 182b, 182c. Also, on the piezoelectric substrate 181, there is formed a second SAW resonator of energy strage type constituted by an IDT electrode 183a and reflector electrodes 183b, 183c.

As shown in FIG. B18, the IDT electrode 183a which constitutes the second SAW resonator is constituted by the connection of the three groups of the first, second, and third divisional IDT electrodes 184a, 184b and 184c. Here, the first divisional IDT electrode 184a and the second divisional IDT electrode 184b are disposed in reverse phases, and the second divisional IDT electrode 184b and the third divisional IDT electrode 184c are disposed in the same phase. With respect to the same phase and reverse phase, description will be given later.

The connection methods for these three groups are as noted below.

The lower electrode (outside bus bar electrode) 1841o of the first divisional IDT electrode 184a and the upper electrode (inside bus bar electrode) 1842i of the second divisional IDT electrode 184b are mutually connected through the fifth electrode finger 184a5 included in the first divisional IDT electrode 184a and a short connecting electrode 184ab. Also, the lower electrode (outside bus bar electrode) 1842o of the second divisional IDT electrode 184b and the lower electrode (outside bus bar electrode) 1843o of the third divisional IDT electrode 184c are connected.

By the above, an IDT electrode 183a which constitutes the second SAW resonator is formed.

The above grouping method is based on the divisional condition of the inside bus bar electrode and the divisional condition of the outside bus bar electrode.

Namely, due to the division of the upper electrode 1843i and the upper electrode 1842i, division is made to the third divisional IDT electrode 184c and the second divisional IDT electrode 184b. Also, due to the division of the lower electrode 1942o and the lower electrode 1841o, division is made to the second divisional IDT electrode 184b and the first divisional IDT electrode 184a.

And, these two first and second SAW resonators are disposed in adjacent relations with each other, and by the formation of acoustic couple between them an SAW filter is constituted.

Furthermore, the upper electrode and lower electrode of the IDT electrode 182a are connected respectively to the balanced type input terminal S. The lower electrode of the first divisional IDT electrode 184a and the upper electrode of the second divisional IDT electrode 184b which constitute the IDT electrode 183a are connected to one of the balanced type output terminal T, and the lower electrode of the second divisional IDT electrode 184b and the lower electrode of the third divisional IDT electrode 184c are connected to the other of the balanced type output terminal T, and the upper electrode of the first divisional IDT electrode 184a and the upper electrode of the third divisional IDT electrode 184c are grounded, by which a balanced type input and output terminal is formed.

Here, explanation is given on the same phase and reverse phase as described above.

First, structural disposition relations of adjacent two electrode fingers (a pair of adjacent electrode fingers ) are described.

That the adjacent two electrode fingers are in the same phase relations means that they are in such connection relations that one of the said two electrode fingers is connected to the inside bus bar electrode and extends outward from inside, and the other is connected to the outside bus bar electrode and extends inward from outside. Also, the adjacent two electrode fingers are in reverse phase relations means such connection relations that both of said two electrode fingers are connected to the inside bus bar electrodes and extend outward from inside, or that they are connected to the outside bus bar electrode and extend inward from outside. Here, it is assumed that the electric charges of the inside and outside bus bar electrodes are different, and that the pitch (distance between centers) between said adjacent two electrode fingers is $1/2 \times \lambda$. The pitch between the electrode fingers may be $(m+1/2) \times \lambda$. If, in such case, the pitch is $(m+1)+\lambda$, then the contents of meaning fully reverse with respect to the above same phase relation and reverse phase relation wherein $\lambda$ is wavelength of excited surface acoustic wave, and m=0, 1, 2, 3 . . .

Concretely, when observed with the first divisional IDT electrode 184a, as shown in FIG. B18, for example, the first electrode finger 184a1 and the second electrode finger 184a2 are in the same phase relation, and the fourth electrode finger 184a4 and the fifth electrode finger 184a5 are also in the same phase relation, and accordingly, all electrode fingers included in the first divisional IDT electrode 184a are in the same phase relations. Similarly, all electrode fingers included in the second and third divisional IDT electrodes 184b, 184c are in the same phase relations.

Next, with respect to the pair of electrode fingers 184a5 and 184b1, because the electrode finger 184a5 is connected to the outside bus bar electrode 1841o and the electrode finger 184b1 to the outside bus bar electrode 1842o, they are in the reverse phase relations. These adjacent two electrodes are disposed at the separating point between the first divisional IDT electrode 184a and the second IDT electrode 184b.

Accordingly, needless to say, the reverse phase or same phase referred to in respect to the above disposition of the three groups is based on the relations of the adjacent two electrode fingers as described above. This point is the same in other embodiments.

In addition, the width in the short length direction of the fifth electrode finger 184a5 will be related to below.

In FIG. B18, the constitution in which the width of the fifth electrode finger 184a5 is the same as that of other electrode finger is shown. However, without being limited to it, the width may of course be wider than that of other electrode finger. By so providing, the resistance value of the electrode finger is lowered, and accordingly the resistance value of the IDT electrode containing it becomes small to give an effect of decrease in insertion loss. This applies to the case of other embodiments.

With respect to the SAW filter in the embodiment B5 constituted as above, the operation is explained below.

FIG. B19 is a capacitance equivalent circuit diagram according to the embodiment B5, wherein $C_1$ is a capacity of the IDT electrode 182a which constitutes the first SAW resonator. Ca, Cb and Cc are the capacities of the first, second, and third divisional IDT electrodes 184a, 184b, and 184c, and the synthesized capacity of Ca, Cb and Cc becomes the total capacity $C_2$ of the second SAW resonator IDT electrode 183a. Here, assuming the number of couples of the electrode fingers included in the IDT electrode 183a to be n, and the respective number of couples of the third divisional IDT electrodes 184a, 184b, and 184c to be na, nb, and nc, the relation can be expressed by the following equation:

$$n = na + nb + nc \quad \text{[Equation 1]}$$

In the SAW filter as described above, the capacities of the IDT electrodes 182a, 183a are dominated by the number of couples of the electrode. Assuming the number of couples of the IDT electrode 182a to be n, and the electrode capacity of a couple of IDT electrode fingers to be C, the values of $C_1$, Ca, Cb and Cc can be expressed, respectively, as follows:

$$C_1 = n \times C$$

$$Ca = na \times C = C_1 \times na/n = C_1 \times na/(na+nb+nc)$$

$$Cb = nb \times C = C_1 \times nb/n = C_1 \times nb/(na+nb+nc)$$

$$Cc = nc \times C = C_1 \times nc/n = C_1 \times nc/(na+nb+nc)$$

Accordingly, from the capacitance equivalent circuit diagram of FIG. B19, the total capacity $C_2$ can be expressed by the Expression 5, by using Ca, Cb, and Cc.

Expression 5:

$$C_2 = \frac{C_c C_b + C_b C_c + C_c C_a}{C_a + C_c}$$
$$= \frac{(n_a n_b + n_b n_c + n_c n_a) \times C_1}{(n_a + n_c) \times n}$$

For example, assuming that the number of couples of the divisional IDT electrodes 184a, 184b, and 184c are equal, i.e., na=nb=nc=n/3, the relation becomes $C_2 = C_1 \times 1/2$, and the capacity of $C_2$ becomes half of that of $C_1$. By changing the number of couples na, nb, and nc of the divisional IDT electrodes 184a, 184b, and 184c, the total capacity $C_2$ of the IDT electrode 183a varies according to Expression 5 in the range of $C_1 \times 1/4 < C_2 < C_1$. Namely, the total capacity of the IDT electrode 183a can be controlled by the divisional ratio of the divisional IDT electrodes 184a, 184b, and 184c.

Also, in this case, the electric charges on the electrodes of the first, second, and third divisional IDT electrodes 184a, 184b, and 184c are not mutually cancelled, and the SAWs formed by the first, second, and third divisional IDT electrodes 184a, 184b, and 184c become the same phase. So that the second SAW resonator has the equivalent resonance characteristics to those of the first SAW resonator. Accordingly, by disposing the first SAW resonator and the second SAW resonator near to each other, they operate as the lateral mode combined resonance type filters in the same manner as in the conventional system.

As described above, according to the present Embodiment B5, the SAW filter having balanced type input and output shows excellent characteristics in the extra-band selectivity with narrow bandwidth, and also it can control the output impedance of the SAW filter by the electrode structure of IDT electrode which is formed by the divisional IDT electrode which is characterized by the present invention.

In the embodiment B5, description has been made on the IDT electrode 183a which constitutes the second SAW resonator, relating to the case where the first, second, and third divisional IDT electrodes 184a, 184b, and 184c which constitute the IDT electrode 183a are laid from left side to right side in order in the drawing, but the laying order may not be limited to the above but be from right side to left side as 184a, 184b, and 184c. The electrode pattern of the IDT electrode 183a may be inverted upside down. In such a case, as shown in FIG. B20, the IDT electrode 203a which constitutes the second SAW resonator on the piezoelectric substrate 201 is constituted by the connection of the three groups of first, second and third divisional IDT electrodes 204a, 204b and 204c. The first divisional IDT electrode 204a and the second divisional IDT electrode 204b are disposed in reverse phase, and the second divisional electrode 204b and the third divisional IDT electrode 204c are disposed in the same phase, the upper electrode of the first divisional IDT electrode 204a and the lower electrode of the second divisional IDT electrode 204b are connected, and the upper electrode of the second divisional IDT electrode 204b and the upper electrode of the third divisional IDT electrode 204c are connected to form an IDT electrode 203a which constitute the second SAW resonator. Also, in FIG. B20, the divisional IDT electrodes 204a, 204b, and 204c are laid in order of 204a, 204b, and 204c from the left, but the order may be from the right. In these cases, the difference in IDT electrodes lies only in the electrode structures, and in respect to the characteristics of the SAW filter, the same effect as in the case of FIG. B18 is obtainable.

In Embodiment B5, the number of couples of the IDT electrode 182a and the total of the number of couples of the first, second and third divisional IDT electrodes 184a, 184b, and 184c, respectively, are equal. However, they need not be exactly same number of couples, and the ratio of the number of couples of the first, second and third divisional IDT electrodes 184a, 184b, and 184c can be optionally set. Further, the number of division of the IDT electrode 183a is set to be 3, but the number may be other than that number. Furthermore, though the electric terminal for the IDT electrode 182a is exemplified to be of balanced type, either one of the upper electrode or the lower electrode may be grounded to make unbalanced electric terminal. In such a case, a SAW filter having balanced-unbalanced terminals can be constituted. There has been adopted a constitution wherein the reflector electrodes 182b and 183b, and 182c and 183c are electrically separated, but the two members may be connected and grounded. Furthermore, though it is designed for the IDT electrode 183a constituted by the divisional IDT electrode 184a, 184b and 184c to constitute the second SAW resonator, it may constitute a first SAW resonator, or both of them, and in such a case there can be realized a SAW filter capable of controlling the impedance of both input and output sides.

(Embodiment B6)

FIG. B21 shows a constitution view of an electric pattern of SAW filter according to Embodiment B6 of the present invention.

In FIG. B21, the part 211 is a single crystal piezoelectric substrate. By constituting a periodic structure strip line form electrode pattern on said piezoelectric substrate 211, SAW can be excited. On the piezoelectric substrate 211 there is formed a first SAW resonator of energy strage type constituted by an IDT electrode 212a and reflector electrodes 212b, 212c. Also, on the piezoelectric substrate 211 there is formed a second SAW resonator of energy strage type constituted by an IDT electrode 213a and reflector electrodes 213b, 213c.

The IDT electrode 213a which constitutes the second SAW resonator is constituted by the connection of the three groups of first, second and third divisional IDT electrodes 214a, 214b and 214c. The first, second and third divisional IDT electrodes 214a, 214b and 214c are all disposed in the same phase, and the upper electrode of the first divisional IDT electrode 214a and the upper electrode of the second divisional IDT electrode 214b are connected, and by the connection of the lower electrode of the second divisional IDT electrode 214b and the lower electrode of the third divisional IDT electrode 214c, an IDT electrode 213a which constitutes the second SAW resonator is formed. And, as these two first and second SAW resonators are disposed in nearby relations and acoustic couple is formed therebetween, a SAW filter is constituted.

Furthermore, the upper electrode and lower electrode of the IDT electrode 212a are respectively connected to the balanced type input terminals IN. Also, the upper electrode of the first divisional IDT electrode 214a and the upper electrode of the second divisional IDT electrode 214b which constitute the IDT electrode 213a are connected to one side of the balanced type output terminal T, and the lower electrode of the second divisional IDT electrode 214b and the lower electrode of the third divisional IDT electrode 214c are connected to the other side of the balanced type output terminal T, and the lower electrode of the first divisional IDT electrode 214a and the upper electrode of the third divisional IDT electrode 214c are grounded to form the balanced type input and output terminals.

In the SAW filter constituted as above, the first SAW resonator has the same construction as that of the SAW resonator of the embodiment B5, and the second SAW resonator is different from that of the embodiment B5 only in respect of the electrode pattern and its connection method of the IDT electrode 213a of the former from that of the IDT 183a of the latter. Even in this case, the electric charges on the divisional IDT electrodes 214a, 214b, and 214c are not mutually canceled but the SAWs formed by the divisional IDT electrodes 214a, 214b, and 214c are of the same phase, and the second SAW resonator has the same resonance characteristics as the first SAW resonator. Therefore, by disposing the first SAW resonator and the second SAW resonator nearby to each other, the SAW filter of this Embodiment B6 operates as a conventional lateral mode combined resonator type filter, in the same manner as in Embodiment B5. Additionally, the SAW filter having balanced type input and output possesses excellent characteristics of extra-band selectivity with narrow band, and can control the input and output impedance of SAW filter, thus giving the same effect as the SAW filter of the embodiment B5.

In the embodiment B6, the divisional IDT electrodes 214a, 214b, and 214c are designated as 214a, 214b, and 214c from the left side, but this sequence may be taken from the right side. Alternatively, the divisional number of IDT electrode 213a which is given as 3 may be set to any other number. The electric terminal of IDT electrode 212a which is exemplified as being of balanced type may be changed to unbalanced type electric terminal by grounding either the upper electrode or the lower electrode. In such a case, a SAW filter having balanced-unbalanced terminals can be constituted. Although the constitution is such that the reflector electrodes 212b and 213b, and 212c and 213c are electrically separated, the two members may be connected and grounded. Furthermore, though it is defined that the IDT electrode 213a constituted by the divisional IDT electrode 214a, 214b and 214c is to constitute the second SAW resonator, this may constitute a first SAW resonator, or both the first and second SAW resonators. In the latter case, a SAW filter capable of controlling the impedance's of both input and output can be realized.

(Embodiment B7)

In Embodiments B5 and B6, explanation has been given on the case of SAW filter of single stage constitution taken as examples. Such SAW filters may be used in multi-stage constitution.

FIG. B22 is an example of multi-stage constitution showing an electrode pattern constitution view of SAW filter according to Embodiment B7 of the present invention. In FIG. B22, the part 221 shows a single crystal piezoelectric substrate. When a plurality of SAW filters are cascade connected on the piezoelectric substrate 221 to constitute a multi-stage connection SAW filter, remarkable improvements are obtainable in the characteristics of rejection band and transition band, though some increase in the insertion loss occurs.

The two-stage cascade connected filter in FIG. B22 comprises a first SAW filter comprising a first SAW resonator constituted by an IDT electrode 222a and reflector electrodes 222b, 222c and a second SAW resonator constituted by an IDT electrode 223a and reflector electrodes 223b, 223c, which are disposed near to each other, and a second SAW filter comprising a third SAW resonator constituted by an IDT electrode 224a and reflector electrodes 224b, 224c and a fourth SAW resonator constituted by an IDT electrode 225a and reflector electrodes 225b, 225c, which are disposed near to each other, being formed on the piezoelectric substrate 221. The IDT electrode 225a constituting the fourth SAW resonator in the second SAW filter is composed by connecting the three groups of the first, second, and third divisional IDT electrodes 226a, 226b and 226c. The first divisional IDT electrode 226a and the second divisional IDT electrode 226b are disposed in reverse phase, and the second divisional IDT electrode 226b and the third divisional IDT electrode 226c are disposed in same phase. Then, the lower electrode of the first divisional IDT electrode 226a and the upper electrode of the second divisional IDT electrode 226b are mutually connected, and the lower electrode of the second divisional IDT electrode 226b and the lower electrode of the third divisional IDT electrode 226c are connected, by which an IDT electrode 225a which constitutes the fourth SAW resonator is formed. One of the leading out electrodes on the output side of the first stage SAW filter is connected to the opposite leading out electrode on the input side of the opposite next stage SAW filter by an inter-stage connecting electrode pattern 227a, and another first stage IDT electrode on the output side is connected to another next stage IDT electrode on the input side by an inter-stage connecting electrode pattern 227b, by which a two-stage SAW filter is formed.

Furthermore, the upper electrode and the lower electrode of the IDT electrode 222a which constitutes the first SAW resonator in the first SAW filter are connected respectively to the balanced type input terminal S. Also, in the IDT electrode 225a which constitutes the fourth SAW resonator in the second SAW filter, the lower electrode of the first divisional IDT electrode 226a and the upper electrode of the second divisional IDT electrode 226b are connected to one side of the balanced type output terminal T, the lower electrode of the second divisional IDT electrode 226b and the lower electrode of the third divisional IDT electrode 225c are connected to the other side of the balanced type output terminal T, and the upper electrode of the first divisional IDT electrode 226a and the upper electrode of the third divisional IDT electrode 226c are grounded to form a balanced type input and output terminal.

However, there may be cases where the purported good transmission characteristics cannot be obtained by a simple vertical connection of the SAW filters, due to the non-matching of the input and output impedance's of stages. In such a case, a reactance element such as inductor may be connected as a matching element to the inter-stage connection electrode to make adjustment. Alternatively, there may be adopted such a constitution as to form a reactance element represented by a spiral inductor on the same piezoelectric substrate 221 or on a separate substrate and connect it to the inter-stage connection electrode, by which size reduction of the filter circuit can be easily realized without requiring extra space. With respect to the reactance element for adjustment, connection may be made to either one of the first inter-stage connection electrode pattern 227a or 227b, and other inter-stage electrode connecting pattern may be grounded. According to the experiment, as shown in FIG. B22, connection of the reactance element 228 to the inter-stage connection electrode pattern 227a proved to give improvement to the symmetry of filter transmission characteristics.

By the above constitution, the SAW filter having balanced type input and output in this Embodiment B7 shows narrow band characteristics, and by connecting two SAW filters by inter-stage connection electrode patterns 227a, 227b, the extra-band selectivity comes to show more acute characteristic than in the case of a single stage, and also it becomes possible to control the output impedance of the SAW filter.

In the embodiment B7, in the IDT electrode 225a constituting the fourth SAW resonator in the second SAW filter, the first, second and third divisional IDT electrodes 226a, 226b, and 226c which constitute the IDT electrode 225a are designated as 226a, 226b, and 226c from the left side facing the drawing, but this sequence may be taken from the right side. The electrode pattern of the IDT electrode 225a may be reversed upside down.

In this Embodiment B7, the divisional number of IDT electrode 225a is given as 3, but it may be set to any other number. The electric terminal of IDT electrode 222a which is exemplified as being of balanced type may be changed to unbalanced type electric terminal by grounding either the upper electrode or the lower electrode. In such a case, a SAW filter having balanced-unbalanced terminals can be constituted. The IDT electrode 225a may be an IDT electrode 213a shown in Embodiment B6. In these cases, the IDT electrode 234a is different only in electrode constitution, and as to the SAW filter characteristic, the same effect as in FIG. B22 can be obtained. Though there is adopted such constitution that the reflector electrodes 222b and 223b, and 222c and 223c are electrically separated, the two members may be connected and grounded. Furthermore, though it is defined that the IDT electrode 225a constituted by the divisional IDT electrode 226a, 226b and 226c is to constitute the fourth SAW resonator, this may constitute a first SAW resonator, or both the first and fourth SAW resonators. In the latter case, a SAW filter capable of controlling the impedance s of both input and output can be realized. Also, the number of stages of SAW is shown as two stages, but the number may be larger, in which case the filter characteristics are acute, with more excellent extra-band selectivity.

(Embodiment B8)

FIG. B23 shows a constitution view of an electrode pattern of SAW filter according to Embodiment B8 of the present invention. In FIG. B23, the part 231 is a single crystal piezoelectric substrate. By forming an electrode pattern on said piezoelectric substrate 231, SAW can be excited. On the piezoelectric substrate 231 there is formed a first SAW resonator of energy strage type constituted by an IDT electrode 232a and reflector electrodes 232b, 232c. Also, on the piezoelectric substrate 231 there is formed a third SAW resonator constituted by an IDT electrode 234a and reflector electrodes 234b, 234c. The electrode part 233a of the second SAW resonator formed between the first SAW resonator and the third SAW resonator, accompanied with reflector electrodes 233b, 233c, has the same construction as the reflector electrode. In this way, even when the structure of the electrode part 233a of the second SAW resonator is not the IDT electrode structure but a periodic structure strip line electrode row, if the electrode period is the same, SAW can be propagated in exactly the same manner, so that the acoustic behaviors of the second SAW resonator disposed at the central part make no difference from those of the case of IDT electrode structure.

Furthermore, the IDT electrode 234a which constitute the third SAW is constituted by the connection of the three groups of first, second and third divisional IDT electrodes 235a, 235b and 235c. The first divisional IDT electrode 235a and the second divisional IDT electrode 235b are disposed in reverse phases; the second divisional IDT electrode 235b and the third divisional IDT electrode 235c are disposed in the same phase; the lower electrode of the first divisional IDT electrode 235a and the upper electrode of the second divisional IDT electrode 235b are connected; and the lower electrode of the second divisional IDT electrode 235b and the lower electrode of the third divisional IDT electrode 235c are connected to form an IDT electrode 234a which constitutes the third SAW resonator.

The above three SAW resonators are disposed in nearby relations one another, and the bus bar electrodes of the mutually adjacent parts are electrically independent. The upper electrode and the lower electrode of IDT electrode 232a which constitutes the first SAW resonator in the first SAW filter are connected respectively to the balanced type input terminals. Also, in the IDT electrode 234a which constitutes the third SAW resonator, the lower electrode of the first divisional IDT electrode 235a which constitutes the IDT electrode 234a and the upper electrode of the second divisional IDT electrode 235b are connected to one side of the balanced type output terminal T, and the lower electrode of the second divisional IDT electrode 235b and the lower electrode of the third divisional IDT electrode 235c are connected to the other side of the balanced type output terminal T, and the upper electrode of the first divisional IDT electrode 235a and the upper electrode of the third divisional IDT electrode 235c are grounded to form a balanced type input and output terminal, and the periodic structured strip line electrode line 233a in the second SAW resonator is grounded.

As described above, the SAW filter according to this Embodiment B8 is characterized by realizing a filter characteristic by disposing the three SAW resonators nearby in parallel with the direction of propagation of the SAW to make acoustic couple.

At this time, the SAW filter is a substitution of the IDT electrode 233a which constitutes the second SAW resonator in the SAW filter of the present invention for the IDT electrode in the SAW multi-mode filter of Japanese Patent Kokai Publication No. 8-51334 published by the present inventors, and it shows the same operation as that described in said Publication No. 8-51334. Namely, by making the SAW resonator in three stages, the filter can have wide band width, and characteristics excellent in extra-band selectivity, and also can control the output impedance of the SAW filter.

In the embodiment B8, in the IDT electrode 234a constituting the third SAW resonator, the first, second and third divisional IDT electrodes 235a, 235b, and 235c which constitute the IDT electrode 234a are designated as 235a, 235b, and 235c from the left side facing the drawing, but this sequence may be taken from the right side. The electrode pattern of the IDT electrode 234a may be reversed upside down. The IDT electrode 234a maybe the IDT electrode 213a of the constitution shown in Embodiment B6. In these cases, the IDT electrode 234a is different only in electrode constitution, and as to the SAW filter characteristic, the same effect as in FIG. B23 can be obtained.

Also, the divisional number of IDT electrode 234a is given as 3, but it may be set to any other number. The electric terminal of IDT electrode 232a which is exemplified as being of balanced type may be changed to unbalanced type electric terminal by grounding either the upper electrode or the lower electrode. In such a case, a SAW filter having balanced-unbalanced terminals can be constituted. Though there is adopted such constitution that the reflector electrodes 232b and 233b, and 232c and 233c are electrically separated, the two members may be connected and grounded. Furthermore, though it is defined that the IDT electrode 234a constituted by the divisional IDT electrode 235a, 235b and 235c is to constitute the third SAW resonator, this may constitute a first SAW resonator, or both the first and third SAW resonators. In the latter case, a SAW filter capable of controlling the impedance's of both input and output can be realized.

In this Embodiment B8, the IDT electrode 233a is described as being grounded through the electrode pattern provided in the space between the IDT electrode 232a and the reflector electrode 233c on the right side thereof. However, it may be grounded through the electrode pattern provided in the space between the IDT electrode 233a and the reflector electrode 233a on the left side thereof, or alternatively it may be grounded through the electrode pattern provided in the space between the IDT electrode 234a and either one of the reflector electrode 234b or 234c. Though there is adopted such constitution that the reflector electrodes 232b and 233b and 234b, and 232c and 233c and 234c are electrically separated on each SAW resonator, they may be respectively connected and grounded. Furthermore, the IDT electrode 233a may be grounded through any of the reflector electrodes 232b, 232c, 233b, 233c, 234b, and 234c. The IDT electrode 233a may be of the electrode structure of the same constitution as that of the IDT electrode 232a. In this case also, propagation of SAW is performed in the same manner, and the similar characteristic as that of the SAW filter of this Embodiment B8 is obtainable. Furthermore, though it is described that the divisional IDT electrode 234a is to constitute a third SAW resonator, it may be constituted by a first SAW resonator, or both of them. In the latter case, a SAW filter capable of controlling the impedance's of both input and output can be realized. Although the first to the third SAW resonators are shown to be of the same constitution, they need not necessarily be the same. The SAW filters of Embodiment B8 may be of two stage vertical connection, in which case the extra-band selectivity characteristic becomes further acute.

As to the piezoelectric substrate in the present invention, use of an ST cut crystal having excellent temperature characteristics is preferable, but there may be used as substrates $LiTaO_3$, $LiNbO_3$, $Li_2B_4O_7$, $La_3Ga_5SiO_{14}$ and the like. As an electrode material, use of relatively low density aluminum whose film thickness control is easy is preferable, but use of gold electrode is also possible.

Furthermore, the present invention is applicable to resonators using not only the SAW described above but also SSBW (Surface Skimming Balk Wave) which is one of the SAW or Pseudo surface waves, and the like.

Furthermore the present invention may be following related invention.

Namely, the $1^{st}$ related invention is a surface acoustic wave filter on a piezoelectric substrate comprising first and second surface acoustic wave resonators each having a reflector electrode on both sides of an IDT electrode as an inter-digital transducer electrode, said resonators being disposed nearby in positions in which directions of propagation of respective surface acoustic waves are parallel with each other and acoustically coupled, an inside bus bar electrode included in the first IDT electrode of the first surface acoustic wave resonator and an inside bus bar electrode included in the second IDT electrode of the second surface acoustic wave resonator being mutually electrically separated, said first IDT electrode being connected to a balanced type input terminal, and said second IDT electrode being connected to a balanced type output terminal, one terminal of said balanced type input terminal being electrically connected to leading out electrodes led out directly or indirectly from at least two places of the inside bus bar electrode of said first IDT electrode, and one terminal of said balanced type output terminal being electrically connected to leading out electrodes led out directly or indirectly from at least two places of the inside bus bar electrode of said second IDT electrode, thereby performing balanced operation.

The $2^{nd}$ related invention is a surface acoustic wave filter according to $1^{st}$ related invention, wherein the leading out electrode is formed in a space between the IDT electrode and said reflector electrode.

The $3^{rd}$ related invention is a surface acoustic wave filter according to $1^{st}$ related invention, wherein the two leading out electrodes formed in a space between the IDT electrode and said reflector electrode are connected to make one terminal of said balanced type input terminal or one terminal of said balanced type output terminal, and to make the outside bus bar electrode included in said IDT electrode the other terminal of said balanced type input terminal or said balanced type output terminal.

The $4^{th}$ related invention is a surface acoustic wave filter according to $1^{st}$ related invention, wherein the area between the two leading out electrodes formed in a space between the IDT electrode and said reflector electrode is connected by a wiring pattern having a wider line width than the width of said leading out electrodes formed on said piezoelectric substrate, the further expanded position in said wiring pattern is a connection land as one terminal of said balanced type input terminal or as one terminal of said balanced type output terminal, and the position of extension in outward direction of the outside bus bar electrode included in said IDT electrode is the connection land as the other terminal of said balanced type input terminal or as the other terminal of said balanced type output terminal.

The $5^{th}$ related invention is a multi-stage surface acoustic wave filter comprising a plurality of stages of the surface acoustic wave filters of $2^{nd}$ related invention formed on a same piezoelectric substrate, one of the leading out electrodes on the output side of the front stage surface acoustic wave filter being connected to the opposed leading out electrodes on the input side of the next stage, the other of the leading out electrodes on the output side of the front stage surface acoustic wave filter being connected to the opposed leading out electrodes on the input side of the next stage, and remaining one output side electrode of said front stage surface acoustic wave filter being connected to remaining one input side electrode of said next stage surface acoustic wave filter.

The $6^{th}$ related invention is a multi-stage surface acoustic wave filter comprising a plurality of stages of the surface acoustic wave filters of $2^{nd}$ related invention formed on a same piezoelectric substrate, one of the leading out electrodes on the output side of the front stage surface acoustic wave filter and the opposed leading out electrodes on the input side of the next stage, and the other of the leading out electrodes on the output side of the front stage surface acoustic wave filter and the opposed leading out electrodes on the input side of the next stage, being connected respectively by a first inter-stage connecting electrode having a wider width than a width of said leading out electrode, remaining one output side electrode of said front stage surface acoustic wave filter and remaining one input side electrode of said next stage surface acoustic wave filer being connected respectively by a second inter-stage connecting electrode having a wider width than the width of said leading out electrode, space between the two leading out electrodes on the input side of the first stage surface acoustic wave filter being connected by a wiring pattern having a line path width wider than the width of said leading out electrode formed on said piezoelectric substrate, a further expanded part in said wiring pattern being a connecting land as one terminal of said balanced type input terminals, and an outwardly expanded part of said outside bus bar electrode included in said IDT electrode of said first stage surface acoustic wave filter being a connecting land as the other terminal of said balanced type input terminals, and space between the two leading out electrodes on the output side of the last stage surface acoustic wave filter being connected by a wiring pattern having a line path width wider than the width of said leading out electrode formed on said piezoelectric substrate, a further expanded part in said wiring pattern being a connecting land as one terminal of said balanced type output terminals, and an outwardly expanded part of said outside bus bar electrode included in said IDT electrode of said last stage surface acoustic wave filter being a connecting land as the other terminal of said balanced type output terminals.

The $7^{th}$ related invention is a multi-stage surface acoustic wave filter according to $6^{th}$ related invention, wherein the space between the first and second inter-stage connection electrodes is connected through the reactance element.

The $8^{th}$ related invention is a multi-stage surface acoustic wave filter according to $6^{th}$ related invention, wherein, of the first and second inter-stage connection electrodes, one is grounded and the other is grounded through the reactance element.

The $9^{th}$ related invention is a multi-stage surface acoustic wave filter according to $6^{th}$ related invention, wherein said first inter-stage connection electrode is grounded through the reactance element, and the second inter-stage connection electrode is grounded.

The $10^{th}$ related invention is a surface acoustic wave filter on a piezoelectric substrate comprising a first surface acoustic wave resonator having reflector electrodes on both sides of a first IDT electrode for exciting a surface acoustic wave and a second surface acoustic wave resonator having reflector electrodes on both sides of a second IDT electrode being disposed nearby to each other in the positions in which a propagation direction of the respective surface acoustic waves becomes parallel and acoustically coupled, an inside first bus bar electrode included in said first IDT electrode and an inside second bus bar electrode included in said second IDT electrode being mutually separated and disposed in opposed manner, one input terminal of balanced type input terminals, said one input terminal being constructed by using an electrical connection between leading out electrodes led out from at least two places on said inside first bus bar electrode, and one output terminal of balanced type output terminals said one input terminal being constructed by using an electrical connection between leading out electrodes led out from at least two places on said inside second bus bar electrode, thereby performing balanced operation.

The 11$^{th}$ related invention is a surface acoustic wave filter comprising first and third surface acoustic wave resonators each having a reflector electrode on both sides of an IDT electrode as an inter-digital transducer electrode, said resonators being disposed in positions in which the directions of propagation of the respective surface acoustic waves are parallel with each other, a plurality of strip line electrodes having substantially the same length as the crossing width of the electrode fingers of the IDT electrodes being disposed in parallel between said first and third surface acoustic wave resonators in the same electrode period as those of the first and third surface acoustic wave resonators, both end parts of said plural strip line electrodes being connected one another by bus bar electrodes to form a second surface acoustic wave resonator comprising periodic structured electrode rows, said first, second, and third surface acoustic wave resonators being disposed nearby to one another to make acoustic couple, and a first and second leading out electrodes to constitute a part of the balanced type input terminal being formed in a gap between the reflector electrodes on both sides in the outside direction from both ends of the inside bus bar electrode of the IDT electrode of the first surface acoustic wave resonator, and a third and fourth leading out electrodes to constitute a part of the balanced type output terminal being formed in a gap between the reflector electrodes on both sides in the outside direction from both ends of the inside bus bar electrode of the IDT electrode of the third surface acoustic wave resonator, thereby making balanced operation.

The 12$^{th}$ related invention is a surface acoustic wave filter according to 11$^{th}$ related invention, wherein said first and second leading out electrodes of said surface acoustic wave resonators are connected to make one input terminal of the balanced type input terminal, a bus bar electrode on the outside of the IDT electrode of said first surface acoustic wave resonator is made the other input terminal of the balanced type input terminal, said third and fourth leading out electrodes of said third surface acoustic wave resonator are connected to make one output terminal of the balanced type output terminal, and a bus bar electrode on the outside of the IDT electrode of said third surface acoustic wave resonator is made the other output terminal of the balanced type output terminal.

The 13$^{th}$ related invention is a surface acoustic wave filter according to 11$^{th}$ related invention, wherein space between said first and second leading out electrodes of said surface acoustic wave resonators is connected by a wiring pattern having a line path width wider than the width of the leading out electrode formed on the piezoelectric substrate, a part of said wiring pattern is further expanded to form a connection land of one part of the balanced type input terminals, and a bus bar electrode on the outside of the IDT electrode of the first surface acoustic wave resonators is expanded in the external direction to form a connection land of the other part of the balanced type input terminals, spece between the third and the fourth leading out electrodes of said third surface acoustic wave resonators is connected by a wiring pattern having a line path width wider than the width of said leading out electrode, a part of said wiring pattern is further expanded to form a connection land of one part of the balanced type output terminals of the balanced type output terminal, and a bus bar electrode on the outside of the IDT electrode of the third surface acoustic wave resonators is expanded in the external direction to form a connection land of the other part of the balanced type input terminals.

The 14$^{th}$ related invention is a multi-stage surface acoustic wave filter comprising a plurality of stages of the surface acoustic wave filters of 12$^{nd}$ related invention on a same piezoelectric substrate, said third and fourth leading out electrodes of the front stage surface acoustic wave filter being connected to the opposed first and second leading out electrodes of the surface acoustic wave filters of the next stage, respectively, with the remaining output side electrode of said front stage surface acoustic wave filter being connected to the remaining input side electrode of said next stage surface acoustic wave filter.

The 15th related invention is a multi-stage surface acoustic wave filter comprising:

a plurality of stages of the surface acoustic wave filters of 12$^{th}$ related invention formed on a same piezoelectric substrate, the third and fourth leading out electrodes of the front stage surface acoustic wave filter and the opposed leading out electrodes of the next stage, being connected by a first inter-stage connecting electrode having a wider width than the width of said leading out electrode on said piezoelectric substrate, another output side electrode and input side electrode of said front stage and next stage being connected by a second inter-stage connecting electrode having a wider width than the width of said leading out electrode, space between the first and second leading out electrodes of the first stage surface acoustic wave filter being connected by a wiring pattern having a line path width wider than the width of said leading out electrode formed on said piezoelectric substrate, a part of said wiring pattern being further expanded to form a connecting land for one of said balanced type input terminals, and an outside bus bar electrode of IDT electrode of said first stage surface acoustic wave filter being outwardly expanded to form the other connecting land of balanced type input terminals, and space between the third and fourth leading out electrodes of the last stage surface acoustic wave filter being connected by a wiring pattern having a line path width wider than the width of said leading out electrode formed on said piezoelectric substrate, and a part of said wiring pattern being further expanded to form a connecting land for one of the balanced type output terminals, and a part of said outside bus bar electrode on the outside of IDT electrode of said last stage surface acoustic wave filter being outwardly expanded to form a connecting land for the other of the balanced type output terminals.

The 16th related invention is a multi-stage surface acoustic wave filter according to 15th related invention, wherein the area between the first and the second inter-stage connecting electrodes is connected through a reactance element.

The 17th related invention is a multi-stage surface acoustic wave filter according to 15th related invention, wherein, of the first and the second inter-stage connecting electrodes, one is grounded and the other is grounded through a reactance element.

The 18th related invention is a multi-stage surface acoustic wave filter according to 15th related invention, wherein said first inter-stage connecting electrode is grounded through the reactance element, and the second inter-stage connecting electrode is grounded.

The 19th related invention is a surface acoustic wave filter according to 11st related invention, wherein said two surface acoustic wave resonators are of the constructions possessing reflector electrodes on both sides of the IDT electrode, of substantially the same configurations as the first and third surface acoustic wave resonators, and said IDT electrodes are grounded.

The 20th related invention is a surface acoustic wave filter according to 14th related invention, wherein said two surface acoustic wave resonators are of the constructions possessing reflector electrodes on both sides of the IDT electrode, of substantially the same configurations as the first and third surface acoustic wave resonators, and said IDT electrodes are grounded.

The 21st related invention is a surface acoustic wave filter on a piezoelectric substrate comprising a first surface acoustic wave resonator having reflector electrodes on both sides of a first electrode for exciting a surface acoustic wave and a third surface acoustic wave resonator having reflector electrodes on both sides of the third electrode being disposed each other in the positions in which a propagation direction of the respective surface acoustic waves becomes parallel, the first bus bar electrode included in said first electrode and the third bus bar electrode included in said third electrode being mutually separated and disposed in opposed manner, a second surface acoustic wave resonator having a plurality of strip line electrodes, an electrode for connecting the one end parts of both ends of those plural strip line electrodes, and electrodes for connecting the other end parts, being formed between the opposed first bus bar electrode and third bus bar electrodes, said first surface acoustic wave resonator and said third surface acoustic wave resonator being disposed nearby to each other to the second surface acoustic wave resonator and acoustically coupled, one input terminal of balanced type input terminals, said one input terminal being constructed by using an electrical connection between leading out electrodes led out from at least two places on said first bus bar electrode, and one output terminal of balanced type output terminals said one input terminal being constructed by using an electrical connection between leading out electrodes led out from at least two places on said third bus bar electrode, thereby performing balanced operation.

The 22nd related invention is a surface acoustic wave filter on a piezoelectric substrate comprising first and third surface acoustic wave resonators each having a reflector electrode on both sides of an IDT electrode as an inter-digital transducer electrode, said resonators being disposed on a piezoelectric substrate in positions in which directions of propagation of the respective surface acoustic waves are parallel with each other, a plurality of strip line electrodes being disposed in parallel between said first and third surface acoustic wave resonators in the same electrode period as those of the first and third surface acoustic wave resonators, said plural strip line electrodes being connected one another by bus bar electrodes to form a second surface acoustic wave resonator having periodic structured electrode rows, said first and third surface acoustic wave resonators being disposed nearby to said second surface acoustic wave resonator to make acoustic couple, and the adjacent bus bar electrodes between said surface acoustic wave resonators being electrically separated, and all periodic structured electrodes of said second surface acoustic wave resonators being grounded, assuming that an electrode finger crossing width of IDT electrodes constituting the first and third surface acoustic wave resonators to be W1, and a strip line length of said periodic structured electrode rows constituting the second surface acoustic wave resonator to be W2, the relative size of W1 to W2 being set to 1<W2/W1.

The 23rd related invention is a surface acoustic wave filter on a piezoelectric substrate comprising first, second and third surface acoustic wave resonators each having a reflector electrode on both sides of an IDT electrode as an inter-digital transducer electrode, said resonators being disposed on a piezoelectric substrate in positions nearby to one another in which directions of propagation of the respective surface acoustic waves are parallel with each other to make acoustic couple, the adjacent bus bar electrodes between said surface acoustic wave resonators being electrically separated, and all said IDT electrodes of said second surface acoustic wave resonators provided between said first and third resonators being grounded, assuming that an electrode finger crossing width of IDT electrodes constituting the first and third surface acoustic wave resonators to be W1, and an electrode finger crossing width of the IDT electrodes of the second surface acoustic wave resonator to be W2, the relative size of W1 to W2 being set to 1<W2/W1.

The 24th related invention is a surface acoustic wave filter according to 22nd related invention, wherein the relative size of W1 to W2 is set to 1<W2/W1≦1.3.

The 25th related invention is a multi-stage surface acoustic wave filter wherein a plurality of surface acoustic wave filters according to 22nd related invention are cascade connected by the first and second inter-stage electrode patterns formed on the piezoelectric substrate.

The 26th related invention is a multi-stage surface acoustic wave filter according to 25th related invention, wherein, of the first and second inter-stage connected electrode patterns, one is directly grounded, and the other is grounded through a reactance element.

The 27th related invention is a multi-stage surface acoustic wave filter according to 25th related invention, wherein the first surface acoustic wave resonator electrode of the front stage surface acoustic wave filter is connected to the balanced type input terminal, and the third surface acoustic wave resonator electrode of the back stage surface acoustic wave filter is connected to the balanced type output terminal.

The 28$^{th}$ related invention is a surface acoustic wave filter on a piezoelectric substrate comprising at least two surface acoustic wave resonators each having a reflector electrode on both sides of an IDT electrode as an inter-digital transducer electrode, at least two of said resonators being disposed on a piezoelectric substrate in positions nearby to one another in which directions of propagation of the respective surface acoustic waves are parallel with one another to make acoustic couple, characterized in that, of plural electrode fingers included in at least one IDT electrode, at least a couple of adjacent electrode fingers are in reverse phase relations to each other, and said plural electrode fingers are connected so as not to cancel the respective electric charges.

The 29$^{th}$ related invention is a surface acoustic wave filter according to 29$^{th}$ related invention, wherein said IDT electrode has an inside bus bar electrode and an outside bus bar electrode, said pair of adjacent electrode fingers being in reverse phase relation means that (1) a pitch between said adjacent electrode fingers is (m+1/2)×λ (wherein λ wavelength of excited surface acoustic wave, and m=0, 1, 2, ... ) and both said adjacent electrode fingers are connected to the inside bus bar electrode, (2) a pitch between said adjacent electrode fingers is (m+1/2)×λ and both said adjacent electrode fingers connected to the outside bus bar electrode, or (3) a pitch between said adjacent electrode fingers is (m+1)×λ, one side electrode finger of both said adjacent electrode fingers is connected to said inside bus bar, and the other side electrode finger is connected to said outside bus bar electrode.

The 30$^{th}$ related invention is a surface acoustic wave filter according to 28$^{th}$ related invention, wherein said at least one IDT electrode is constituted by the first, second, and third divisional IDT electrodes, a pair of electrode fingers on the position in which said first divisional IDT electrode and said second divisional IDT electrode are adjacent are in reverse phase relations, and a pair of electrode fingers on the position in which said second divisional IDT electrode and said third divisional IDT electrode are adjacent are in same phase relations, and further, the outside bus bar electrode of the first divisional IDT electrode and the inside bus bar electrode of the second divisional IDT electrode are connected, and the outside bus bar electrode of the second divisional IDT electrode and the outside bus bar electrode of the third divisional IDT electrode are connected.

The 31$^{st}$ related invention is a surface acoustic wave filter according to 30$^{th}$ related invention, wherein said first, second, and third divisional IDT electrodes are divided into groups on the basis of the divisional point of the bus bar electrode held by said at least one IDT electrode, said pair of adjacent electrode fingers being in the same phase relation means that (1) a pitch between said adjacent electrode fingers is (m+1/2)×λ (wherein λ is wavelength of excited surface acoustic wave, and m=0, 1, 2, ... ), one side electrode finger of both said adjacent electrode fingers is connected to said inside bus bar, and the other side electrode finger is connected to said outside bus bar electrode, (2) a pitch between said adjacent electrode fingers is (m+1)×λ and both said adjacent electrode fingers are connected to the inside bus bar electrode, or (3) a pitch between said adjacent electrode fingers is (m+1)×λ and both said adjacent electrode fingers are connected to the outside bus bar electrode The 32$^{nd}$ related invention is a surface acoustic wave filter according to 28$^{th}$ related invention, wherein said at least one IDT electrode is constituted by the first, second, and third divisional IDT electrodes, a pair of electrode fingers on a position in which said first divisional IDT electrode and said second divisional IDT electrode are adjacent are in reverse phase relations, and a pair of electrode fingers on a position in which said second divisional IDT electrode and said third divisional IDT electrode are adjacent are in same phase relations, and further, the inside bus bar electrode of the first divisional IDT electrode and the outside bus bar electrode of the second divisional IDT electrode are connected, and the inside bus bar electrode of the second divisional IDT electrode and the inside bus bar electrode of the third divisional IDT electrode are connected.

The 33$^{rd}$ related invention is a surface acoustic wave filter on a piezoelectric substrate comprising at least two surface acoustic wave resonators each having a reflector electrode on both sides of an IDT electrode as an inter-digital transducer electrode, at least two of said resonators being disposed on a piezoelectric substrate in positions nearby to one another in which directions of propagation of the respective surface acoustic waves are parallel with one another to make acoustic couple, characterized in that, of the plural electrode fingers included in at least one IDT electrode, any pair of adjacent electrode fingers are in the same phase relations, and said plural electrode fingers are connected so as not to cancel the respective electric charges, said at least one IDT electrode is constituted by the first, second, and third divisional IDT electrodes, the inside bus bar electrode of the first divisional IDT electrode and the inside bus bar electrode of the second divisional IDT electrode are connected, and the outside bus bar electrode of the second divisional IDT electrode and the outside bus bar electrode of the third divisional IDT electrode are connected.

The 34$^{th}$ related invention is a surface acoustic wave filter according to 33$^{rd}$ related invention, wherein said pair of adjacent electrode fingers being in the same phase relation means that (1) a pitch between said adjacent electrode fingers is (m+1/2)×λ (wherein λ is wavelength of excited surface acoustic wave, and m=0, 1, 2, ... ), one side electrode finger of both said adjacent electrode fingers is connected to said inside bus bar, and the other side electrode finger is connected to said outside bus bar electrode, (2) a pitch between said adjacent electrode fingers is (m+1)×λ and both said adjacent electrode fingers are connected to the inside bus bar electrode, or (3) a pitch between said adjacent electrode fingers is (m+1)×λ and both said adjacent electrode fingers are connected to the outside bus bar electrode.

The 35$^{th}$ related invention is a surface acoustic wave filter according to 30$^{th}$ related invention, wherein the electric terminal of IDT electrode constituted by said divisional IDT electrode is of a balanced type.

The 36$^{th}$ related invention is a surface acoustic wave filter according to 30$^{th}$ related invention, wherein said inside electrode and said outside electrode of said second divisional IDT electrode are connected to the balanced type positive and negative electric terminals, respectively, and an electrode which is not connected to any of positive and negative electric terminals in the first and third divisional IDT electrodes is grounded.

The $37^{th}$ related invention is a surface acoustic wave filter according to $28^{th}$ related invention, wherein, by changing the divisional ratio of said divisional IDT electrode, the total capacity of said IDT electrode is made variable to control the input and output impedance's.

The $38^{th}$ related invention is a multi-stage surface acoustic wave filter on a piezoelectric substrate comprising two surface acoustic wave resonators each having a reflector electrode on both sides of an IDT electrode, a plurality of stages of said resonators being disposed on a piezoelectric substrate in positions nearby to one another in which directions of propagation of the respective surface acoustic waves are parallel with one another to make acoustic couple, characterized in that, of the plural electrode fingers included in at least one IDT electrode of upper IDT electrode of the top stage of said multi-stage acoustic wave filter and lower IDT electrode of the bottom stage of said multi-stage surface acoustic wave filter, at least a couple of adjacent electrode fingers are in reverse phase relations, and said plural electrode fingers are connected in such manner that the electric charges do not act to cancel one another.

The $39^{th}$ related invention is a multi-stage surface acoustic wave filter according to $38^{th}$ related invention, wherein at least one side IDT electrode is constituted by the first, second and third divisional IDT electrodes, a couple of electrode fingers in a position in which said first divisional IDT electrode and said second IDT electrode are adjacent to each other are in reverse phase relations, and a couple of electrode fingers in a position in which said second divisional IDT electrode and said third divisional IDT electrode are adjacent to each other are in the same phase relations, and further, the outside bus bar electrode of the first divisional IDT electrode and the inside bus bar electrode of the second divisional IDT electrode are connected, and the outside bus bar electrode of the second divisional IDT electrode and the outside bus bar electrode of the third divisional IDT electrode are connected.

The $40^{th}$ related invention is a multi-stage surface acoustic wave filter according to $38^{th}$ related invention, wherein at least one side IDT electrode is constituted by the first, second and third divisional IDT electrodes, a couple of electrode fingers in a position in which said first divisional IDT electrode and said second IDT electrode are adjacent to each other are in reverse phase relations, and a couple of electrode fingers in a position in which said second divisional IDT electrode and said third divisional IDT electrode are adjacent to each other are in the same phase relations, and further, the inside bus bar electrode of the first divisional IDT electrode and the outside bus bar electrode of the second divisional IDT electrode are connected, and the inside bus bar electrode of the second divisional IDT electrode and the inside bus bar electrode of the third divisional IDT electrode are connected.

The $41^{st}$ related invention is a multi-stage surface acoustic wave filter on a piezoelectric substrate comprising two surface acoustic wave resonators each having a reflector electrode on both sides of an IDT electrode, a plurality of stages of said resonators being cascade connected by an inter-stage connection electrode pattern, being disposed on a piezoelectric substrate in positions nearby to one another in which a directions of propagation of the respective surface acoustic waves are parallel with one another to make acoustic couple, characterized in that, of the plural electrode fingers included in at least one IDT electrode of upper IDT electrode of the top stage of said multi-stage surface acoustic wave filter and lower IDT electrode of the bottom stage of said multi-stage surface acoustic wave filter, any couple of adjacent electrode fingers are in the same phase relations, and said plural electrode fingers are connected so that the respective electric charges do not act to cancel one another, at least one side IDT electrode is constituted by the first, second and third divisional IDT electrodes, the inside bus bar electrode of the first divisional IDT electrode and the inside bus bar electrode of the second divisional IDT electrode are connected, and the outside bus bar electrode of the second divisional IDT electrode and the outside bus bar electrode of the third divisional IDT electrode are connected.

The $42^{nd}$ related invention is a multi-stage surface acoustic wave filter according to $39^{th}$ related invention, wherein the electric terminal of the IDT electrode constituted by said divisional IDT electrode is of a balanced type.

The $43^{rd}$ related invention is a multi-stage surface acoustic wave filter according to $39^{th}$ related invention, wherein said inside electrode and said outside electrode of said second divisional IDT electrode are connected to the balanced type positive and negative electric terminals, respectively, and an electrode which is not connected to any of positive and negative electric terminals in the first and third divisional IDT electrodes is grounded.

The $44^{th}$ related invention is a multi-stage surface acoustic wave filter according to $42^{nd}$ related invention, wherein said inter-stage connecting electrode patterns are provided in a plurality of stages, and one part of them are grounded, and others are grounded through a reactance element. The $45^{th}$ related invention is a surface acoustic wave filter comprising three acoustically coupled surface acoustic wave resonators with reflector electrodes provided on both sides of an IDT electrode on a piezoelectric substrate placed at locations close to one another where the respective surface acoustic wave propagation directions are parallel to one another, wherein of said three surface acoustic wave resonators, all the IDT electrodes constituting said surface acoustic wave resonator located in the center are electrically grounded, the IDT electrodes constituting said surface acoustic wave resonators located outside are made electrically independent and of a plurality of electrode fingers included in the IDT electrode of at least one of said surface acoustic wave resonators located outside, at least one pair of the adjacent electrode fingers are in an reverse phase relationship and said plurality of electrode fingers is connected in such a way that the respective charges do not cancel out each other.

The $46^{th}$ related invention is a multi-stage surface acoustic wave filter comprising a plurality of stages of surface acoustic wave filters according to $45^{th}$ related invention connected in vertical stages by a plurality of inter-stage connecting electrode patterns formed on a piezoelectric substrate.

The $47^{th}$ related invention is a surface acoustic wave filter according to $15^{th}$ related invention, wherein said two surface acoustic wave resonators are of the constructions possessing reflector electrodes on both sides of the IDT electrode, of substantially the same configurations as the first and third surface acoustic wave resonators, and said IDT electrodes are grounded.

As is apparent from the above-described explanations, the present invention can provide a surface acoustic wave filter and communication apparatus with optimal balancing and capable of controlling input/output impedance.

The present invention can also provide an inter-digital transducer, surface acoustic wave filter and communication apparatus having desired input/output impedance.

What is claimed is:

1. An inter-digital transducer comprising:

a piezoelectric substrate; and an IDT (inter-digital transducer) electrode having a pair of upper bus bar electrode and lower bus bar electrode placed facing each other on said piezoelectric substrate and a plurality of electrode fingers placed on said piezoelectric substrate each being led out from either said upper bus bar electrode or said lower bus bar electrode toward the other bus bar electrode, wherein said IDT electrode is constructed of a plurality of divisional IDT electrodes and connected to a balanced type terminal, wherein said plurality of divisional IDT electrodes includes at least three divisional IDT electrodes, and wherein the ratio in the number of electrode fingers among said plurality of divisional IDT electrodes is adjusted beforehand so as to have a predetermined impedance value.

2. An inter-digital transducer comprising:

a piezoelectric substrate; and an IDT (inter-digital transducer) electrode having a pair of upper bus bar electrode and lower bus bar electrode placed facing each other on said piezoelectric substrate and a plurality of electrode fingers placed on said piezoelectric substrate each being led out from either said upper bus bar electrode or said lower bus bar electrode toward the other bus bar electrode, wherein said IDT electrode is constructed of a plurality of divisional IDT electrodes and connected to a balanced type terminal, wherein at least two of said plurality of divisional IDT electrodes are equivalently connected in series and at least one of the remaining divisional IDT electrodes is connected in parallel with said at least two divisional IDT electrodes, and wherein the ratio in the number of electrode fingers among said plurality of divisional IDT electrodes is adjusted beforehand so as to have a predetermined impedance value.

3. A communication apparatus comprising:

a transmission circuit that outputs transmission waves; and a reception circuit that receives reception waves, wherein the surface acoustic wave filter used for said transmission circuit and/or said reception circuit is the inter-digital transducer according to claim 1 or 2.

4. The inter-digital transducer according to claim 1 or 2 wherein said plurality of divisional IDT electrodes is placed in an same/reverse phase relationship so that charges of the divisional IDT electrodes do not cancel out each other.

5. The inter-digital transducer according to claim 4, wherein said plurality of divisional IDT electrodes is constructed of first, second and third divisional LDT electrodes.

6. The inter-digital transducer according to claim 5, wherein said second divisional IDT electrode is placed in in same phase relationship between said first divisional LDT electrode and said third divisional IDT electrode, the part of said upper bus bar electrode corresponding to said first divisional IDT electrode and the part of said upper bus bar electrode corresponding to said second divisional IDT electrode are connected to one end of said balanced type terminal, and the part of said lower bus bar electrode corresponding to said second divisional IDT electrode and the part of said lower bus bar electrode corresponding to said third divisional IDT electrode are connected to the other end of said balanced type terminal.

7. The inter-digital transducer according to claim 6, wherein said same phase relationship is a relationship between a pair of said mutually adjacent electrode fingers and that a pair of said mutually adjacent electrode fingers have an same phase relationship means (1) a connection relationship in which the pitch between said pair of mutually adjacent electrode fingers is $(m+1/2) \times \lambda$ (here, m=0 1, 2, 3, . . . , where $\lambda$ is a wavelength of an excited surface acoustic wave) and of those electrode fingers, one electrode digit is connected to said upper bus bar electrode and the other electrode digit is connected to the lower bus bar electrode, or (2) a connection relationship in which the pitch between said pair of mutually adjacent electrode fingers is $(m+1)+\lambda$ and both electrode fingers are connected to said upper bus bar electrode, or (3) a connection relationship in which the pitch between said pair of mutually adjacent electrode fingers is $(m+1)+\lambda$ and both electrode fingers are connected to said lower bus bar electrode.

8. The inter-digital transducer according to claim 7, wherein substantially all adjacent pairs of electrode fingers of said plurality of electrode fingers have an same phase relationship and said substantially all of the plurality of electrode fingers is connected so that charges of the electrode fingers do not cancel out each other.

9. The inter-digital transducer according to claim 6, wherein both the part of said lower bus bar electrode corresponding to said first divisional IDT electrode and the part of said upper bus bar electrode corresponding to said third divisional IDT electrode are grounded.

10. The inter-digital transducer according to claim 6, wherein the part of said lower bus bar electrode corresponding to said first divisional IDT electrode is connected to the part of said upper bus bar electrode corresponding to said third divisional IDT electrode.

11. The inter-digital transducer according to claim 5, wherein said second divisional IDT electrode is placed between said first divisional IDT electrode and said third divisional IDT electrode, the part of said lower bus bar electrode corresponding to said first divisional IDT electrode is connected to the part of said upper bus bar electrode corresponding to said second divisional IDT electrode, and the part of said lower bus bar electrode corresponding to said second divisional IDT electrode is connected to the part of said lower bus bar electrode corresponding to said third divisional IDT electrode.

12. The inter-digital transducer according to claim 11, wherein adjacent electrode fingers of said first divisional IDT electrode and said second divisional IDT electrode have an reverse phase relationship, adjacent electrode fingers of said second divisional IDT electrode and said third divisional IDT electrode have an same phase relationship and said substantially all of the plurality of electrode fingers is connected so that respective charges do not cancel out each other.

13. The inter-digital transducer according to claim 12, wherein that said pair of electrode fingers have an same phase relationship refers to a relationship when said pair of electrode fingers are mutually adjacent and (1) a connection relationship in which the pitch between said pair of mutually adjacent electrode fingers is $(m+1/2)\times\lambda$ (here, m=0, 1, 2, 3, . . . , where $\lambda$ is a wavelength of an excited surface acoustic wave) and of those electrode fingers, one electrode digit is connected to said upper bus bar electrode and the other electrode digit is connected to the lower bus bar electrode, or (2) a connection relationship in which the pitch between said pair of mutually adjacent electrode fingers is $(m+1)\times\lambda$ and both electrode fingers are connected to said upper bus bar electrode, or (3) a connection relationship in which the pitch between said pair of mutually adjacent electrode fingers is $(m+1)\times\lambda$ and both electrode fingers are connected to said lower bus bar electrode, and that said pair of electrode fingers have an reverse phase relationship refers to a relationship when said pair of electrode fingers are mutually adjacent and (4) a connection relationship in which the pitch between said pair of mutually adjacent electrode fingers is $(m+1/2)\times\lambda$ (here, m=0, 1,2, 3, . . . , where $\lambda$ is a wavelength of an excited surface acoustic wave) and both electrode fingers are connected to said upper bus bar electrode, or (5) a connection relationship in which the pitch between said pair of mutually adjacent electrode fingers is $(m+1/2)\times\lambda$ and both electrode fingers are connected to said lower bus bar electrode, or (6) a connection relationship in which the pitch between said pair of mutually adjacent electrode fingers is $(m+1)\times\lambda$ and of those electrode fingers, one electrode digit is connected to said upper bus bar electrode and the other electrode digit is connected to the lower bus bar electrode.

14. The inter-digital transducer according to claim 11, wherein both the upper bus bar electrode of said first divisional IDT electrode and the lower bus bar electrode of said third divisional IDT electrode are grounded.

15. The inter-digital transducer according to claim 11, wherein the upper bus bar electrode of said first divisional IDT electrode is connected to the lower bus bar electrode of said third divisional IDT electrode.

16. A surface acoustic wave filter comprising:

a piezoelectric substrate;

three IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and at least two reflector electrodes, said surface acoustic wave filter being a longitudinally coupled mode type surface acoustic wave filter in which said three IDT electrodes and said at least two reflector electrodes are placed in the propagation directions of surface acoustic waves, wherein at least one of said three IDT electrodes is the IDT electrode of the inter-digital transducer according to claim 5, the part of said upper bus bar electrode of said IDT electrode of said inter-digital transducer corresponding to said first divisional IDT electrode and/or the part of said upper bus bar electrode of said IDT electrode corresponding to said second divisional IDT electrode are connected to one end of said balanced type terminal of said inter-digital transducer, the part of said lower bus bar electrode of said LDT electrode of said inter-digital transducer corresponding to said second divisional IDT electrode and/or the part of said lower bus bar electrode of said IDT electrode corresponding to said third divisional IDT electrode are connected to the other end of said balanced type terminal of said inter-digital transducer, and said piezoelectric substrate is the piezoelectric substrate of said inter-digital transducer.

17. The surface acoustic wave filter according to claim 16, wherein said three IDT electrodes are first, second and third IDT electrodes, said second IDT electrode and said third IDT electrode are placed on both sides of said first IDT electrode respectively, said reflector electrodes are placed opposite said first IDT electrode of said second IDT electrode and opposite said first IDT electrode of said third IDT electrode respectively, and said first IDT electrode is the IDT electrode of said inter-digital transducer.

18. The surface acoustic wave filter according to claim 17, wherein the upper bus bar electrode of said second IDT electrode is connected to an unbalanced type terminal and the lower bus bar electrode is grounded and the lower bus bar electrode of said third IDT electrode is connected to said unbalanced type terminal and the upper bus bar electrode is grounded.

19. The surface acoustic wave filter according to claim 16, wherein a surface acoustic wave resonator is connected in series to and/or in parallel with at least two of said IDT electrodes.

20. A surface acoustic wave filter comprising:

a piezoelectric substrate;

a plurality of longitudinally coupled mode type surface acoustic wave filters having a plurality of IDT electrodes and a plurality of reflector electrodes placed on said piezoelectric substrate, wherein said plurality of surface acoustic wave filters are connected in multiple stages, of said plurality of surface acoustic wave filters, at least the surface acoustic wave filters on the input side and/or the surface acoustic wave filters on the output side are the surface acoustic wave filters according to claim 16, and said piezoelectric substrates of at least the surface acoustic wave filters on the input side and/or the surface acoustic wave filters on the output side of said plurality of surface acoustic wave filters are the piezoelectric substrates of the surface acoustic wave filters according to claim 16.

21. The surface acoustic wave filter according to claim 20, wherein said plurality of acoustic wave filters are a first surface acoustic wave filter and a second surface acoustic wave filter, said first and second surface acoustic wave filters each comprise at least three IDT electrodes, said first and second surface acoustic wave filters are connected in cascade form, said first and second surface acoustic wave filters are connected at two points using at least two IDT electrodes, and the phase of one signal of said IDT electrode is opposite the phase of the other signal of said IDT electrode.

22. A surface acoustic wave filter comprising:
a piezoelectric substrate;
two IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and
a plurality of reflector electrodes,
said surface acoustic wave filter being a longitudinally coupled mode type surface acoustic wave filter in which said two IDT electrodes and said plurality of reflector electrodes are placed in the propagation directions of surface acoustic waves respectively,
wherein at least one of said two IDT electrodes is the LDT electrode of the inter-digital transducer according to claim 5,
the part of said upper bus bar electrode of said IDT electrode of said inter-digital transducer corresponding to said first divisional IDT electrode and/or the part of said upper bus bar electrode of said IDT electrode corresponding to said second divisional IDT electrode are connected to one end of said balanced typo terminal of said inter-digital transducer,
the part of said lower bus bar electrode of said IDT electrode of said inter-digital transducer corresponding to said second divisional IDT electrode and/or the part of said lower bus bar electrode of said IDT electrode corresponding to said third divisional IDT electrode are connected to the other end of said balanced type terminal, and
said piezoelectric substrate is the piezoelectric substrate of said inter-digital transducer.

23. The surface acoustic wave filter according to claim 22, wherein said two IDT electrodes are a first and second IDT electrodes,
said second IDT electrode is placed on one end of said first IDT electrode,
said reflector electrodes are placed opposite said second IDT electrode of said first IDT electrode and opposite said first IDT electrode of said second IDT electrode respectively, and
said first IDT electrode is the IDT electrode of said inter-digital transducer.

24. A surface acoustic wave filter comprising:
a piezoelectric substrate;
five IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and
at least two reflector electrodes,
said surface acoustic wave filter being a longitudinally coupled mode type surface acoustic wave filter in which said five LDT electrodes and said plurality of reflector electrodes are placed in the propagation directions of surface acoustic waves respectively,
wherein at least one of said five IDT electrodes is the IDT electrode of the inter-digital transducer according to claim 5,
the part of said upper bus bar electrode of said IDT electrode of said inter-digital transducer corresponding to said first divisional LDT electrode and/or the part of said upper bus bar electrode of said IDT electrode corresponding to said second divisional IDT electrode are connected to one end of a balanced type terminal,
the part of said lower bus bar electrode of said IDT electrode of said inter-digital transducer corresponding to said second divisional IDT electrode and/or the part of said lower bus bar electrode of said IDT electrode corresponding to said third divisional IDT electrode are connected to the other end of said balanced type terminal, and
said piezoelectric substrate is the piezoelectric substrate of said inter-digital transducer.

25. The inter-digital transducer according to claim 1 or 2 wherein said plurality of divisional IDT electrodes is constructed of first, second, third and fourth divisional IDT electrodes.

26. The inter-digital transducer according to claim 25,
wherein said plurality of divisional IDT electrodes is placed in order of said first, second, third and fourth divisional IDT electrodes,
the part of said upper bus bar electrode corresponding to said first divisional IDT electrode, the part of said upper bus bar electrode corresponding to said third divisional IDT electrode and the part of said upper bus bar electrode corresponding to said fourth divisional IDT electrode are connected, and
the part of said lower bus bar electrode corresponding to said first divisional IDT electrode, the part of said lower bus bar electrode corresponding to said second divisional IDT electrode and the part of said lower bus bar electrode corresponding to said fourth divisional IDT electrode are connected.

27. The inter-digital transducer according to claim 26,
wherein said same phase relationship refers to a relationship between a pair of said mutually adjacent electrode fingers and that said pair of mutually adjacent electrode fingers are in an same phase relationship means (1) a connection relationship in which the pitch between said pair of mutually adjacent electrode fingers is $(m+1/2) \times \lambda$ (here, $m=0, 1, 2, 3, \ldots$, where $\lambda$ is a wavelength of an excited surface acoustic wave) and of those electrode fingers, one electrode digit is connected to said upper bus bar electrode and the other electrode digit is connected to the lower bus bar electrode, or (2) a connection relationship in which the pitch between said pair of mutually adjacent electrode fingers is $(m+1) \times \lambda$ and both electrode fingers are connected to said upper bus bar electrode, or (3) a connection relationship in which the pitch between said pair of mutually adjacent electrode fingers is $(m+1) \times \lambda$ and both electrode fingers are connected to said lower bus bar electrode.

28. The inter-digital transducer according to claim 27,
wherein of said plurality of electrode fingers, substantially all adjacent pairs of electrode fingers are in an same phase relationship and substantially all of the plurality of electrode fingers is connected so that respective charges do not cancel out each other.

29. The inter-digital transducer according to claim 26,
wherein the part of said upper bus bar electrode corresponding to said second IDT electrode is grounded and the part of said lower bus bar electrode corresponding to said third IDT electrode is grounded.

30. The inter-digital transducer according to claim 26,
wherein the part of said upper bus bar electrode corresponding to said second IDT
electrode is connected to the part of said lower bus bar electrode corresponding to said third IDT electrode.

31. The inter-digital transducer according to claim 30, wherein of adjacent electrode fingers of said second divisional IDT electrode and said third divisional IDT electrode, said second divisional IDT electrode digit is connected to both the part of said upper electrode corresponding to said second divisional IDT electrode and the part of said lower electrode corresponding to said third divisional IDT electrode, and of adjacent electrode fingers said third divisional IDT electrode digit is connected to both the part of said lower electrode corresponding to said third divisional IDT electrode and the part of said upper electrode corresponding to said second divisional IDT electrode.

32. A surface acoustic wave filter comprising:

a piezoelectric substrate;

three IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and at least two reflector electrodes, said surface acoustic wave filter being a longitudinally coupled mode type surface acoustic wave filter in which said three IDT electrodes and said at least two reflector electrodes are placed in the propagation directions of surface acoustic waves respectively, wherein at least one of said three IDT electrodes is the IDT electrode of the inter-digital transducer according to claim 25, the part of said upper bus bar electrode of said IDT electrode of said inter-digital transducer corresponding to said first divisional IDT electrode and/or the part of said upper bus bar electrode of said IDT electrode corresponding to said third divisional IDT electrode and/or the part of said upper bus bar electrode of said IDT electrode corresponding to said fourth divisional IDT electrode are connected to one end of said balanced type terminal of said inter-digital transducer, the part of said lower bus bar electrode of said IDT electrode of said inter-digital transducer corresponding to said first divisional IDT electrode and/or the part of said lower bus bar electrode of said IDT electrode corresponding to said second divisional IDT electrode and the part of said lower bus bar electrode of said IDT electrode corresponding to said fourth divisional LDT electrode are connected to the other end of said balanced type terminal, and said piezoelectric substrate is the piezoelectric substrate of said inter-digital transducer.

33. The surface acoustic wave filter according to claim 32, wherein a surface acoustic wave resonator is connected in series to and/or in parallel with at least two of said IDT electrodes.

34. A surface acoustic wave filter comprising:

a piezoelectric substrate;

a plurality of longitudinally coupled mode type surface acoustic wave filters having a plurality of IDT electrodes and a plurality of reflector electrodes placed on said piezoelectric substrate, wherein said plurality of surface acoustic wave filters are connected in multiple stages, of said plurality of surface acoustic wave filters, at least the surface acoustic wave filters on the input side and/or the surface acoustic wave filters on the output side are the surface acoustic wave filters according to claim 32, and said piezoelectric substrates of at least the surface acoustic wave filters on the input side and/or the surface acoustic wave filters on the output side of said plurality of surface acoustic wave filters are the piezoelectric substrates of the surface acoustic wave filters according to claim 32.

35. The surface acoustic wave filter according to claim 34, wherein said plurality of acoustic wave filters are a first surface acoustic wave filter and a second surface acoustic wave filter, said first and second surface acoustic wave filters each comprise at least three IDT electrodes, said first and second surface acoustic wave filters are connected in cascade form, said first and second surface acoustic wave filters are connected at two points using at least two IDT electrodes, and the phase of one signal of said IDT electrode is opposite the phase of the other signal of said LDT electrode.

36. The surface acoustic wave filter according to claim 32, wherein said three IDT electrodes are first, second and third IDT electrodes, said second IDT electrode and said third IDT electrode are placed on both sides of said first IDT electrode respectively, said reflector electrodes are placed opposite said first IDT electrode of said second IDT electrode and opposite said first IDT electrode of said third IDT electrode respectively, and said first IDT electrode is the IDT electrode of said inter-digital transducer.

37. The surface acoustic wave filter according to claim 36, wherein the upper bus bar electrode of said second IDT electrode is connected to an unbalanced type terminal and the lower bus bar electrode is grounded and the lower bus bar electrode of said third IDT electrode is connected to said unbalanced type terminal and the upper bus bar electrode is grounded.

38. A surface acoustic wave filter comprising:

a piezoelectric substrate;

a plurality of IDT (inter-digital transducer) electrodes having a pair of upper bus bar electrode and lower bus bar electrode facing each other placed on said piezoelectric substrate and a plurality of electrode fingers each being led out from either said upper bus bar electrode or said lower bus bar electrode toward the other bus bar electrode; and a plurality of reflector electrodes, said surface acoustic wave filter being a longitudinally coupled mode type surface acoustic wave filter in which said plurality of IDT electrodes and said plurality of reflector electrodes are placed in the propagation directions of surface acoustic waves respectively, wherein at least one of said plurality of IDT electrodes is the IDT electrode of the inter-digital transducer according to claim 1 or 2 and said piezoelectric substrate is the piezoelectric substrate of said inter-digital transducer.

39. A communication apparatus comprising:

a transmission circuit that outputs transmission waves; and a reception circuit that receives reception waves, wherein the surface acoustic wave filter used for said transmission circuit and/or said reception circuit is the surface acoustic wave filter according to claim 38.

* * * * *